United States Patent
Egami et al.

(10) Patent No.: US 10,845,720 B2
(45) Date of Patent: Nov. 24, 2020

(54) MARK DETECTION APPARATUS, MARK DETECTION METHOD, MEASUREMENT APPARATUS, EXPOSURE APPARATUS, EXPOSURE METHOD AND DEVICE MANUFACTURING METHOD

(71) Applicant: NIKON CORPORATION, Tokyo (JP)

(72) Inventors: Shigeki Egami, Tokyo (JP); Yoshifumi Nakakoji, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/300,291

(22) PCT Filed: May 30, 2017

(86) PCT No.: PCT/JP2017/020118
§ 371 (c)(1),
(2) Date: Feb. 8, 2019

(87) PCT Pub. No.: WO2017/209132
PCT Pub. Date: Dec. 7, 2017

(65) Prior Publication Data
US 2019/0171121 A1 Jun. 6, 2019

(30) Foreign Application Priority Data
May 31, 2016 (JP) ................. 2016-108530

(51) Int. Cl.
*G03F 9/00* (2006.01)
*G03F 7/20* (2006.01)
*G01B 11/00* (2006.01)
(52) U.S. Cl.
CPC ............ *G03F 9/7088* (2013.01); *G01B 11/00* (2013.01); *G01B 11/002* (2013.01); *G03F 7/20* (2013.01); *G03F 7/70141* (2013.01); *G03F 9/00* (2013.01)

(58) Field of Classification Search
CPC .... G03F 7/00; G03F 7/70691; G03F 7/70775; G03F 7/70233; G03F 9/00; G03F 9/7065; G03F 7/7069; G03F 9/7088
See application file for complete search history.

(56) References Cited

U.S. PATENT DOCUMENTS 5,486,919 A    1/1996  Tsuji et al.
6,894,834 B2   5/2005  Mann et al.
(Continued)

FOREIGN PATENT DOCUMENTS

CN    102314092 A    1/2012
JP    H02-021613 A   1/1990
(Continued)

OTHER PUBLICATIONS

Jul. 11, 2017 International Search Report issued in International Patent Application No. PCT/JP2017/020118.
(Continued)

*Primary Examiner* — Jonathan M Hansen
(74) *Attorney, Agent, or Firm* — Oliff PLC

(57) ABSTRACT

A mark detection apparatus is configured to detect a mark formed in a mark area of an object and has: a first optical system configured to emit a first measurement light to the mark area; a second optical system configured to irradiate the mark area with at least one part of a zeroth-order light and a diffracted light generated by an irradiation to the mark area from the first optical system; and a light receiver that configured to optically receive at least one part of a zeroth-order light and a diffracted light generated by an irradiation to the mark area from the second optical system.

64 Claims, 18 Drawing Sheets

(56) References Cited

U.S. PATENT DOCUMENTS

| | | |
|---|---|---|
| 8,054,472 B2 | 11/2011 | Shibazaki |
| 2001/0026357 A1 | 10/2001 | Ota et al. |
| 2001/0046037 A1 | 11/2001 | Ota et al. |
| 2004/0033426 A1 | 2/2004 | Den Boef et al. |
| 2006/0158720 A1 | 7/2006 | Chuang et al. |
| 2011/0304839 A1* | 12/2011 | Beerens ............. G03F 7/70775 355/72 |
| 2012/0140353 A1 | 6/2012 | Smith |
| 2013/0114062 A1* | 5/2013 | Liesener ................. G01D 5/38 355/72 |

FOREIGN PATENT DOCUMENTS

| | | |
|---|---|---|
| JP | H06-317534 A | 11/1994 |
| JP | H09-293663 A | 11/1997 |

OTHER PUBLICATIONS

Jul. 11, 2017 Written Opinion issued in International Patent Application No. PCT/JP2017/020118.

Jan. 13, 2020 Supplementary European Search Report issued in European Patent Application No. 17806685.8.

Jan. 13, 2020 European Search Opinion issued in European Patent Application No. 17806685.8.

Jul. 31, 2020 Office Action issued in Chinese Patent Application No. 201780040616.3.

Aug. 25, 2020 Office Action issued in Taiwanese Patent Application No. 106117824.

\* cited by examiner

MARK DETECTION APPARATUS, MARK DETECTION METHOD, MEASUREMENT APPARATUS, EXPOSURE APPARATUS, EXPOSURE METHOD AND DEVICE MANUFACTURING METHOD

TECHNICAL FIELD

The present invention relates to a technical field of a mark detection apparatus, a mark detection method, a measurement apparatus, an exposure apparatus, an exposure method and a device manufacturing method that are configured to detect a position of a mark formed on an object.

BACKGROUND ART

An exposure apparatus for transferring a device pattern on a substrate is configured to detect a position of an alignment mark formed on the substrate by irradiating the alignment mark with a measurement light in order to perform an alignment operation. The alignment operation is mainly performed to adjust a position of the device pattern that has been already formed on the substrate and a position of the device pattern that is newly formed on the substrate. However, the position of the alignment mark may not be always detected appropriately due to characteristics of the alignment mark and characteristics of the measurement light.

CITATION LIST

Patent Literature

Patent Literature 1: US2004/0033426A1

SUMMARY OF INVENTION

First aspect of a mark detection apparatus is a mark detection apparatus that is configured to detect a mark formed in a mark area of an object, the mark detection apparatus is provide with: a first optical system that is configured to emit a first measurement light to the mark area; a second optical system that is configured to deflect a second measurement light including at least one part of a zeroth-order light and a diffracted light generated by an irradiation of the first measurement light to the mark area from the first optical system and to irradiate the mark area with the deflected second measurement light as a third measurement light; and a light receiver that is configured to optically receive a fourth measurement light including at least one part of a zeroth-order light and a diffracted light generated by an irradiation of the third measurement light to the mark area from the second optical system.

Second aspect of a mark detection apparatus is a mark detection apparatus that is configured to detect a mark formed in a mark area of an object, the mark detection apparatus is provided with: a first optical system that is configured to emit a first measurement light to the mark area; a second optical system that is configured to deflect a second measurement light including a diffracted light generated by an irradiation of the first measurement light to the mark area from the first optical system and to irradiate the mark area with the deflected second measurement light as a third measurement light; and a light receiver that is configured to optically receive a fourth measurement light including a diffracted light generated by an irradiation of the third measurement light to the mark area from the second optical system.

Third aspect of a mark detection apparatus is a mark detection apparatus that is configured to detect a mark formed in a mark area of an object, the mark detection apparatus is provided with: a first optical system that is configured to emit a measurement light to the mark area, the measurement light including a plurality of light components having different wavelengths, respectively; and a light receiver that is configured to optically receive at least one part of the measurement light through the mark area, the light receiver has a plurality of light receiving surfaces for detecting the plurality of light components, respectively.

Fourth aspect of a mark detection apparatus is a mark detection apparatus that is configured to detect a mark formed in a mark area of an object, the mark detection apparatus is provided with: a first optical system that is configured to emit a measurement light to the mark area, the measurement light including a plurality of light components having different wavelengths, respectively; a second optical system that is configured to align a traveling direction of the light component having a first wavelength in the measurement light from the mark area and a traveling direction of the light component having a second wavelength different from the first wavelength in the measurement light from the mark area and to emit the light component having the first wavelength and the light component having the first wavelength; and a light receiver that is configured to optically receive at least one part of the measurement light from the second optical system.

First aspect of a measurement apparatus is a measurement apparatus that is configured to measure a position of a mark formed in a mark area of an object, the measurement apparatus is provided with: a stage that is configured to hold the object; the first, second or third aspect of the mark detection apparatus; a stage position measuring system that is configured to measure a position of the stage; and a calculating apparatus that is configured to calculate the position of the mark by using a light receiving result of the light receiver and a measured result of the stage position measuring system.

First aspect of a mark detection method is a mark detection method of detecting a mark formed in a mark area of an object, the mark detection method comprising: emitting a first measurement light to the mark area; deflecting a second measurement light including at least one part of a zeroth-order light and a diffracted light generated by an irradiation of the first measurement light to the mark area from the first optical system and irradiating the mark area with the deflected second measurement light as a third measurement light; and optically receiving a fourth measurement light including at least one part of a zeroth-order light and a diffracted light generated by an irradiation of the third measurement light to the mark area.

Second aspect of a mark detection method is a mark detection method of detecting a mark formed in a mark area of an object, the mark detection method is provided with: emitting a measurement light to the mark area, the measurement light including a plurality of light components having different wavelengths, respectively; aligning a traveling direction of the light component having a first wavelength in the measurement light from the mark area a traveling direction of the light component having a second wavelength different from the first wavelength in the measurement light from the mark area and emitting the light component having the first wavelength and the light component having the first wavelength; and optically receiving at least one part of the emitted measurement light.

First aspect of an exposure apparatus is an exposure apparatus that is configured to expose an object by using a measured result of the first aspect of the measurement apparatus.

First aspect of an exposure method is an exposure method of exposing an object by using a measured result of the first aspect of the measurement apparatus.

First aspect of a device manufacturing method is a device manufacturing method of: exposing the object on which a sensitive agent is coated by using the first aspect of the exposure method and transferring a desired patter on the object; developing the exposed sensitive agent and forming a exposure pattern layer corresponding to the desired pattern; and processing the object via the exposure pattern layer.

DESCRIPTION OF EMBODIMENTS

With referring to drawings, an embodiment of the present invention will be described below. However, the present invention is not limited to the embodiment described below.

(1) Structure of Exposure Apparatus EX

Figure 1:
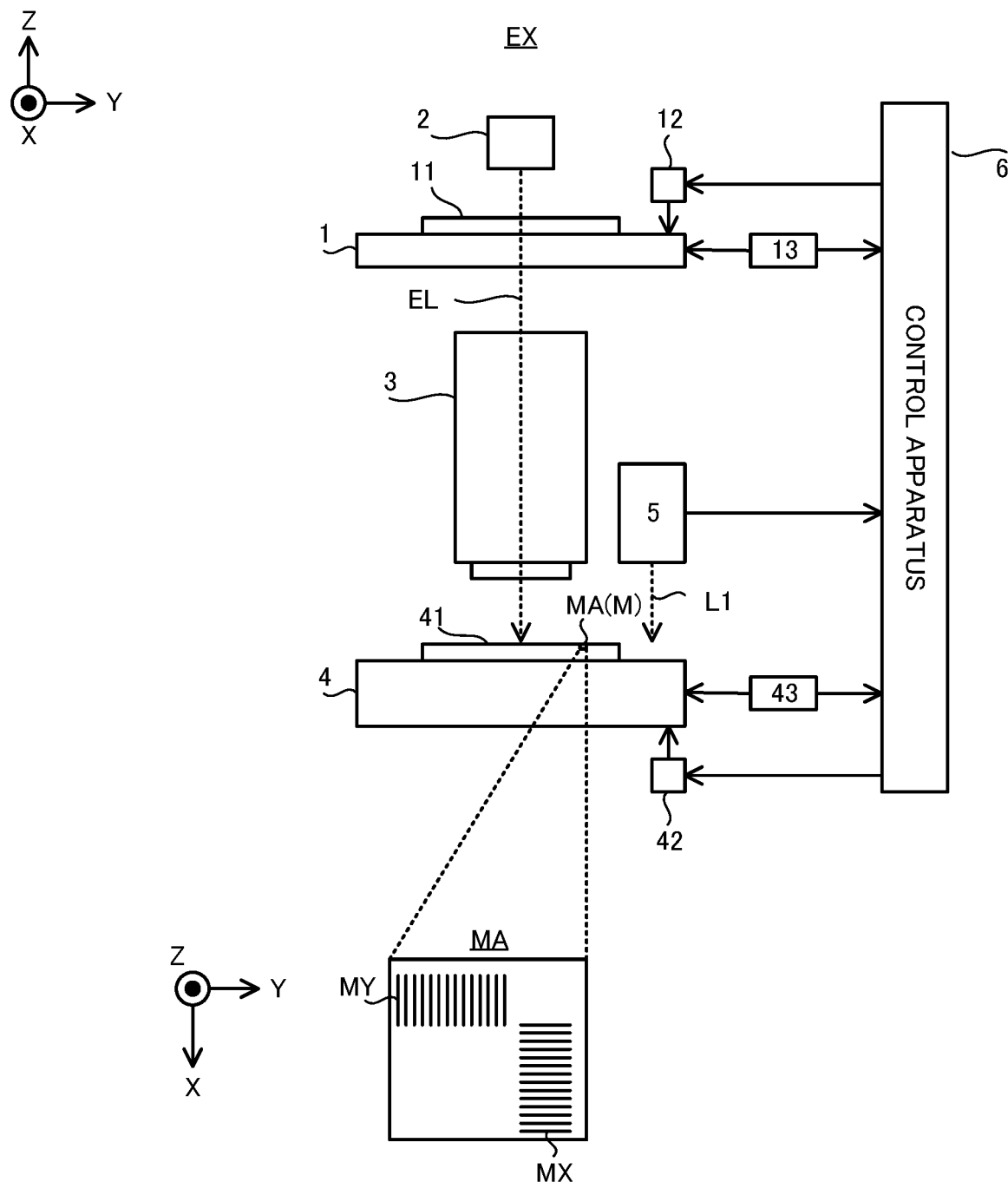
FIG. 1 is a structural view illustrating one example of a structure of an exposure apparatus in the present embodiment.

Firstly, with reference to FIG. 1, one example of a structure of an exposure apparatus EX in the present embodiment will be described. In the below description, a positional relationship of various components that constitute the exposure apparatus EX will be described by using an XYZ rectangular coordinate system that is defined by a X axis, a Y axis and a Z axis that are perpendicular to one another. Note that each of an X axis direction and a Y axis direction is a horizontal direction (namely, a predetermined direction in a horizontal plane) and a Z axis direction is a vertical direction (namely, a direction which is perpendicular to the horizontal plane, and substantially an up-down direction), for the purpose of simple description, in the below description. Moreover, rotational directions (in other words, inclination directions) around the X axis, the Y axis and the Z axis are referred to as a θX direction, a θY direction and a θZ direction, respectively.

The exposure apparatus EX exposes an object. The below description uses an example in which the object is a substrate 41 such as a semiconductor substrate on which a resist is coated, for the purpose of simple description. In this case, the exposure apparatus EX transfers a device pattern (for example, a semiconductor device patter) on the substrate 41 by exposing the substrate 41. Namely, the expose apparatus EX is an exposure apparatus for manufacturing a device such as a semiconductor device. However, as described later, the exposure apparatus EX may be any exposure apparatus that exposes any object or to irradiate any object with a light.

In order to transfer the device pattern on the substrate 41, the exposure apparatus EX is provided with: a mask stage 1; an illumination system 2; a projection optical system 3; a substrate stage 4; an alignment system 5; and a control apparatus 6:

The mask stage 1 holds a mask 11 on which the device pattern transferred on the substrate 41 is formed. The mask stage 1 is movable along a plane (for example, a XY plane) including an illumination region that is irradiated with exposure light EL emitted from the illumination system 2, in a state where the mask stage 1 holds the mask 11. For example, the mask stage 1 may be moved by an operation of a driving system 12 including a motor. The mask stage 1 is movable along at least one of the X axis direction, the Y axis direction, the Z axis direction, the θX direction, the θY direction and the θZ direction, by the operation of the driving system 12. A position of the mask stage 1 is measured by a position measurement apparatus 13. The position measurement apparatus 13 includes at least one of a laser interferometer and an encoder system, for example.

The illumination system 2 emits the exposure light EL. The exposure light EL may be an emission line (for example, g-line, h-line, i-line or the like) emitted from mercury lamp, for example. The exposure light EL may be a Deep Ultra Violet light (DUV light) such as a KrF excimer laser light (248 nm in wavelength), for example. The exposure light EL may be a vacuum-ultraviolet light (VUV light) such as an ArF excimer laser light (193 nm in wavelength) and a $F_2$ laser light (157 nm in wavelength), for example. The exposure light EL may be an Extreme Ultra Violet light (EUV light) such as an X-ray (1 nm to 40 nm in wavelength), for example. One part of the mask 11 is irradiated with the exposure light EL emitted from the illumination system 2.

The projection optical system 3 projects the exposure light EL that passes through the mask 11 (namely, an image of the device pattern that is formed on the mask 11) on the substrate 41.

The substrate stage 4 holds the substrate 41. The substrate stage 4 is movable along a plane (for example, the XY plane) including a projection region on which the exposure light EL is projected by the projection optical system 3, in a state where the substrate stage 4 holds the substrate 41. For example, the substrate stage 4 may be moved by an operation of a driving system 42 including a motor. The substrate stage 4 is movable along at least one of the X axis direction, the Y axis direction, the Z axis direction, the θX direction, the θY direction and the θZ direction, by the operation of the driving system 42. A position of the substrate stage 4 is measured by a position measurement apparatus 43. The position measurement apparatus 43 includes at least one of a laser interferometer and an encoder system, for example.

The alignment system 5 detects an alignment mark M that is formed in a mark area MA on the substrate 41. Specifically, the alignment system 5 irradiates the alignment mark M (namely, a desired area in the mark area MA) with a measurement light L1. The alignment system 5 detects an interfering light L3 that is generated by an interference between emitted lights L2 from the alignment mark M (namely, the emitted lights L2 from the desired area in the mark area MA). The alignment system 5 detects the alignment mark M on the basis of the detected result of the interfering light L3. Note that the alignment system 5 may detect the emitted lights L2 from the alignment mark M (namely, the emitted lights L2 that do not interfere). In this case, the alignment system 5 may detect the alignment mark M on the basis of the detected result of the emitted lights L2.

The alignment system 5 is arranged on the side of the projection optical system 3. Thus, the alignment system 5 irradiates the alignment mark M with the measurement light L1 not through the projection optical system 3. Moreover, the alignment system 5 detects the interfering light L3 not through the projection optical system 3. Namely, the alignment system 5 is an off-axis type alignment system. However, the alignment system 5 may irradiate the alignment mark M with the measurement light L1 through the projection optical system 3. The alignment system 5 may detect the interfering light L3 through the projection optical system 3.

The exposure apparatus EX may be provided with single alignment system 5. Alternatively, the exposure apparatus EX may be provided with a plurality of alignment systems 5. In this case, one alignment system 5 among the plurality of alignment systems 5 may be used as a primary alignment system 5 and other alignment system(s) 5 among the plurality of alignment systems 5 may be used as a secondary alignment system(s) 5. Moreover, the plurality of alignment system 5 may be arranged (aligned) in a desired direction (for example, the X axis direction or the Y axis direction). The exposure apparatus having the plurality of alignment systems 5 is disclosed in U.S. Pat. No. 8,054,472B2, for example. U.S. Pat. No. 8,054,472B2 is incorporated by reference in the disclosures of the present application.

The alignment mark M includes a grid mark formed at a desired pitch Λ. More specifically, the alignment mark M includes a grid mark MY formed to align along a first direction (for example, the Y axis direction) at a desired pitch ΛY and a grid mark MX formed to align along a second direction (for example, the X axis direction) that is perpendicular to the first direction at a desired pitch ΛX. However, the alignment mark M may be any mark as long as the alignment mark M is detectable by the alignment system 5.

One mark area MA or a plurality of mark areas MA corresponding to each shot area is/are located on the substrate 41. Single grid mark MX may be formed in each mark area MA or a plurality of grid marks MX may be formed in each mark area MA. Single grid mark MY may be formed in each mark area MA or a plurality of grid marks MY may be formed in each mark area MA.

The control apparatus 6 controls whole operation of the exposure apparatus EX. The control apparatus 6 outputs, to each operational block of the exposure apparatus EX, a control command for operating each operational block. Each operational block operates on the basis of the control command. For example, the control apparatus 6 collects a mask position information that represents the position of the mask stage 1 measured by the position measurement apparatus 13, a substrate position information that represents the position of the substrate stage 4 measured by the position measurement apparatus 43 and a mark detection information that represents the detected result of the alignment mark M by the alignment system 5. The control apparatus 6 obtains a mark position information that represents the position of the alignment mark M on the basis of the mark detection information and the substrate position information. The control apparatus 6 performs an alignment operation for calculating correction amount of positional coordinates of the plurality of shot areas on the substrate 41 (for example, the correction amount that is a difference between a designed value of the positional coordinate and an actually detected value of the positional coordinate) by performing a statistical processing (for example, a statistical processing based on an EGA (Enhanced Global Alignment)) on the obtained mark position information. The control apparatus 6 controls the movement of the mask stage 1 and the substrate stage 4 on the basis of the calculated correction amount, the collected mask position information and the collected substrate position information so that the desired device pattern is transferred on the desired shot area on the substrate 41.

(2) Structure of Alignment System 5

Next, a structure of the alignment system 5 will be described. In the present embodiment, each of an alignment system 5a in a first embodiment to an alignment system 5f in a seventh embodiment is usable as the alignment system 5. Thus, in the below description, the structure of each of the alignment system 5a in the first embodiment to the alignment system 5f in the seventh embodiment will be described in order.

(2-1) Structure of Alignment System 5a in First Embodiment

Figure 2:
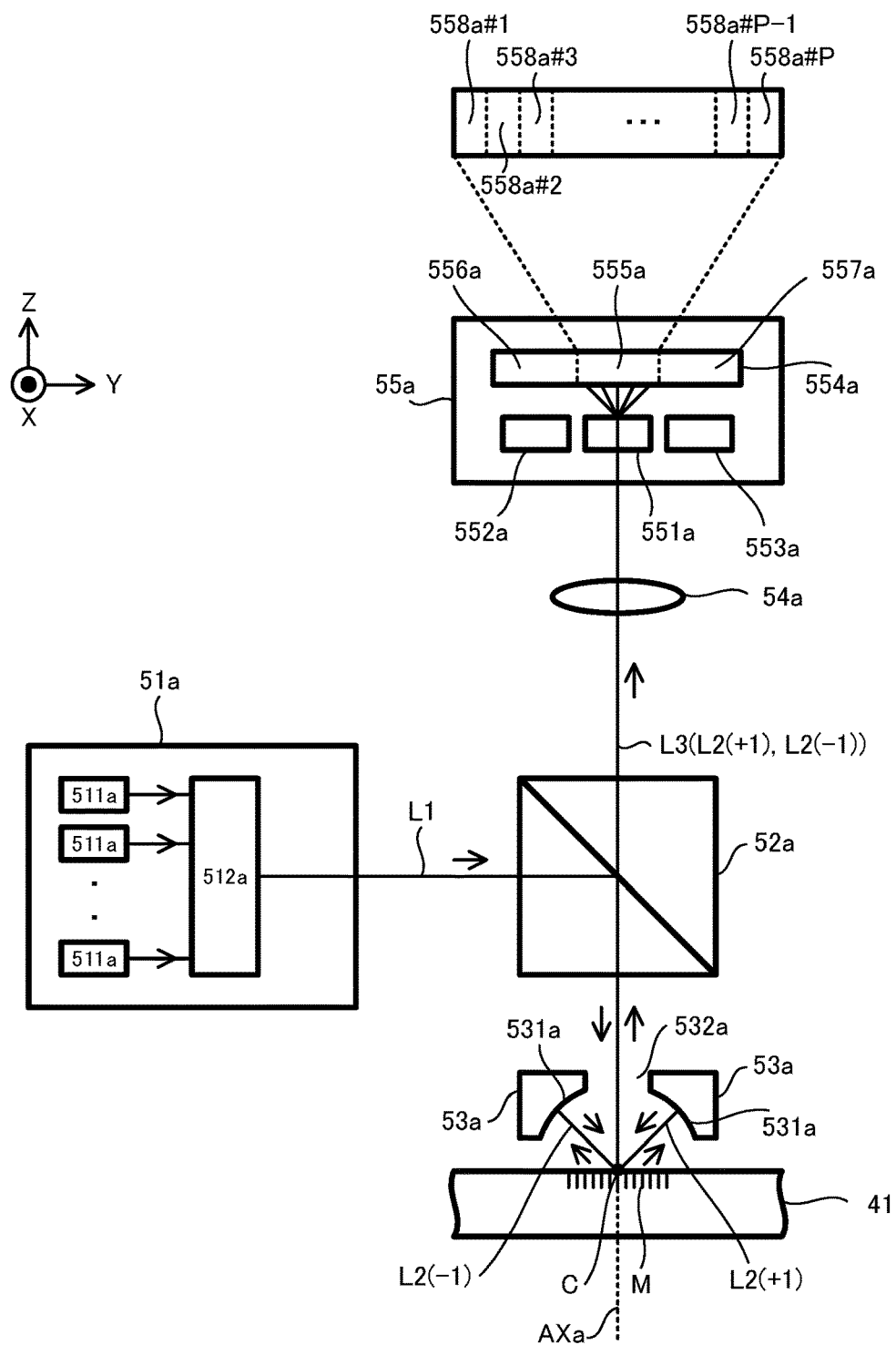
FIG. 2 is a structural view illustrating one example of a structure of an alignment system in a first embodiment.

With reference to FIG. 2, the structure of the alignment system 5a in the first embodiment will be described. As illustrated in FIG. 2, the alignment system 5a is provided with: a light source 51a; a half mirror 52a, a reflective optical element 53a; a condenser lens 54a; and a light receiver 55a.

The light source 51a emits the measurement light L1. The light source 51a irradiates the alignment mark M with the emitted measurement light L1 through the half mirror 52a. Therefore, the light source 51a emits the measurement light L1 to the alignment mark M (more specifically, to the half mirror 52a). The measurement light L1 is a visible light (specifically, a laser light in a visible light range), for example. The measurement light L1 includes a plurality of laser lights that have different wavelengths, respectively. Note that a near-infrared light or an infrared light may be used as the measurement light L1 instead of the visible light or in addition to the visible light. The measurement light L1 may be an ultraviolet light.

In order to emit the measurement light L1, the light source 51a includes a plurality of light emitting elements 511a and a multiplexer 512a that combines lights from the plurality of light emitting elements 511a. Each of the plurality of light emitting elements 511a includes a LD (Laser Diode) element. The plurality of light emitting elements 511a emit the plurality of laser lights that have the different wavelengths, respectively. The plurality of laser lights include at least two laser lights between which a difference in the wavelength is at least 100 nm. For example, the plurality of light emitting elements 511a may be provided with the light emitting element 511a that emits the red laser light, the light emitting element 511a that emits the green laser light and the light emitting element 511a that emits the blue laser light. The plurality of laser lights emitted by the plurality of light emitting elements 511a are mixed by the multiplexer 512a. As a result, the multiplexer 512a emits the measurement light L1 generated by mixing the plurality of laser lights.

The half mirror 52a reflects one part of the measurement light L1 emitted by the light source 51a toward the substrate 41 (namely, the alignment mark M). Namely, the half mirror 52a is an optical member (an example of a first optical system) that guides one part of the measurement light L1 to the alignment mark M. Thus, the half mirror 52a is located on an optical path of the measurement light L1 from the light source 51a to the substrate 41 and between the light source 51a and the substrate 41.

The measurement light L1 reflected by the half mirror 52a passes through an aperture 532a of the reflective optical element 53a. Thus, the reflective optical element 53a is located between the half mirror 52a and the substrate 41 so that the aperture 532a is located on an optical path of the measurement light L1 from the half mirror 52a to the substrate 41. Note that a condenser optical system for condensing the measurement light L1 may be provided between the light source 51a and the reflective optical element 53a. This condenser optical system may be located between the light source 51a and the half mirror 52a. This condenser optical system may be provided with an aperture stop that is provided at a position optically conjugate with a surface of the substrate 41.

The measurement light L1 passing through the aperture 532a vertically enters the surface of the substrate 41. Thus, when the alignment mark M is located under the aperture 532a, the measurement light L1 is irradiated to the alignment mark M. The emitted light L2 that is generated by irradiation of the measurement light L1 is emitted from the alignment mark M to which the measurement light L1 is irradiated. Specifically, the measurement light L1 irradiated to the alignment mark M is reflected by the alignment mark M. Thus, a zeroth-order reflected light L2(0) of the measurement light L1 is emitted from the alignment mark M as at least one part of the emitted light L2. Moreover, the measurement light L1 irradiated to the alignment mark M is diffracted by the alignment mark M. Thus, a +Nth-order diffracted light (a plus-Nth-order diffracted light) L2(+N) of the measurement light L1 and a −Nth-order diffracted light (a minus-N-order diffracted light) L2(−N) of the measurement light L1 are emitted from the alignment mark M as at least one part of the emitted light L2 (N is an integer equal to or larger than 1). Note that FIG. 2 illustrates only the +first-order diffracted light L2(+1) of the measurement light L1 and the −first-order diffracted light L2(−1) of the measurement light L1. For the purpose of simple description, only the ±first-order diffracted lights L2(±1) of the measurement light L1 will be described below.

Note that at least one part of the zeroth-order reflected light and the diffracted light generated by the irradiation of the measurement light L1 to the alignment mark M may be at least one part of the zeroth-order reflected light, may be at least one part of the diffracted light, or may be at least one part of the zeroth-order reflected light and at least one part of the diffracted light.

The +first-order diffracted light L2(+1) emitted from the alignment mark M enters a reflective surface 531a of the reflective optical element 53a (an example of a second optical system). The reflective surface 531a reflects the +first-order diffracted light L2(+1) so that the +first-order diffracted light L2(+1) entering the reflective surface 531a is irradiated to the alignment mark M. Especially, the reflective surface 531a reflects the +first-order diffracted light L2(+1) so that an optical path of the +first-order diffracted light L2(+1) traveling from the alignment mark M to the reflective surface 531a is parallel with (alternatively, is coincident with) an optical path of the +first-order diffracted light L2(+1) traveling from the reflective surface 531a to the alignment mark M. In order to parallelize the optical paths, the reflective surface 531a may reflect the +first-order diffracted light L2(+1) so that a diffraction angle (in other words, a emitting angle) of the +first-order diffracted light L2(+1) from the alignment mark M is same as an incidence angle (in other words, an irradiation angle) of the +first-order diffracted light L2(+1) to the alignment mark M, for example. Moreover, the reflective surface 531a reflects the +first-order diffracted light L2(+1) so that the +first-order diffracted light L2(+1) from the alignment mark M (in other words, a specific part in the mark area MA) is irradiated to the same alignment mark M (in other words, irradiated to the same specific part).

On the other hand, the −first-order diffracted light L2(−1) emitted from the alignment mark M also enters the reflective surface 531a of the reflective optical element 53a. The reflective surface 531a reflects the −first-order diffracted light L2(−1) so that the −first-order diffracted light L2(−1) entering the reflective surface 531a is irradiated to the alignment mark M. In this case, the reflective surface 531a reflects the −first-order diffracted light L2(−1) so that an optical path of the −first-order diffracted light L2(−1) traveling from the alignment mark M to the reflective surface 531a is parallel with (alternatively, is coincident with) an optical path of the −first-order diffracted light L2(−1) traveling from the reflective surface 531a to the alignment mark M. In order to parallelize the optical paths, the reflective surface 531a may reflect the −first-order diffracted light L2(−1) so that a diffraction angle of the −first-order diffracted light L2(−1) from the alignment mark M is same as an incidence angle of the −first-order diffracted light L2(−1) to the alignment mark M, for example. Moreover, the reflective surface 531a reflects the −first-order diffracted light L2(−1) so that the −first-order diffracted light L2(−1) from the alignment mark M (in other words, a specific part in the mark area MA) is irradiated to the same alignment mark M (in other words, irradiated to the same specific part).

Note that the same specific part may be whole of or one part of the alignment mark M or an area in which the alignment mark M is formed.

The reflective surface 531a is a concave spherical mirror. Namely, a shape of a cross-sectional surface of the reflective surface 531a including the Z axis (in other words, a shape of a cross-sectional surface of the reflective surface 531a including an optical axis AXa of the reflective optical element 53a) is a shape corresponding to an outer circumference of a circle. However, the shape of the cross-sectional surface of the reflective surface 531a is a shape corresponding to an outer circumference of one part of the circle (namely, a circular arc) in order to form the aperture 532a of the reflective optical element 53a and to prevent the substrate 41 from contacting with the reflective optical element 53a. Moreover, a center C of the spherical mirror that constitutes the reflective surface 531a (namely, a center of the circle that forms the shape of the cross-sectional surface of the reflective surface 531a) is located at an intersection point of the surface of the substrate 41 and the optical axis AXa.

When the condenser optical system is provided as described above, a focus position of the measurement light L1 by the condenser optical system is set to the center C of the spherical mirror that constitutes the reflective surface 531a. Thus, the light source 51a, the half mirror 52a and the reflective optical element 53a are arranged so that the focus position of the measurement light L1 is coincident with the center C. Note that a beam waist position of the measurement light L1 may be coincident with the center C, when the condenser optical system is not provided.

An example in which the reflective surface 531a is the spherical mirror will be described. The reflective surface 531a reflects the emitting light L2 so that an optical path of the emitting light L2 traveling from the center C to the reflective surface 531a is parallel with an optical path of the emitting light L2 traveling from the reflective surface 531a to the center C. Therefore, when the center C of the spherical mirror is located at the intersection point of the surface of the substrate 41 and the optical axis AXa and the alignment mark MA is located at the center C, the reflective surface 531a reflects the +first-order diffracted light L2(+1) so that the optical path of the +first-order diffracted light L2(+1) traveling to the reflective surface 531a is coincident with the optical path of the +first-order diffracted light L2(+1) traveling to the alignment mark M. Similarly, the reflective surface 531a reflects the −first-order diffracted light L2(−1) so that the optical path of the −first-order diffracted light L2(−1) traveling to the reflective surface 531a is parallel with the optical path of the −first-order diffracted light L2(−1) traveling to the alignment mark M.

Figure 3A:
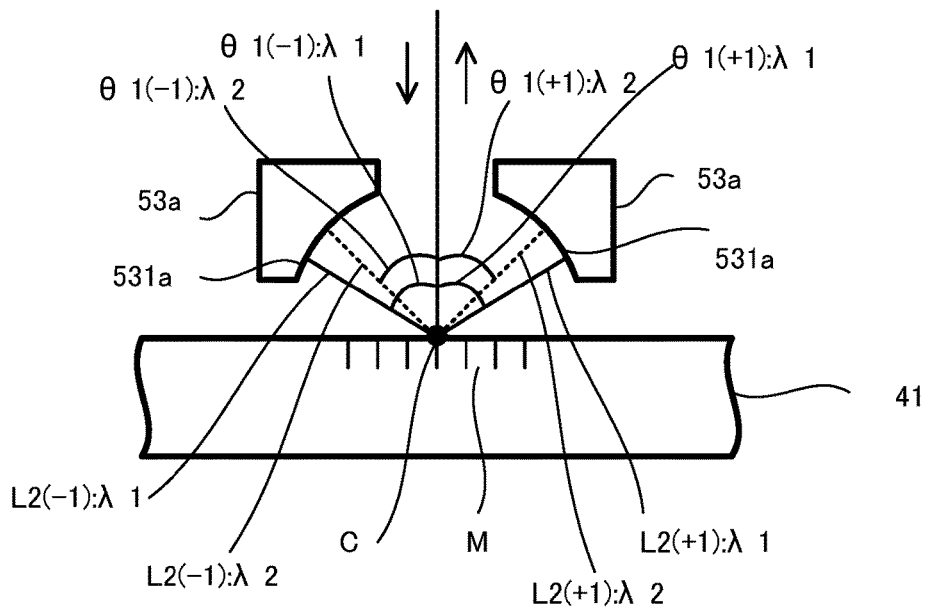
FIG. 3 Each of FIG. 3A, FIG. 3B
FIG. 3C is a structural view illustrating one example of the structure of the alignment system in the first embodiment.

Here, as described above, the measurement light L1 includes the plurality of laser lights that have different wavelengths, respectively. Thus, the ±first-order diffracted lights L2(±1) of each of the plurality of laser lights are emitted from the alignment mark M. The diffraction angles of the plurality of +first-order diffracted lights L2(+1) that correspond to the plurality of laser lights, respectively, vary depending on the wavelength of the laser light. Similarly, the diffraction angles of the plurality of −first-order diffracted lights L2(−1) that correspond to the plurality of laser lights, respectively, vary depending on the wavelength of the laser light. For example, as illustrated in FIG. 3A, the diffraction angle $\theta1(+1):\lambda1$ of the +first-order diffracted light L2(+1):$\lambda1$ corresponding to the laser light having a wavelength $\lambda1$ is different from the diffraction angle $\theta1(+1):\lambda2$ of the +first-order diffracted light L2(+1):$\lambda2$ corresponding to the laser light having a wavelength $\lambda2$ ($\neq\lambda1$). As illustrated in FIG. 3A, the diffraction angle $\theta1(-1):\lambda1$ of the −first-order diffracted light L2(−1):$\lambda1$ corresponding to the laser light having the wavelength $\lambda1$ is different from the diffraction angle $\theta1(-1):\lambda2$ of the −first-order diffracted light L2(−1):$\lambda2$ corresponding to the laser light having the wavelength $\lambda2$. However, the emitted light L2 emitted from the center C returns to the center C regardless of the wavelength after the emitted light L2 is reflected by the reflective surface 531a. Therefore, even when the diffraction angles of the ±first-order diffracted lights L2(±1) vary depending on the wavelength, the ±first-order diffracted lights L2(±1) return to the same position. For example, all of the ±first-order diffracted lights L2(±1) emitted at a first diffraction angle from the alignment mark M and the ±first-order diffracted lights L2(±1) emitted at a second diffraction angle different from the first diffraction angle from the alignment mark M return to the same position (namely, the center C) on the substrate 41. Thus, even when the measurement light L1 includes the plurality of laser lights that have different wavelengths, respectively, the plurality of ±first-order diffracted lights L2(±1) are reflected by the reflective surface 531a and then travel along a direction that is opposite to a direction along which the plurality of ±first-order diffracted lights L2(±1) travel in entering the reflective surface 531a and is irradiated to the same position on the substrate 41, as long as the plurality of ±first-order diffracted lights L2(±1) that correspond to the plurality of laser lights, respectively, are reflected by the reflective surface 531a.

Note that there is a possibility that the stage 4 moves (namely, the substrate 41 moves) during a period when the +first-order diffracted light L2(+1) is emitted from the alignment mark M. However, a moving speed of the stage 4 is negligibly small compared with a traveling speed of the +first-order diffracted light L2(+1) (=a light speed). Thus, even when the stage 4 moves during the period when the +first-order diffracted light L2(+1) is emitted from the alignment mark M, it can be said that the optical path of the +first-order diffracted light L2(+1) traveling to the reflective surface 531a is substantially parallel with (alternatively, is coincident with) the optical path of the +first-order diffracted light L2(+1) traveling to the alignment mark M, from a viewpoint of not affecting the alignment operation. Namely, it can be said that the +first-order diffracted light L2(+1) from the alignment mark M is substantially irradiated to the same alignment mark M. Same applies to the −first-order diffracted light L2(−1). Therefore, even when the stage 4 moves during the period when the ±first-order diffracted lights L2(±1) is emitted from the alignment mark M, it can be said that the ±first-order diffracted lights L2(±1) are substantially irradiated to the same position on the substrate 41 after being reflected by the reflective surface 531a.

The ±first-order diffracted lights L2(±1) that travel from the reflective surface 531a along the direction opposite to the direction along which the ±first-order diffracted lights L2(±1) travel in entering the reflective surface 531a return to the same position on the substrate 41, and reflected and diffracted by the substrate 41 (especially, the alignment mark M on the substrate 41).

Figures 3B, 3C:
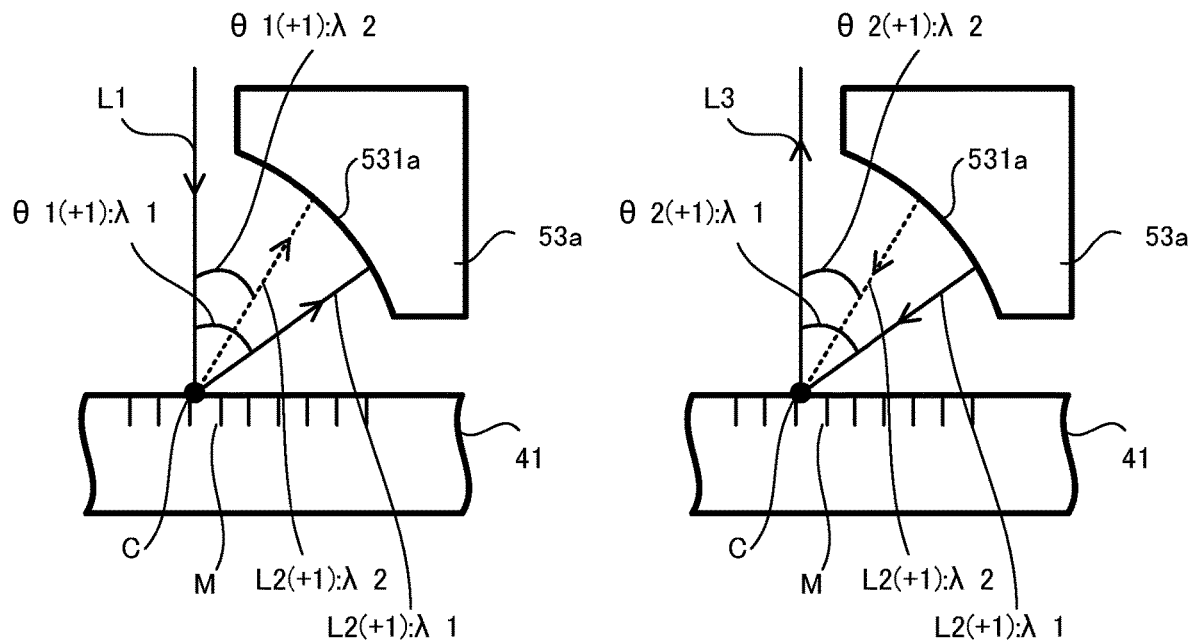

With reference to FIG. 3B and FIG. 3C, the light diffracted by the alignment mark M will be described below. FIG. 3B is a diagram that illustrates the +first-order diffracted light L2(+1):$\lambda1$ and the +first-order diffracted light L2(+1):$\lambda2$ among the laser lights having the wavelengths $\lambda1$ and $\lambda2$ diffracted by the alignment mark M. Here, the diffraction angle $\theta1(+1):\lambda1$ of the +first-order diffracted light L2(+1):$\lambda1$ satisfies a condition of $\sin(\theta1(+1):\lambda1)=\lambda1/\Lambda$. Similarly, the diffraction angle $\theta1(+1):\lambda2$ of the +first-order diffracted light L2(+1):$\lambda2$ satisfies a condition of $\sin(\theta1(+1):\lambda2)=\lambda2/\Lambda$. FIG. 3C is a diagram that illustrates a state after the +first-order diffracted light L2(+1):$\lambda1$ and the +first-order diffracted light L2(+1):$\lambda2$ from the alignment mark M is reflected by the reflective surface 531a. The +first-order diffracted light L2(+1):$\lambda1$ having the wavelength $\lambda1$ is irradiated to the alignment mark M in a state where the angle between the +first-order diffracted light L2(+1):$\lambda1$ and the optical axis AXa is $\theta2(+1):\lambda1$ and then diffracted by the alignment mark M. The +first-order diffracted light L2(+1):$\lambda2$ having the wavelength $\lambda2$ is irradiated to the alignment mark M in a state where the angle between the +first-order diffracted light L2(+1):$\lambda2$ and the optical axis AXa is θ2(+1):λ2 and then diffracted by the alignment mark M. In this case, the diffraction angle θ2(+1):λ1 of the +first-order diffracted light L2(+1):λ1 satisfies a condition of sin (θ2(+1):λ1)=λ1/Λ. Moreover, the diffraction angle θ2(+1):λ2 of the +first-order diffracted light L2(+1):λ2 satisfies a condition of sin (θ2(+1):λ2)=λ2/Λ. Namely, the diffraction angle θ2(+1):λ1 is same as the above described diffraction angle θ1(+1):λ1 and the diffraction angle θ2(+1):λ2 is same as the above described diffraction angle θ1(+1):λ2. Therefore, even when the wavelengths of the laser lights (the measurement light L1) are different, the traveling directions of the lights diffracted by the alignment mark M a plurality of times are same or parallel.

As a result, as illustrated in FIG. 3A, the ±first-order diffracted lights L2(±1) are emitted from the alignment mark M in the same direction. Especially, the ±first-order diffracted lights L2(±1) that are the lights diffracted by the alignment mark M (alternatively, the mark area MA) a plurality of times (twice in an example illustrated in FIG. 3A) are emitted from the alignment mark M in the same direction. Specifically, the ±first-order diffracted lights L2(±1) are emitted from the alignment mark M to travel in an optical path that is parallel with (alternatively, an optical path that is coincident with) an optical path in which the measurement light L1 travels in entering the alignment mark M. As a result, the interfering light L3 that is generated by the interference between the ±first-order diffracted lights L2(±1) reflected by the reflective surface 531a is substantially emitted from the alignment mark M. Especially, when the plurality of ±first-order diffracted lights L2(±1) that have the different wavelengths, respectively, are reflected by the reflective surface 531a, the plurality of ±first-order diffracted lights L2(±1) reflected by the reflective surface 531a are emitted in the same direction from the alignment mark M. Namely, reflecting the plurality of ±first-order diffracted lights L2(±1) that have the different wavelengths, respectively, by the reflective surface 531a substantially corresponds to one part of an operation of aligning directions in which the plurality of ±first-order diffracted lights L2(±1) reflected by the reflective surface 531a are emitted from the alignment mark M. As a result, the interfering light L3 is a light that includes a plurality of interfering lights corresponding to different wavelengths, respectively, wherein each interfering light is generated by the interference between the ±first-order diffracted lights L2(±1) having the same wavelength. For example, in an example illustrated in FIG. 3A, the interfering light L3:λ1 is generated by the interference between the ±first-order diffracted lights L2(±1):λ1 having the wavelength λ1 and the interfering light L3:λ2 is generated by the interference between the ±first-order diffracted lights L2(±1):λ2 having the wavelength λ2. The interfering light L3 is vertically emitted from the alignment mark M so that the interfering light L3 travels in an optical path that is parallel with (alternatively, an optical path that is coincident with) the optical path in which the measurement light L1 travels in entering the alignment mark M. As a result, the interfering light L3 passes through the aperture 532a of the reflective surface 532a. The interfering light L3 enters the half mirror 52a after passing through the aperture 532a.

One part of the interfering light L3 passes through the half mirror 52 toward the light receiver 55a. Namely, the half mirror 52a is an optical member that guides one part of the interfering light L3 to the light receiver 55a. Thus, the half mirror 52a is located on an optical path of the interfering light L3 from the substrate 41 to the light receiver 55a and between the substrate 41 and the light receiver 55a.

The interfering light L3 is condensed by the condenser lens 54a after passing through the half mirror 52a. Namely, the condenser lens 54a adjusts a beam diameter of the interfering light L3 to a size by which the interfering light L3 is optically receivable by the light receiver 55a (more specifically, the interfering light L3 is optically receivable by a below described spectroscope 551a). The interfering light enters the light receiver 55a after being condensed by the condenser lens 54a. Note that the condenser lens 54a may be omitted when the interfering light L3 is optically receivable by the light receiver 55a (more specifically, the interfering light L3 is optically receivable by the below described spectroscope 551a) without the condenser lens 54a.

The light receiver 55a is provided with the spectroscope 551a and a light receiving element 554a. The spectroscope 551a disperses the interfering light L3. Namely, the spectroscope 551a divides the interfering light L3 into a plurality of light components that have different wavelengths, respectively. The spectroscope 551a may include at least one of a prism and a diffracting grating, for example. The interfering light L3 dispersed by the spectroscope 551a enters a first light receiving surface 555a on a light receiving surface of the light receiving element 554a. The first light receiving surface 555a is divided into a plurality of light receiving areas 558a that optically receive the plurality of light components divided by the spectroscope 551a, respectively. Specifically, when the spectroscope 551a divides the interfering light L3 into P (P is an integer equal to or larger than 1) light component(s), the first light receiving surface 555a is divided into a light receiving area 558a#1, a light receiving area 558a #2, a light receiving area 558a #3, . . . , a light receiving area 558a #P−1 and a light receiving area 558a #P. Thus, even when the measurement light L1 includes (namely, the interfering light L3 also includes) the plurality of light components that have different wavelengths, respectively, the plurality of light components are optically receivable by the light receiving element 554a simultaneously. A light receiving result of the light receiving element 554a is outputted to the control apparatus 6 as the mark detection information.

The light receiver 55a further includes a spectroscope 552a and a spectroscopes 553a. Moreover, the light receiving surface of the light receiving element 554a includes a second light receiving surface 556a and a third light receiving surface 557a. The above described spectroscope 551a and the first light receiving surface 555a are optical elements for detecting a light (namely, the interfering light L3) entering the light receiver 55a from the substrate 41 when the center C of the spherical mirror that constitutes the reflective surface 531a is located at the intersection point of the surface of the substrate 41 and the optical axis AXa (namely, a position of the center C in the Z axis direction is coincident with a position of the alignment mark M in the Z axis direction). On the other hand, the spectroscope 552a, the spectroscope 553a, the second light receiving surface 556a and the third light receiving surface 557a are optical elements for detecting the light entering the light receiver 55a from the substrate 41 when the center C of the spherical mirror that constitutes the reflective surface 531a is not located at the intersection point of the surface of the substrate 41 and the optical axis AXa (namely, the position of the center C in the Z axis direction is different from the position of the alignment mark M in the Z axis direction).

As described above, when the center C of the spherical mirror that constitutes the reflective surface 531a is located at the intersection point of the surface of the substrate 41 (namely, the alignment mark M) and the optical axis AXa, the ±first-order diffracted lights L2(±1) diffracted by the alignment mark M are emitted in the same direction. On the other hand, when the center C of the spherical mirror that constitutes the reflective surface 531a is not located at the intersection point of the surface of the substrate 41 and the optical axis AXa, as illustrated in FIG. 4A and FIG. 4B, the +first-order diffracted light L2(+1) emitted from the alignment mark M does not return to the same position on the alignment mark M after being reflected by the reflective surface 531a.

Figure 4A:
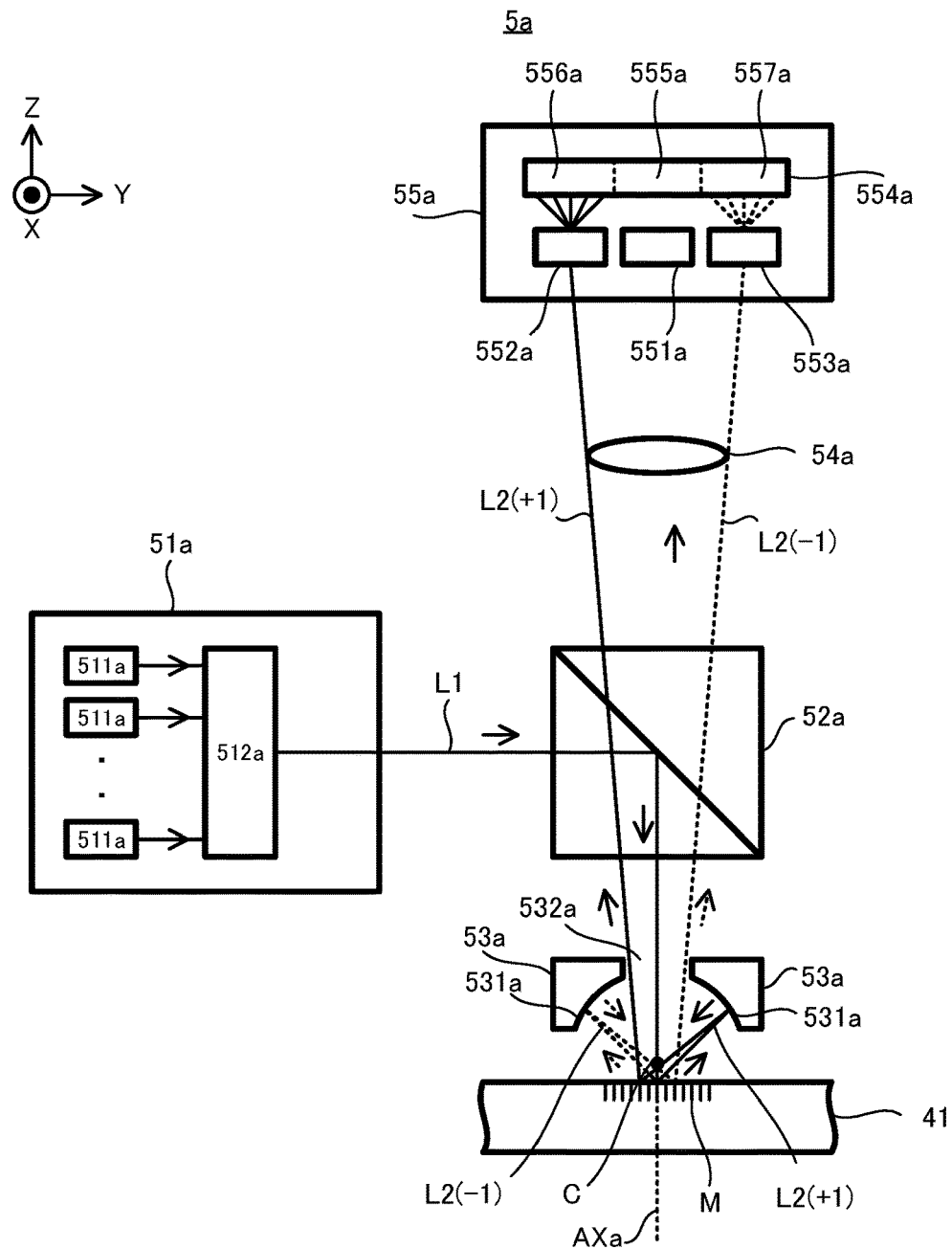
FIG. 4 Each of FIG. 4A
FIG. 4B is a structural view illustrating one example of the structure of the alignment system in the first embodiment.
Figure 4B:
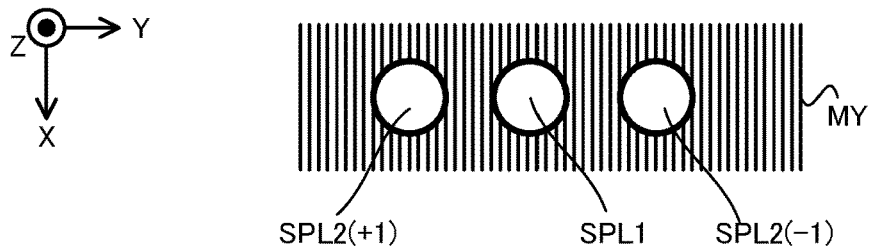

As illustrated in FIG. 4B, in a measurement direction of the alignment mark M (the Y direction), a position of an area SPL1 to which the measurement light L1 is irradiated on the alignment mark M (the grid mark MY) is different from a position of an area SPL2(+1) to which the +first-order diffracted light L2(+1) from the reflective surface 531a is irradiated on the alignment mark M.

As described above, the +first-order diffracted light L2(+1) returns to an area that is different from an area at which the alignment mark M is formed and from which the +first-order diffracted light L2(+1) is emitted, even when the +first-order diffracted light L2(+1) is reflected by the reflective surface 531a. Thus, the +first-order diffracted light L2(+1) enters the light receiver 55a by passing through an optical path that is different from an optical path in which the interfering light L3 travels when the center C is located at the intersection point of the surface of the substrate 41 and the optical axis AXa. The +first-order diffracted light L2(+1) entering the light receiver 55a is dispersed by the spectroscope 552a. Note that the feature of the spectroscope 552a is same as the feature of the spectroscope 551a. The +first-order diffracted light L2(+1) dispersed by the spectroscope 552a enters the second light receiving surface 556a. Note that the feature of the second light receiving surface 556a is same as the feature of the first light receiving surface 555a. Thus, even when the measurement light L1 includes (namely, the +first-order diffracted light L2(+1) also includes) the plurality of light components that have different wavelengths, respectively, the plurality of light components are optically receivable by the light receiving element 554a simultaneously. The light receiving result of the light receiving element 554a is outputted to the control apparatus 6 as the mark detection information.

Similarly, when the center C is not located at the surface of the substrate 41, as illustrated in FIG. 4A and FIG. 4B, the −first-order diffracted light L2(−1) emitted from the alignment mark M does not return to the same position on the alignment mark M after being reflected by the reflective surface 531a. As illustrated in FIG. 4B, in the measurement direction of the alignment mark M (the Y direction), the position of the area SPL1 to which the measurement light L1 is irradiated on the alignment mark M (the grid mark MY) is different from a position of an area SPL2(−1) to which the −first-order diffracted light L2(−1) from the reflective surface 531a is irradiated on the alignment mark M. Here, two areas SPL2(±1) may be distributed not to be at an outside of a range of the grid mark MY (a Y direction measurement mark).

As described above, the −first-order diffracted light L2(−1) returns to an area that is different from an area at which the alignment mark M is formed and from which the −first-order diffracted light L2(−1) is emitted, even when the −first-order diffracted light L2(−1) is reflected by the reflective surface 531a. Thus, the −first-order diffracted light L2(−1) enters the light receiver 55a by passing through an optical path that is different from the optical path in which the interfering light L3 travels when the center C is located at the intersection point of the surface of the substrate 41 and the optical axis AXa. Especially, a position on the substrate 41 (namely, the area SPL2(−1)) to which the −first-order diffracted light L2(−1) reflected by the reflective surface 531a is irradiated is different from a position on the substrate 41 (namely, the area SPL2(+1)) to which the +first-order diffracted light L2(+1) reflected by the reflective surface 531a is irradiated. Thus, an optical path in which the −first-order diffracted light L2(−1) travels from the substrate 41 to the light receiver 55a is different from an optical path in which the +first-order diffracted light L2(+1) travels from the substrate 41 to the light receiver 55a. The −first-order diffracted light L2(−1) entering the light receiver 55a is dispersed by the spectroscope 553a. Note that the feature of the spectroscope 553a is same as the feature of the spectroscope 551a. The −first-order diffracted light L2(−1) dispersed by the spectroscope 553a enters the third light receiving surface 557a. Note that the feature of the third light receiving surface 557a is same as the feature of the first light receiving surface 555a. Thus, even when the measurement light L1 includes (namely, the −first-order diffracted light L2(−1) also includes) the plurality of light components that have different wavelengths, respectively, the plurality of light components are optically receivable by the light receiving element 554a simultaneously. The light receiving result of the light receiving element 554a is outputted to the control apparatus 6 as the mark detection information.

The control apparatus 6 performs a scatterometry measurement for changing (in other word, correcting, updating or adjusting) the mark detection information obtained when the center C is located at the intersection point of the surface of the substrate 41 and the optical axis AXa (hereinafter, it is referred to as a "first mark detection information") on the basis of the first mark detection information and the mark detection information obtained when the center C is not located at the intersection point of the surface of the substrate 41 and the optical axis AXa (hereinafter, it is referred to as a "second mark detection information"). Specifically, as described above, the alignment mark M includes the grid marks MX and MY. Here, there is a possibility that a shape of the structural object (for example, a groove or a wall that forms the groove) that constitutes the grid marks MX and MY is an asymmetry shape (for example, is not a shape symmetry with respect to a line), depending on an accuracy of forming the grid marks MX and MY. When the shape of the structural object that constitutes the grid marks MX and MY is the asymmetry shape, there is a possibility that the first mark detection information includes a margin of an error caused by the asymmetry shape of the grid marks MX and MY. So, the control apparatus 6 detects the asymmetricity of the shape of the grid marks MX and MY by obtaining the second mark detection information in a situation that is different from a situation where the first mark detection information is obtained, in order to improve an accuracy of the first mark detection information (in other words, reduce or eliminate an effect of the error). Thus, the "scatterometry measurement" may be detecting the asymmetricity of the shape of the grid marks MX and MY. Note that the control apparatus 6 controls a stage driving system 41 so that the center C is located at the intersection point of the surface of the substrate 41 and the optical axis AXa, in order to obtain the first mark detection information. Moreover, the control apparatus 6 controls the stage driving system 41 so that the center C is not located at the intersection point of the surface of the substrate 41 and the optical axis AXa (specifically, the center C is located at a position that is away along the Z axis direction from the intersection point of the surface of the substrate 41 and the optical axis AXa), in order to obtain the second mark detection information.

As described above, the alignment system 5a in the first embodiment is configured to obtain the mark detection information that is the detected result of the alignment mark M appropriately. As a result, the control apparatus 6 is capable of performing the alignment operation on the basis of the mark detection information appropriately. Specifically, the control apparatus 6 controls the alignment system 5a to irradiate the grid mark MY of the alignment mark M with the measurement light L1. As a result, the control apparatus 6 obtains the mark detection information that is used to calculate the correction amount of the positional coordinates of the plurality of shot areas along the Y axis direction. Moreover, the control apparatus 6 controls the alignment system 5a to irradiate the grid mark MX of the alignment mark M with the measurement light L1. As a result, the control apparatus 6 obtains the mark detection information that is used to calculate the correction amount of the positional coordinates of the plurality of shot areas along the X axis direction. Thus, the control apparatus 6 is capable of performing the alignment operation for calculating the correction amount of the positional coordinates of the plurality of shot areas on the XY plane. When a plurality of alignment marks M are formed on the substrate 41 and these plurality of alignment marks M are detected, all of the plurality of alignment marks M may be detected in a state where the center C of the reflective surface 531a is located at the surface of the substrate 41 and then all of the plurality of alignment marks M may be detected in a state where the center C of the reflective surface 531a is away along the Z axis direction from the surface of the substrate 41. Alternatively, all of the plurality of alignment marks M may be detected in a state where the center C of the reflective surface 531a is away along the Z axis direction from the surface of the substrate 41, and then all of the plurality of alignment marks M may be detected in a state where the center C of the reflective surface 531a is located at the surface of the substrate 41. In this case, it is enough that an operation of moving the substrate 41 along the Z axis direction by using the stage driving system 41 is performed one time, and thus an alignment detection time is reduced.

Moreover, in the first embodiment, even when the measurement light L1 includes the plurality of laser lights that have different wavelengths, respectively, the plurality of ±first-order diffracted lights L2(±1) that corresponds to the plurality of wavelengths, respectively, return to the same position on the substrate 41. Namely, the plurality of ±first-order diffracted lights L2(±1) diffracted by the substrate 41 at the different diffraction angles, respectively, return to the same position on the substrate 41. Thus, the alignment system 5a detects the interfering light L3 generated by the interference between the ±first-order diffracted lights L2(±1) that corresponds to the plurality of wavelengths, respectively. Thus, it is possible to obtain more accurate mark detection information when the mark detection information is obtained by using the measurement light L1 including the plurality of laser lights that have different wavelengths, respectively, compared to the case where the mark detection information is obtained by using the measurement light L1 having single wavelength. Alternatively, a time required to obtain the mark detection information is reduced, compared to the case where the mark detection information is obtained by emitting the plurality of measurement lights L1 that have different wavelengths, respectively, in order.

On the other hand, the diffraction angle of the ±first-order diffracted lights L2(±1) varies depending on not only the wavelength of the light component included in each of the ±first-order diffracted lights L2(±1) but also the pitch ΛX of the grid mark MX and the pitch ΛY of the grid mark MY included in the alignment mark M. Namely, the diffraction angle of the +first-order diffracted light L2(+1) emitted from the alignment mark M including the grid mark MY that is formed at a first pitch ΛY1 is different from the diffraction angle of the +first-order diffracted light L2(+1) emitted from the alignment mark M including the grid mark MY that is formed at a second pitch ΛY2 different from the first pitch ΛY1. Thus, the alignment system 5a is capable of obtaining the mark detection information appropriately even when the measurement light L1 is irradiated to the alignment mark M including the grid marks MX and MY formed at any pitches ΛX and ΛY, respectively.

Moreover, since the first light receiving surface 555a is divided into the plurality of light receiving areas 558a, the plurality of light components that are included in the interfering light L3 and that have the different wavelengths, respectively, are optically receivable by the light receiving element 554a simultaneously. Thus, the time required to obtain the mark detection information is reduced, compared to the case where the first light receiving surface 555a includes single light receiving area 558a.

Note that the control apparatus 6 may adjust the position of the surface of the substrate 41 by controlling the stage driving system 41 so that the ±first-order diffracted lights L2(±1) from the alignment mark M through the reflective surface 531a partially overlap with each other. In this case, the overlapped part of the ±first-order diffracted lights L2(±1) enters the first light receiving surface 555a as the interfering light L3 and non-overlapped parts enter the second light receiving surface 556a and the third light receiving surface 557a, respectively. Thus, the time required to obtain the mark detection information is reduced.

(2-2) Structure of Alignment System 5b in Second Embodiment

Next, with reference to FIG. 5, the structure of an alignment system 5b in a second embodiment will be described. Note that the detailed description about a member that is same as the member that is already described in the first embodiment will be omitted by assigning the same reference number to it.

Figure 5:
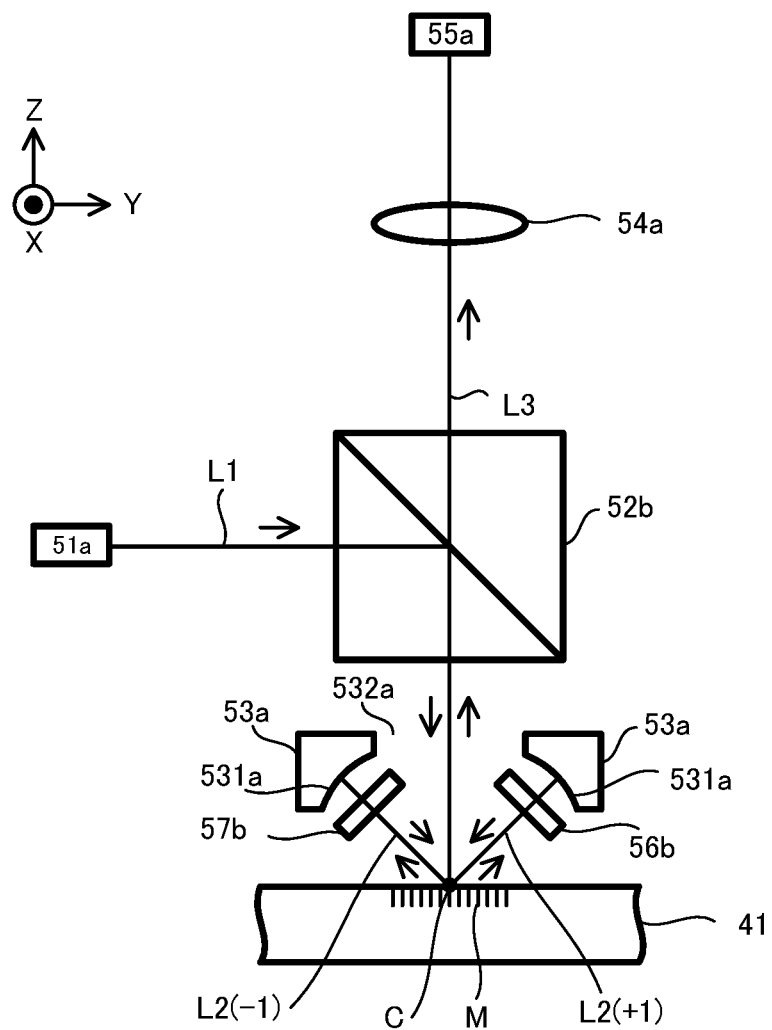
FIG. 5 is a structural view illustrating one example of a structure of an alignment system in a second embodiment.

As illustrated in FIG. 5, the alignment system 5b in the second embodiment is different from the alignment system 5a in the first embodiment in that the alignment system 5b is provided with a polarization beam splitter 52b (an example of a first optical system) instead of the half mirror 52a. Moreover, the alignment system 5b in the second embodiment is different from the alignment system 5a in the first embodiment in that the alignment system 5b is provided with a quarter wave plate 56b (as part of the second optical system) on the optical path of the +first-order diffracted light L2(+1) between the substrate 41 and the reflective surface 531a. Moreover, the alignment system 5b in the second embodiment is different from the alignment system 5a in the first embodiment in that the alignment system 5b is provided with a quarter wave plate 57b (as part of the second optical system) on the optical path of the −first-order diffracted light L2(−1) between the substrate 41 and the reflective surface 531a. Another feature of the alignment system 5b in the second embodiment may be same as another feature of the alignment system 5a in the first embodiment.

A first polarized light (for example, s polarized light) of the measurement light L1 emitted from the light source 51a is reflected by the polarization beam splitter 52b toward the substrate 41 (namely, the alignment mark M). On the other hand, a second polarized light (for example, p polarized light) of the measurement light L1 emitted from the light source 51a passes through the polarization beam splitter 52b. The measurement light L1 reflected by the polarization beam splitter 52b is irradiated to the alignment mark M. As a result, the +first-order diffracted light L2(+1) and the −first-order diffracted light L2(−1) are emitted from the alignment mark M. Note that the light source 51a may emits the measurement light L1 that is the s polarized light to a polarization split surface of the polarization beam splitter 52b.

The +first-order diffracted light L2(+1) emitted from the alignment mark M passes through the quarter wave plate 56b. As a result, the +first-order diffracted light L2(+1) is converted from a linear polarized light to a circular polarized light. Then, the +first-order diffracted light L2(+1) is reflected by the reflective surface 531a. As a result, a rotational direction of the circular polarized light that constitutes the +first-order diffracted light L2(+1) reverses. Then, the +first-order diffracted light L2(+1) reflected by the reflective surface 531a passes through the quarter wave plate 56b again. As a result, the +first-order diffracted light L2(+1) is converted from the circular polarized light to the linear polarized light. Especially, since the rotational direction of the circular polarized light that constitutes the +first-order diffracted light L2(+1) reverses due to the reflection at the reflective surface 531a, the +first-order diffracted light L2(+1) becomes the linear polarized light and the second polarized light (the p polarized light) after passing through the quarter wave plate 56b again.

Similarly, the −first-order diffracted light L2(−1) emitted from the alignment mark M passes through the quarter wave plate 57b, then, is reflected by the reflective surface 531a, and then, passes through the quarter wave plate 57b again. As a result, the −first-order diffracted light L2(−1) becomes the linear polarized light and the second polarized light (the p polarized light) after passing through the quarter wave plate 57b again.

The ±first-order diffracted lights L2(±1) that are the linear polarized light and the second polarized light return to the same position on the substrate 41. As a result, the interfering light L3 that is generated by the interference between the ±first-order diffracted lights L2(±1) is emitted from the alignment mark M. The interfering light L3 passes through the aperture 532a and then enters the polarization beam splitter 52b. Since the interfering light L3 is the linear polarized light and the second polarized light (the p polarized light), one part of the interfering light L3 passes through the polarization beam splitter 52b toward the light receiver 55a. As a result, the light receiver 55a detects the interfering light L3.

The above described alignment system 5b in the second embodiment is appropriately capable of achieving an effect that is same as the effect achieved by the alignment system 5a in the first embodiment. Moreover, the alignment system 5b in the second embodiment is provided with the polarization beam splitter 52b instead of the half mirror 52a. Thus, the interfering light L3 is not attenuated by the half mirror 52a, and thus an efficiency of the light receiver 55a for optically receiving the interfering light L3 improves. Moreover, the zeroth-order reflected light L2(0) of the measurement light L1 is the linear polarized light and the first polarized light (the s polarized light), and thus the zeroth-order reflected light L2(0) does not passes through the beam splitter 52b. Namely, the zeroth-order reflected light L2(0) does not enter the light receiver 55a. Thus, the interfering light L3 generated by the interference between the ±first-order diffracted lights L2(±1) is not buried in the zeroth-order reflected light L2(0). Therefore, the efficiency of the light receiver 55a for optically receiving the interfering light L3 improves.

(2-3) Structure of Alignment System 5c in Third Embodiment

Next, with reference to FIG. 6 and FIG. 7, the structure of an alignment system 5c in a third embodiment will be described. Note that the detailed description about a member that is same as the member that is already described in the first embodiment to the second embodiment will be omitted by assigning the same reference number to it.

Figure 6:
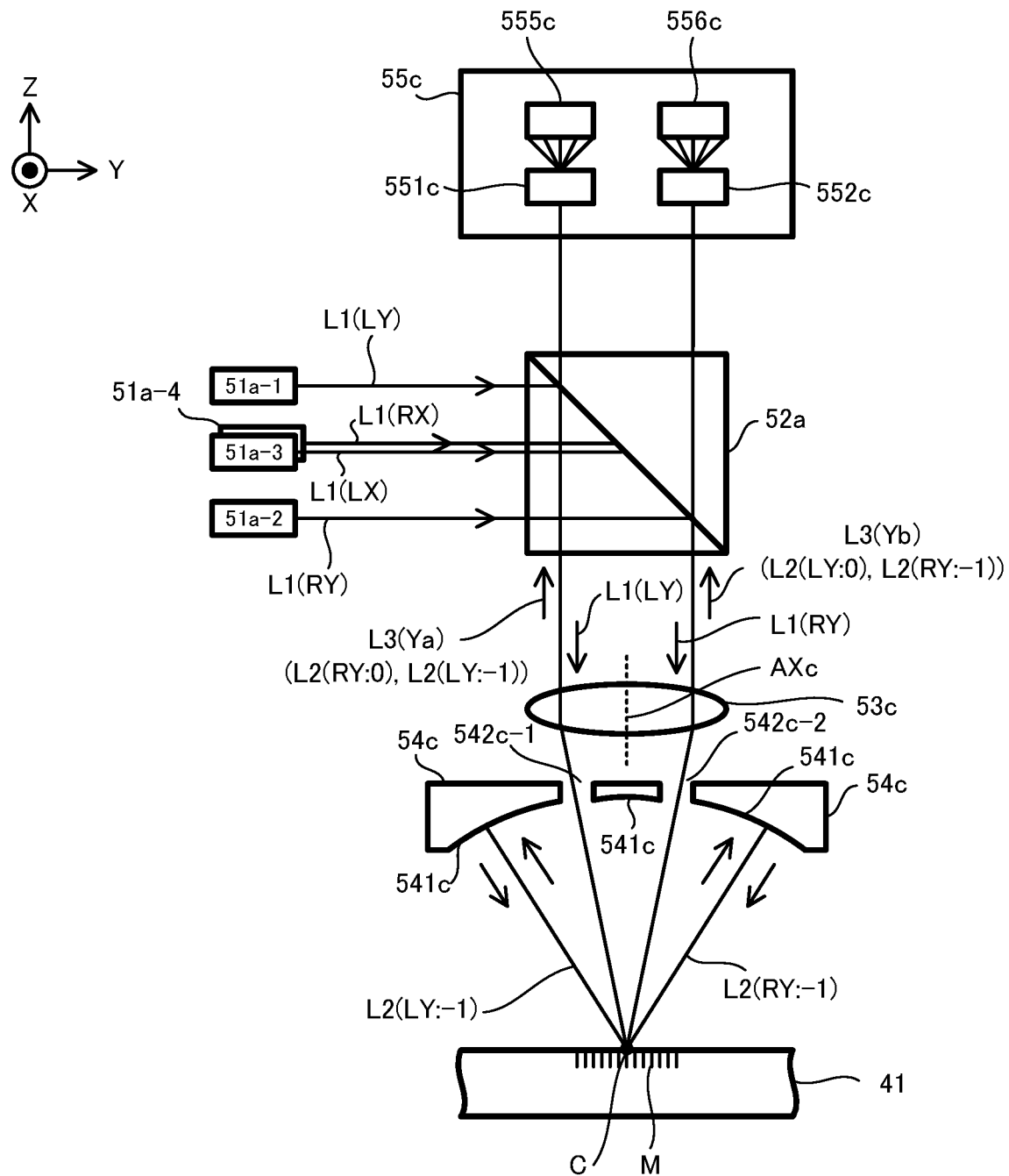
FIG. 6 is a structural view illustrating one example of a structure of an alignment system in a third embodiment.
Figure 7:
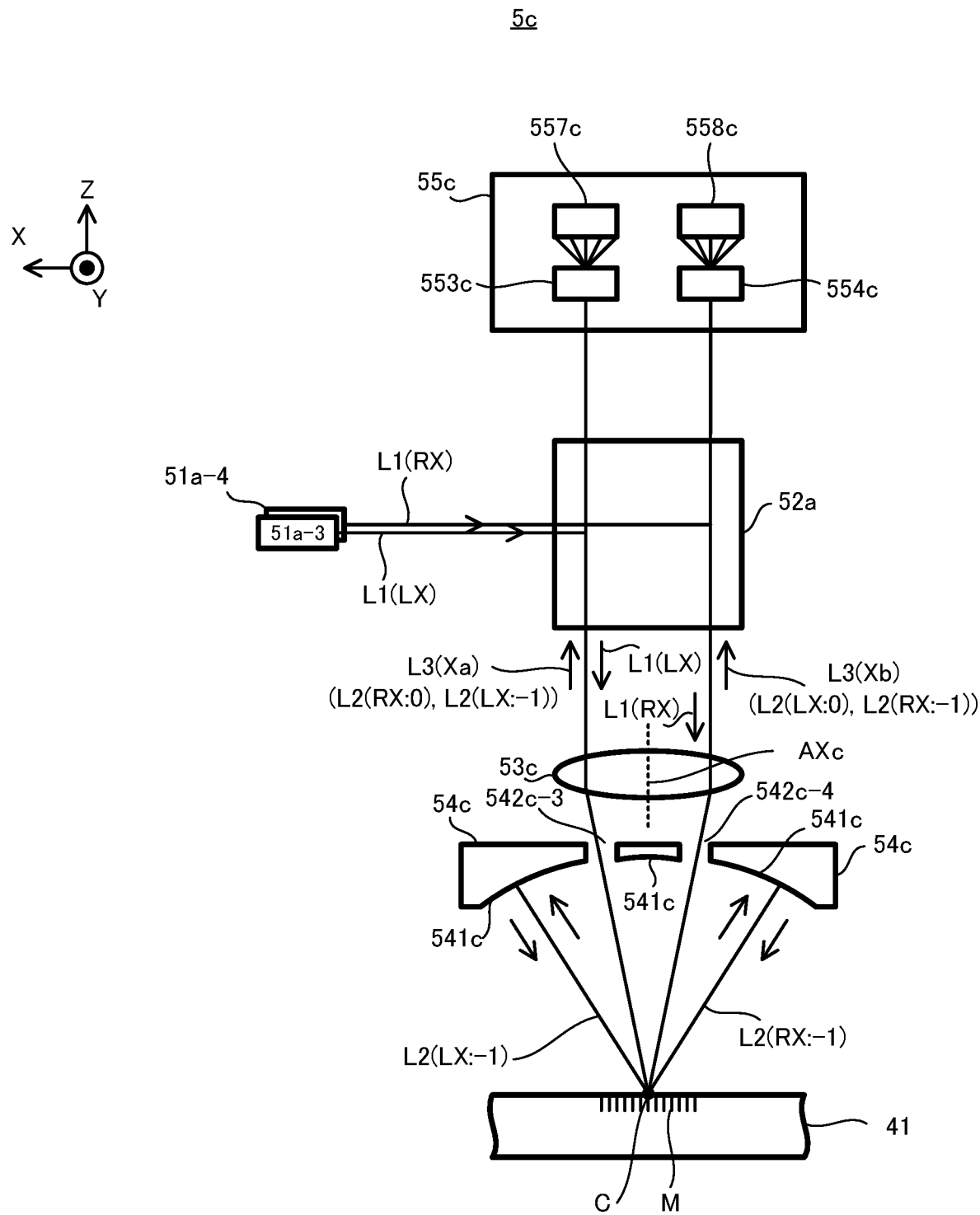
FIG. 7 is a structural view illustrating one example of a structure of the alignment system in the third embodiment.

As illustrated in FIG. 6 and FIG. 7, the alignment system 5c is provided with four light sources 51a (namely, a light source 51a-1, a light source 51a-2, a light source 51a-3 and a light source 51a-4), the half mirror 52a (an example of a first optical system), an objective lens 53c, a reflective optical element 54c (an example of a second optical system), and a light receiver 55c.

The light source 51a-1 emits a first measurement light L1(LY) as the measurement light L1. The light source 51a-2 emits a second measurement light L1(RY) as the measurement light L1. The light source 51a-3 emits a third measurement light L1(LX) as the measurement light L1. The light source 51a-4 emits a fourth measurement light L1(RX) as the measurement light L1. Each of the light sources 51a-1 to 51a-4 may be same as the light source 51a in the first embodiment. Moreover, the measurement light L1 from the light source 51a in the first embodiment may be branched into four lights by an optical fiber and the four lights may be used instead of the measurement lights L1 from the light sources 51a-1 to 51a-4. Moreover, the measurement light from the light source 51a may be separated by a grating-type of diffracting grating or a beam splitter.

Each of the first measurement light L1(LY) and the second measurement light L1(RY) is the measurement light L1 that is irradiated to the grid mark MY. Therefore, the first measurement light L1(LY) and the second measurement light L1(RY) are the measurement lights L1 that are irradiated in order to calculate the correction amount of the positional coordinates of the plurality of shot areas along the Y axis direction. Note that optical paths of the first measurement light L1(LY) and the second measurement light L1(RY) are mainly illustrated in FIG. 6.

Each of the third measurement light L1(LX) and the fourth measurement light L1(RX) is the measurement light L1 that is irradiated to the grid mark MX. Therefore, the third measurement light L1(LX) and the fourth measurement light L1(RX) are the measurement lights L1 that are irradiated in order to calculate the correction amount of the positional coordinates of the plurality of shot areas along the X axis direction. Note that optical paths of the third measurement light L1(LX) and the fourth measurement light L1(RX) are mainly illustrated in FIG. 7.

Each of the first measurement light L1(LY) to the fourth measurement light L1(RX) enters the half mirror 52a. The half mirror 52a reflects one part of each of the first measurement light L1(LY) to the fourth measurement light L1(RX) toward the substrate 41 (namely, the alignment mark M). Each of the first measurement light L1(LY) to the fourth measurement light L1(RX) enters the objective lens 53c after being reflected by the half mirror 52a. The objective lens 53c is located on the optical paths of the first measurement light L1(LY) to the fourth measurement light L1(RX) from the half mirror 52a to the substrate 41.

The objective lens 53c refracts the first measurement light L1(LY) to the fourth measurement light L1(RX) so that each of the first measurement light L1(LY) to the fourth measurement light L1(RX) enters the substrate 41 from an oblique direction. In other words, the objective lens 53c refracts each of the first measurement light L1(LY) to the fourth measurement light L1(RX) so that each of the first measurement light L1(LY) to the fourth measurement light L1(RX) is converged to an optical axis AXc of the objective lens 53c. The first measurement light L1(LY) to the fourth measurement light L1(RX) pass through an aperture 542c-1, an aperture 542c-2, an aperture 542c-3 and an aperture 542c-4 of the reflective optical element 54c, respectively, after passing through the objective lens 53c.

Thus, the reflective optical element 54c is located between the half mirror 52a and the substrate 41 so that the aperture 542c-1 is located on the optical path of the first measurement light L1(LY) from the half mirror 52a to the substrate 41, the aperture 542c-2 is located on the optical path of the second measurement light L1(RY) from the half mirror 52a to the substrate 41, the aperture 542c-3 is located on the optical path of the third measurement light L1(LX) from the half mirror 52a to the substrate 41 and the aperture 542c-4 is located on the optical path of the fourth measurement light L1(RX) from the half mirror 52a to the substrate 41. The first measurement light L1(LY), the second measurement light L1(RY), the third measurement light L1(LX) and the fourth measurement light L1(RX) enter the substrate 41 in the oblique direction after passing through the aperture 542c-1, the aperture 542c-2, the aperture 542c-3 and the aperture 542c-4, respectively. Namely, the first measurement light L1(LY) to the fourth measurement light L1(RX) enter the substrate 41 at the incidence angle that is larger than 0 degree and smaller than 90 degree.

The objective lens 53c refracts the first measurement light L1(LY) to the fourth measurement light L1(RX) so that the first measurement light L1(LY) and the second measurement light L1(RY) enter the same position on the substrate 41 and the third measurement light L1(LX) and the fourth measurement light L1(RX) enter (namely, are irradiated to) the same position on the substrate 41. Thus, the light sources 51a-1 to 51a-4, the half mirror 52a and the objective lens 53c are arranged so as to allow the first measurement light L1(LY) and the second measurement light L1(RY) to enter the same position on the substrate 41 and to allow the third measurement light L1(LX) and the fourth measurement light L1(RX) to enter (namely, are irradiated to) the same position on the substrate 41. When the alignment mark M (the grid mark MY) is located at a position to which the first measurement light L1(LY) and the second measurement light L1(RY) are irradiated, each of the first measurement light L1(LY) and the second measurement light L1(RY) is irradiated to the same alignment mark M. When the alignment mark M (the grid mark MX) is located at a position to which the third measurement light L1(LX) and the fourth measurement light L1(RX) are irradiated, each of the third measurement light L1(LX) and the fourth measurement light L1(RX) is irradiated to the same alignment mark M. Note that an position on the substrate 41 which the first measurement light L1(LY) and the second measurement light L1(RY) enter may be different from an position on the substrate 41 which the third measurement light L1(LX) and the fourth measurement light L1(RX) enter. Note that the objective lens 53c may be referred to as a "condenser optical system". The objective lens 53c may deflect the first measurement light L1(LY) to the fourth measurement light L1(RX) so that the first measurement light L1(LY) and the second measurement light L1(RY) enter the same position on the substrate 41 and the third measurement light L1(LX) and the fourth measurement light L1(RX) enter (namely, are irradiated to) the same position on the substrate 41.

An angle between the optical axis AXc (eventually, an angle between an optical axis of the alignment system 5c, same applies to the below description) and the first measurement light L1(LY) traveling to the substrate 41 (especially, the alignment mark M) after passing through the objective lens 53c is different from an angle between the optical axis AXc and the second measurement light L1(RY) traveling to the substrate 41 (especially, the alignment mark M) after passing through the objective lens 53c. This is because the optical path of the first measurement light L1(LY) and the optical path of the second measurement light L1(RY) are set to sandwich the optical axis AXc. Even in this case, an absolute value of the angle between the optical axis AXc and the first measurement light L1(LY) traveling to the substrate 41 after passing through the objective lens 53c is same as an absolute value of the angle between the optical axis AXc and the second measurement light L1(RY) traveling to the substrate 41 after passing through the objective lens 53c. However, the absolute value of the angle between the optical axis AXc and the first measurement light L1(LY) traveling to the substrate 41 after passing through the objective lens 53c may be different from the absolute value of the angle between the optical axis AXc and the second measurement light L1(RY) traveling to the substrate 41 after passing through the objective lens 53c.

Similarly, an angle between the optical axis AXc and the third measurement light L1(LX) traveling to the substrate 41 (especially, the alignment mark M) after passing through the objective lens 53c is different from an angle between the optical axis AXc and the fourth measurement light L1(RX) traveling to the substrate 41 (especially, the alignment mark M) after passing through the objective lens 53c. This is because the optical path of the third measurement light L1(LX) and the optical path of the fourth measurement light L1(RX) are set to sandwich the optical axis AXc. Even in this case, an absolute value itself of the angle between the optical axis AXc and the third measurement light L1(LX) traveling to the substrate 41 after passing through the objective lens 53c is same as an absolute value of the angle between the optical axis AXc and the fourth measurement light L1(RX) traveling to the substrate 41 after passing through the objective lens 53c. However, the absolute value of the angle between the optical axis AXc and the third measurement light L1(LX) traveling to the substrate 41 after passing through the objective lens 53c may be different from the absolute value of the angle between the optical axis AXc and the fourth measurement light L1(RX) traveling to the substrate 41 after passing through the objective lens 53c.

Moreover, the angle between the optical axis AXc and at least one of the first measurement light L1(LY) and the second measurement light L1(RY) is different from the angle between the optical axis AXc and at least one of the third measurement light L1(LX) and the fourth measurement light L1(RX). Even in this case, the absolute value itself of the angle between the optical axis AXc and at least one of the first measurement light L1(LY) and the second measurement light L1(RY) is same as the absolute value of the angle between the optical axis AXc and at least one of the third measurement light L1(LX) and the fourth measurement light L1(RX). However, the absolute value itself of the angle between the optical axis AXc and at least one of the first measurement light L1(LY) and the second measurement light L1(RY) may be different from the absolute value of the angle between the optical axis AXc and at least one of the third measurement light L1(LX) and the fourth measurement light L1(RX).

Each of a zeroth-order reflected light L2(LY:0) of the first measurement light L1(LY) and a –first-order diffracted light L2(LY:−1) of the first measurement light L1(LY) are emitted as one part of the emitted light L2 from the alignment mark M to which the first measurement light L1(LY) is irradiated. Each of a zeroth-order reflected light L2(RY:0) of the second measurement light L1(RY) and a –first-order diffracted light L2(RY:−1) of the second measurement light L1(RY) are emitted as one part of the emitted light L2 from the alignment mark M to which the second measurement light L1(RY) is irradiated. Each of a zeroth-order reflected light L2(LX:0) of the third measurement light L1(LX) and a –first-order diffracted light L2(LX:−1) of the third measurement light L1(LX) are emitted as one part of the emitted light L2 from the alignment mark M to which the third measurement light L1(LX) is irradiated. Each of a zeroth-order reflected light L2(RX:0) of the fourth measurement light L1(RX) and a –first-order diffracted light L2(RX:−1) of the fourth measurement light L1(RX) are emitted as one part of the emitted light L2 from the alignment mark M to which the fourth measurement light L1(RX) is irradiated.

Each of the –first-order diffracted light L2(LY:−1) to the –first-order diffracted light L2(RX:−1) emitted from the alignment mark M enter a reflective surface 541*c* of the reflective optical element 54*c*. The reflective surface 541*c* has characteristics that is same as characteristics of the above described reflective surface 531*a* of the reflective optical element 53*a*. Therefore, the reflective surface 541*c* is the spherical mirror. The center C of the spherical mirror that constitutes the reflective surface 541*a* is located on the surface of the substrate 41. Thus, the reflective surface 541*c* reflects, toward the center C, the emitted light L2 emitted from the center C. Note that the center C is on the optical axis AXc of the objective lens 53*c*. Thus, an optical axis of the reflective optical element 54*c* is coincident with the optical axis AXc of the objective lens 53*c*.

Moreover, a focus position (in other words, an irradiated position or an incident position) of each of the first measurement light L1(LY) to the fourth measurement light L1(RX) is set to the center C also in the third embodiment. Here, a position at which the first measurement light L1(LY) to the fourth measurement light L1(RX) intersect with one another may be referred to as the focus position. And, a rear focal position of the objective lens 53*c* may be referred to as the focus position. Thus, the light sources 51*a*-1 to 51*a*-4, the half mirror 52*a*, the objective lens 53*c* and the reflective optical element 54*c* are arranged so that the focus position of each of the first measurement light L1(LY) to the fourth measurement light L1(RX) is coincident with the center C. As a result, when the alignment mark M is located at the center C, the emitted light L2 emitted from the alignment mark M (namely, the center C) returns to the center C again after being reflected by the reflective surface 541*c*. Namely, the –first-order diffracted light L2(LY:−1) is emitted from the alignment mark M so that the –first-order diffracted light L2(LY:−1) is diverged from the optical axis AXc. The –first-order diffracted light L2(LY:−1) emitted from the alignment mark M returns to the center C again after being reflected by the reflective surface 541*c*. In this case, the reflective surface 541*c* reflects the –first-order diffracted light L2(LY:−1) so that the –first-order diffracted light L2(LY:−1) diverged from the optical axis AXc is converged to the optical axis AXc. Same applies to the other diffracted lights L2.

The measurement light L1 includes a plurality of laser lights that have different wavelengths, respectively, also in the third embodiment as with the first embodiment. Thus, the –first-order diffracted lights L2(LY:−1) corresponding to the plurality of laser lights are emitted from the alignment mark M at the different diffraction angles, respectively. However, even when the diffraction angles of the plurality of –first-order diffracted lights L2(LY:−1) vary depending on the wavelength, all –first-order diffracted lights L2(−1) return to the same position, as long as the plurality of –first-order diffracted lights L2(LY:−1) are reflected by the reflective surface 541*c*, also in the third embodiment as with the first embodiment. Same applies to the other diffracted lights L2.

The –first-order diffracted lights L2(LY:−1) travels to the light receiver 55*c* through an optical path that is parallel with (alternatively, is coincident with) an optical path through which the zeroth-order reflected light L2(RY:0) travels to the light receiver 55*c* after being irradiated to the alignment mark M. Thus, an interfering light L3 (Ya) that is generated by the interference between the –first-order diffracted lights L2(LY:−1) and the zeroth-order reflected light L2(RY:0) is emitted from the alignment mark M. The interfering light L3(Ya) emitted from the alignment mark M passes through the aperture 542*c*-2 of the reflective optical element 541*c*, the objective lens 53*c* and the half mirror 52*a*. As a result, the interfering light L3(Ya) enters the light receiver 55*c*.

The –first-order diffracted lights L2(RY:−1) travels to the light receiver 55*c* through an optical path that is parallel with (alternatively, is coincident with) an optical path through which the zeroth-order reflected light L2(LY:0) travels to the light receiver 55*c* after being irradiated to the alignment mark M. Thus, an interfering light L3 (Yb) that is generated by the interference between the –first-order diffracted lights L2(RY:−1) and the zeroth-order reflected light L2(LY:0) is emitted from the alignment mark M. The interfering light L3(Yb) emitted from the alignment mark M passes through the aperture 542*c*-2 of the reflective optical element 541*c*, the objective lens 53*c* and the half mirror 52*a*. As a result, the interfering light L3(Yb) enters the light receiver 55*c*.

The –first-order diffracted lights L2(LX:−1) travels to the light receiver 55*c* through an optical path that is parallel with (alternatively, is coincident with) an optical path through which the zeroth-order reflected light L2(RX:0) travels to the light receiver 55*c* after being irradiated to the alignment mark M. Thus, an interfering light L3 (Xa) that is generated by the interference between the –first-order diffracted lights L2(LX:−1) and the zeroth-order reflected light L2(RX:0) is emitted from the alignment mark M. The interfering light L3(Xa) emitted from the alignment mark M passes through the aperture 542*c*-3 of the reflective optical element 541*c*, the objective lens 53*c* and the half mirror 52*a*. As a result, the interfering light L3(Xa) enters the light receiver 55*c*.

The –first-order diffracted lights L2(RX:−1) travels to the light receiver 55*c* through an optical path that is parallel with (alternatively, is coincident with) an optical path through which the zeroth-order reflected light L2(LX:0) travels to the light receiver 55*c* after being irradiated to the alignment mark M. Thus, an interfering light L3 (Xb) that is generated by the interference between the –first-order diffracted lights L2(RX:−1) and the zeroth-order reflected light L2(LX:0) is emitted from the alignment mark M. The interfering light L3(Xb) emitted from the alignment mark M passes through the aperture 542*c*-4 of the reflective optical element 541*c*, the objective lens 53*c* and the half mirror 52*a*. As a result, the interfering light L3(Xb) enters the light receiver 55*c*.

As described above, the –first-order diffracted lights L2(LY:−1, RY:−1, LX:−1, RX:−1) that travel to the light receiver 55c after being irradiated to the alignment mark M twice (namely, after being diffracted at the mark area MA a plurality of times (twice)) pass through the same optical paths as the zeroth-order reflected lights L2 (RY:0, LY:0, RX:0, RY:0), respectively, and thus, an influence of a variation of an environment and the optical system (for example, a local temperature fluctuation, a variation of a thermal expansion of an optical component, a variation of a refractive index of the optical component and the like) is minimized when the environment and the optical system vary, and a stability for the measurement and a repeatability for the measurement improve.

And, each of the −first-order diffracted lights L2(LY:−1, RY:−1, LX:−1, RX:−1) that travel to the light receiver 55c after being irradiated to the alignment mark M twice (namely, after being diffracted at the mark area MA a plurality of times (twice)) passes through the same optical path regardless of the difference of the wavelength, and thus, the influence of the variation of the environment and the optical system (for example, the local temperature fluctuation) is minimized for each wavelength when the environment and the optical system vary, and a stability for the measurement and a repeatability for the measurement improve.

The light receiver 55c is provided with a spectroscope 551c, a spectroscope 552c, a spectroscope 553c, a spectroscope 554c, a light receiving element 555c, a light receiving element 556c, a light receiving element 557c and a light receiving element 558c. The feature of each of the spectroscopes 551c to 554c is same as the feature of the above described spectroscope 551a. The feature of each of the light receiving elements 555c to 558c is same as the feature of the above described first light receiving surface 555a.

The interfering light L3(Ya) enters the spectroscope 551c. The spectroscope 551c disperses the interfering light L3(Ya). The interfering light L3(Ya) dispersed by the spectroscope 551c enters a light receiving surface of the light receiving element 555c. Thus, the plurality of light components included in the interfering light L3(Ya) are optically receivable by the light receiving element 555c simultaneously. A light receiving result of the light receiving element 555c is outputted to the control apparatus 6 as the mark detection information (hereinafter, it is referred to as a "mark detection information #Ya").

The interfering light L3(Yb) enters the spectroscope 552c. The spectroscope 552c disperses the interfering light L3(Yb). The interfering light L3(Yb) dispersed by the spectroscope 552c enters a light receiving surface of the light receiving element 556c. Thus, the plurality of light components included in the interfering light L3(Yb) are optically receivable by the light receiving element 556c simultaneously. A light receiving result of the light receiving element 556c is outputted to the control apparatus 6 as the mark detection information (hereinafter, it is referred to as a "mark detection information #Yb").

The interfering light L3(Xa) enters the spectroscope 553c. The spectroscope 553c disperses the interfering light L3(Xa). The interfering light L3(Xa) dispersed by the spectroscope 553c enters a light receiving surface of the light receiving element 557c. Thus, the plurality of light components included in the interfering light L3(Xa) are optically receivable by the light receiving element 557c simultaneously. A light receiving result of the light receiving element 557c is outputted to the control apparatus 6 as the mark detection information (hereinafter, it is referred to as a "mark detection information #Xa").

The interfering light L3(Xb) enters the spectroscope 554c. The spectroscope 554c disperses the interfering light L3(Xb). The interfering light L3(Xb) dispersed by the spectroscope 554c enters a light receiving surface of the light receiving element 558c. Thus, the plurality of light components included in the interfering light L3(Xb) are optically receivable by the light receiving element 558c simultaneously. A light receiving result of the light receiving element 558c is outputted to the control apparatus 6 as the mark detection information (hereinafter, it is referred to as a "mark detection information #Xb").

As a result, the control apparatus 6 is capable of performing the alignment operation by using the four mark detection information outputted from the alignment system 5c. Specifically, the control apparatus 6 obtains the mark position information (hereinafter, it is referred to as a "mark position information #Y") that represents the position of the alignment mark M (the grid mark MY) along the Y axis direction by using the mark detection information #Ya and #Yb. Then, the control apparatus 6 calculates the correction amount of the positional coordinates of the plurality of shot areas along the Y axis direction by using the mark position information #Y. Similarly, the control apparatus 6 obtains the mark position information (hereinafter, it is referred to as a "mark position information #X") that represents the position of the alignment mark M (the grid mark MX) along the X axis direction by using the mark detection information #Xa and #Xb. Then, the control apparatus 6 calculates the correction amount of the positional coordinates of the plurality of shot areas along the X axis direction by using the mark position information #X.

Moreover, in the third embodiment, the control apparatus 6 performs the scatterometry measurement for changing at least one of the mark detection information #Ya and #Yb on the basis of the mark detection information #Ya and #Yb. Moreover, the control apparatus 6 performs the scatterometry measurement for changing at least one of the mark detection information #Xa and #Xb on the basis of the mark detection information #Xa and #Xb. Specifically, as described above, there is a possibility that at least one of the mark detection information #Ya and #Yb includes a margin of an error caused by the asymmetry shape of the grid mark MY. There is a possibility that at least one of the mark detection information #Xa and #Xb includes a margin of an error caused by the asymmetry shape of the grid mark MX. So, the control apparatus 6 changes (in other word, correcting, updating or adjusting) the mark detection information #Ya and #Yb by performing the scatterometry operation using the mark detection information #Ya and #Yb obtained from the different interfering lights L3, in order to improve an accuracy of at least one of the mark detection information #Ya and #Yb. Similarly, the control apparatus 6 changes (in other word, correcting, updating or adjusting) the mark detection information #Xa and #Xb by performing the scatterometry operation using the mark detection information #Xa and #Xb obtained from the different interfering lights L3, in order to improve an accuracy of at least one of the mark detection information #Xa and #Xb.

The above described alignment system 5c in the third embodiment is appropriately capable of achieving an effect that is same as the effect achieved by the alignment system 5a in the first embodiment.

Moreover, the alignment system 5c in the third embodiment is configured to irradiate the substrate 41 with the first measurement light L1(LY), the second measurement light L1(RY), the third measurement light L1(LX) and the fourth measurement light L1(RX) simultaneously. Thus, the alignment system 5c is configured to simultaneously obtain the mark detection information #Ya and #Yb used for calculating the correction amount of the positional coordinates of the plurality of shot areas along the Y axis direction and the mark detection information #Xa and #Xb used for calculating the correction amount of the positional coordinates of the plurality of shot areas along the X axis direction. Therefore, according to the alignment system 5c in the third embodiment, a time required to obtain the mark detection information used for calculating the correction amount of the positional coordinates of the plurality of shot areas along the XY plane is reduced, compared to the alignment system 5a in the first embodiment.

Moreover, the alignment system 5c in the third embodiment is configured to irradiate the substrate 41 with the first measurement light L1(LY) and the second measurement light L1(RY) simultaneously. Thus, the alignment system 5c is configured to simultaneously obtain the mark detection information #Ya and #Yb that are used to perform the scatterometry measurement for reducing the error caused by the asymmetry shape of the grid mark MY and to change the mark detection information. Similarly, the alignment system 5c in the third embodiment is configured to irradiate the substrate 41 with the third measurement light L1(LX) and the fourth measurement light L1(RX) simultaneously. Thus, the alignment system 5c is configured to simultaneously obtain the mark detection information #Xa and #Xb that are used to perform the scatterometry measurement for reducing the error caused by the asymmetry shape of the grid mark MX and to change the mark detection information. Therefore, according to the alignment system 5c in the third embodiment, a time required to obtain the mark detection information used for the scatterometry measurement is reduced, compared to the alignment system 5a in the first embodiment.

Moreover, the alignment system 3c in the third embodiment is configured to optically receive the interfering light L3(Ya) generated by the interference between the zeroth-order reflected light L2(RY:0) and the −first-order (LY:−1) and the interfering light L3(Yb) generated by the interference between the zeroth-order reflected light L2(LY:0) and the −first-order (RY:−1), separately. The control apparatus 6 is configured to simultaneously obtain the position and an asymmetry information (an amount corresponding to the error caused by the asymmetry shape of the grid mark MX) of the alignment mark M by using these light receiving result. Thus, an influence cause by the variation of the environment (a variation of a temperature in the measurement optical path and the like) and the variation of the optical system (a variation of a temperature of an optical member and the like) is reduced.

Moreover, in the alignment system 5c in the third embodiment, each of the first measurement light L1(LY) and the second measurement light L1(RY) enters the substrate in the oblique direction. Thus, there is a higher possibility that the measurement lights L1 are diffracted by the grid mark MY so that at least one of the −first-order diffracted light L2(−1) enters the reflective surface 541c even when the pitch ΛY of the grid mark MY is relatively small, compared to the alignment system 5a in the first embodiment. Therefore, the alignment system 5c in the third embodiment is capable of obtaining the mark detection information more appropriately even when the pitch ΛY of the grid mark MY is relatively small, compared to the alignment system 5a in the first embodiment. Similarly, in the alignment system 5c in the third embodiment, each of the third measurement light L1(LX) and the fourth measurement light L1(RX) enters the substrate in the oblique direction. Thus, thus, there is a higher possibility that the measurement lights L1 are diffracted by the grid mark MX so that at least one of the −first-order diffracted light L2(−1) enters the reflective surface 541c even when the pitch ΛX of the grid mark MX is relatively small, compared to the alignment system 5a in the first embodiment. Therefore, the alignment system 5c in the third embodiment is capable of obtaining the mark detection information more appropriately even when the pitch ΛX of the grid mark MX is relatively small, compared to the alignment system 5a in the first embodiment.

Note that the half mirror 52a may be replaced by the polarization beam splitter in the alignment system 5c in the third embodiment. In this case, a quarter wave plate may be provided between the polarization beam splitter and the objective lens 53c, in the objective lens 53c, between the objective lens 53c and the reflective optical element 54c or between the reflective optical element 54c and the substrate 41.

(2-4) Structure of Alignment System 5d in Fourth Embodiment

Next, with reference to FIG. 8 and FIG. 9, the structure of an alignment system 5d in a fourth embodiment will be described. Note that the detailed description about a member that is same as the member that is already described in the first embodiment to the third embodiment will be omitted by assigning the same reference number to it.

Figure 8:
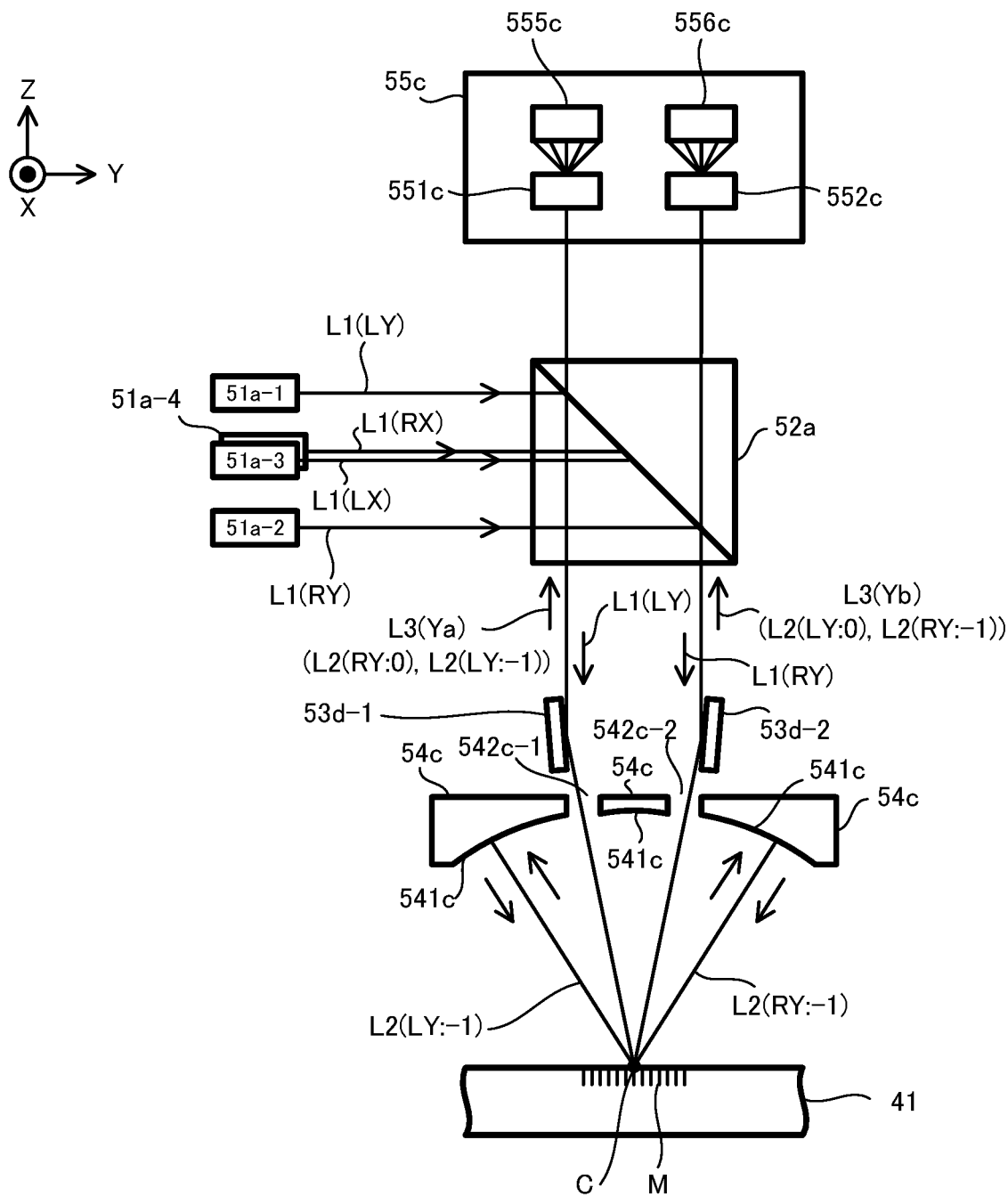
FIG. 8 is a structural view illustrating one example of a structure of an alignment system in a fourth embodiment.
Figure 9:
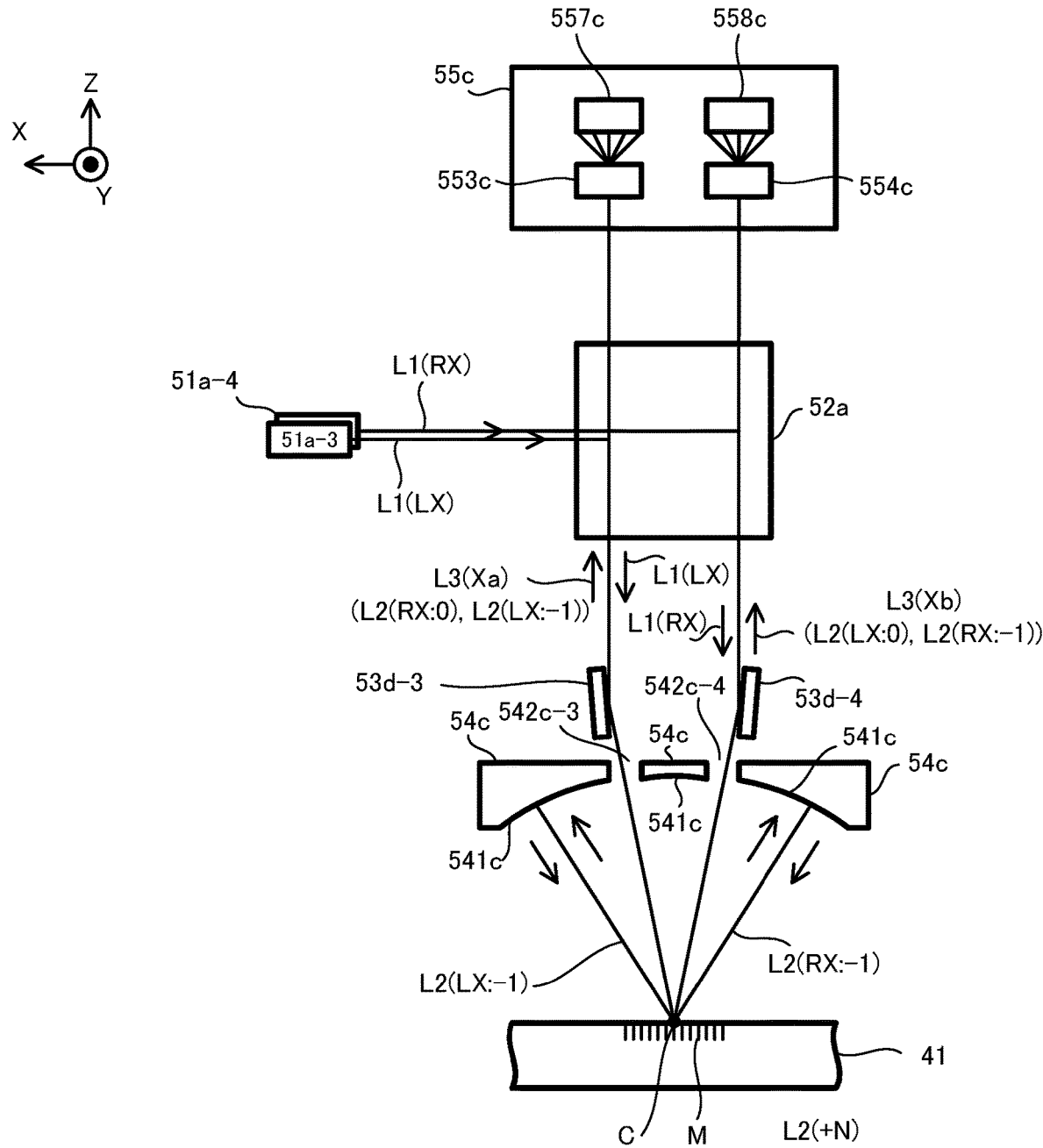
FIG. 9 is a structural view illustrating one example of a structure of the alignment system in the fourth embodiment.

As illustrated in FIG. 8 and FIG. 9, the alignment system 5d in the fourth embodiment is different from the alignment system 5c in the third embodiment in that the alignment system 5d is provided with a reflective mirror 53d-1, a reflective mirror 53d-2, a reflective mirror 53d-3 and a reflective mirror 53d-4 instead of the objective lens 53c. Another feature of the alignment system 5d in the fourth embodiment may be same as another feature of the alignment system 5c in the third embodiment.

In the third embodiment, the objective lens 53c refracts the first measurement light L1(LY) in order to allow the first measurement light L1(LY) to enter the substrate 41 in the oblique direction. On the other hand, in the fourth embodiment, the reflective mirror 53d-1 reflects the first measurement light L1(LY) in order to allow the first measurement light L1(LY) to enter the substrate 41 in the oblique direction. The first measurement light L1(LY) passes through the aperture 542c-1 after being reflected by the reflective mirror 53d-1 and then enters the substrate 41 in the oblique direction. Moreover, the reflective mirror 53d-1 reflects the interfering light L3(Ya) so that the interfering light L3(Ya) from the substrate 41 enters the light receiver 55c.

Same applies to the second measurement light L1(RY) to the fourth measurement light L1(RX). Namely, the reflective mirror 53d-2 reflects the second measurement light L1(RY) in order to allow the second measurement light L1(RY) to enter the substrate 41 in an oblique direction. The reflective mirror 53d-2 reflects the interfering light L3(Yb) so that the interfering light L3(Yb) from the substrate 41 enters the light receiver 55c. The reflective mirror 53d-3 reflects the third measurement light L1(LX) in order to allow the third measurement light L1(LX) to enter the substrate 41 in an oblique direction. The reflective mirror 53d-3 reflects the interfering light L3(Xa) so that the interfering light L3(Xa) from the substrate 41 enters the light receiver 55c. The reflective mirror 53d-4 reflects the fourth measurement light L1(RX) in order to allow the fourth measurement light L1(RX) to enter the substrate 41 in an oblique direction. The reflective mirror 53*d*-4 reflects the interfering light L3(Xb) so that the interfering light L3(Xb) from the substrate 41 enters the light receiver 55*c*.

The above described alignment system 5*d* in the fourth embodiment is appropriately capable of achieving an effect that is same as the effect achieved by the alignment system 5*c* in the third embodiment. Moreover, since the alignment system 5*d* in the fourth embodiment is not provided with the objective lens 53*c* (namely, a refractive optical element), an influence of a chromatic aberration is reduced or eliminated, compared to the alignment system 5*c* in the third embodiment.

Note that a reflective type of objective optical system or a reflective and refractive type of objective optical system may be used instead of the reflective mirror 53*d*-1, the reflective mirror 53*d*-2, the reflective mirror 53*d*-3 and the reflective mirror 53*d*-4 in the fourth embodiment. This reflective type of objective optical system or the reflective and refractive type of objective optical system may be a center shield type of objective optical system. For example, the objective optical system disclosed in US2006/0158720A1, US2012/0140353A1 and U.S. Pat. No. 6,894,834B2 may be used as the objective optical system.

(2-5) Structure of Alignment System 5*e* in Fifth Embodiment

Next, with reference to FIG. 10 and FIG. 11, the structure of an alignment system 5*e* in a fifth embodiment will be described. Note that the detailed description about a member that is same as the member that is already described in the first embodiment to the fourth embodiment will be omitted by assigning the same reference number to it.

Figure 10:
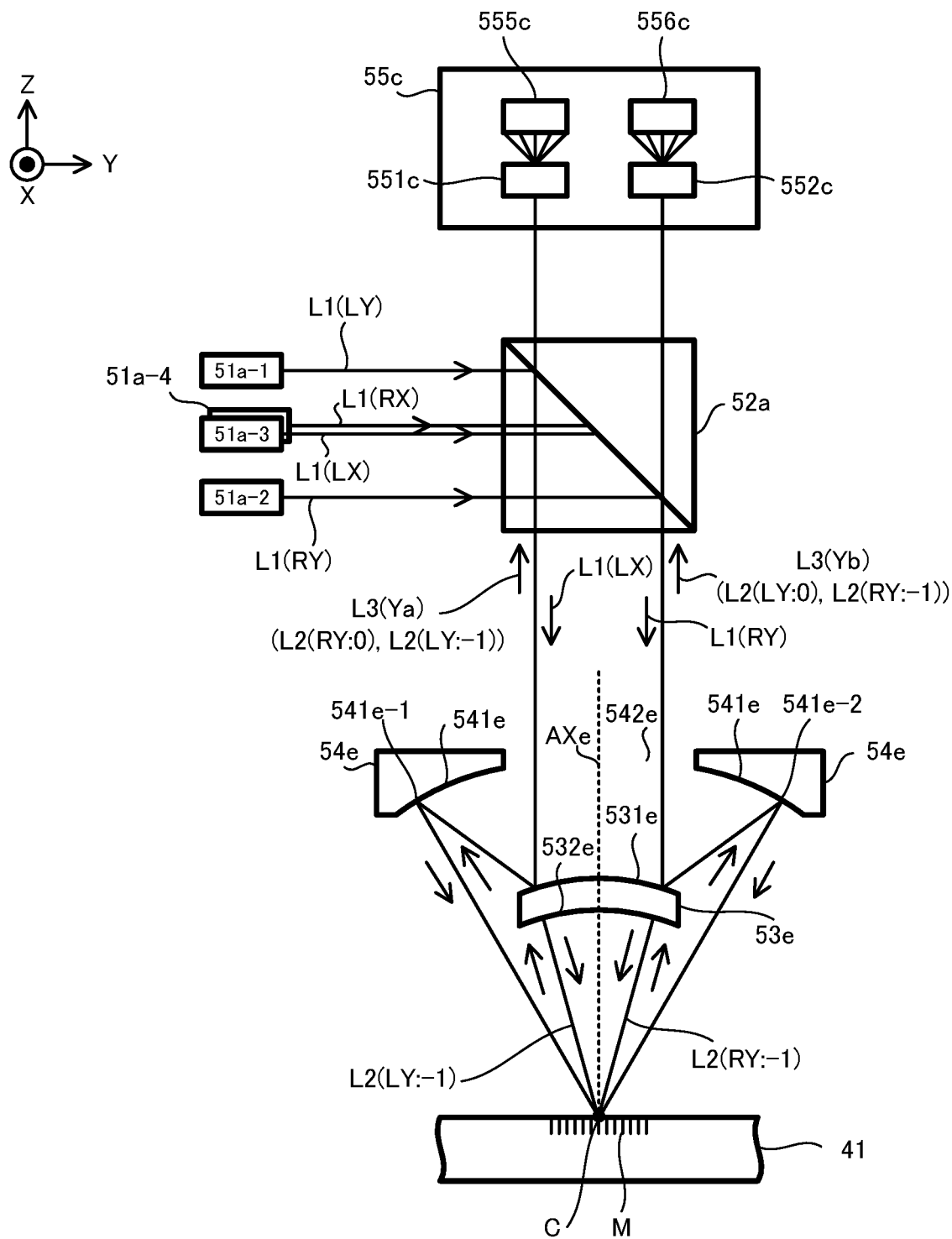
FIG. 10 is a structural view illustrating one example of a structure of an alignment system in a fifth embodiment.
Figure 11:
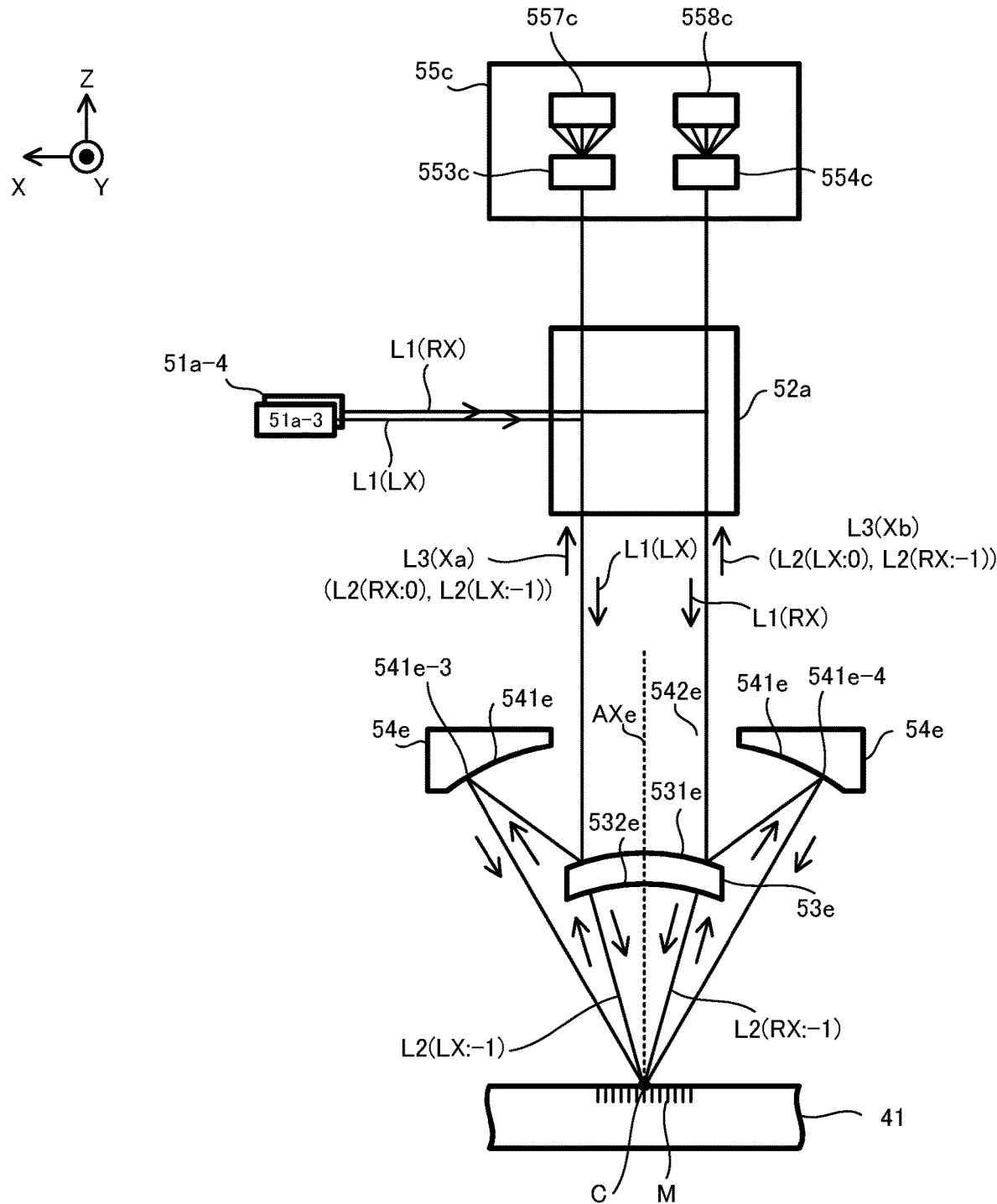
FIG. 11 is a structural view illustrating one example of a structure of the alignment system in the fifth embodiment.

As illustrated in FIG. 10 and FIG. 11, the alignment system 5*e* in the fifth embodiment is different from the alignment system 5*d* in the fourth embodiment in that the alignment system 5*e* is provided with a reflective optical element 53*e* and a reflective optical element 54*e* instead of the reflective mirrors 53*d*-1 to 53*d*-4. It may be said that the reflective optical element 53*e* and the reflective optical element 54*e* constitutes a Schwarzschild type of reflective optical element. Another feature of the alignment system 5*e* in the fifth embodiment may be same as another feature of the alignment system 5*d* in the fourth embodiment.

Each of the first measurement light L1(LY) to the fourth measurement light L1(RX) passes through an aperture 542*e* of the reflective optical element 54*e* after being reflected by the half mirror 52*a*. Each of the first measurement light L1(LY) to the fourth measurement light L1(RX) enters a reflective surface 531*e* of the reflective optical element 53*e* after passing through the aperture 542*e*. The reflective surface 531*e* faces the half mirror 52*a*. The reflective surface 531*e* is convex toward the half mirror 52*a*. The reflective surface 531*e* reflects each of the first measurement light L1(LY) to the fourth measurement light L1(RX).

Specifically, the reflective surface 531*e* reflects the first measurement light L1(LY) to a first part 541*e*-1 of a reflective surface 541*e*, reflects the second measurement light L1(RY) to a second part 541*e*-2 of the reflective surface 541*e*, reflects the third measurement light L1(LX) to a third part 541*e*-3 of the reflective surface 541*e* and reflects the fourth measurement light L1(RX) to a fourth part 541*e*-4 of the reflective surface 541*e*. The first part 541*e*-1 to the fourth part 541*e*-4 are located at more outer positions viewed from an optical axis AXe of the reflective optical element 53*e* than the reflective surface 531*e*. Thus, the reflective surface 531*e* reflects each of the first measurement light L1(LY) to the fourth measurement light L1(RX) so that the each of the first measurement light L1(LY) to the fourth measurement light L1(RX) is diverged from the optical axis AXe.

Here, the first part 541*e*-1 and the second part 541*e*-2 sandwich the optical axis AXe along the Y axis direction. A position of the first part 541*e*-1 and a position of the second part 541*e*-2 are symmetric with respect to the optical axis AXe. The third part 541*e*-3 and the fourth part 541*e*-4 sandwich the optical axis AXe along the X axis direction. A position of the third part 541*e*-3 and a position of the fourth part 541*e*-4 are symmetric with respect to the optical axis AXe.

The reflective surface 541*e* faces the substrate 41. The reflective surface 541*e* reflects each of the first measurement light L1(LY) to the fourth measurement light L1(RX) to the substrate 41. The reflective surface 541*e* reflects each of the first measurement light L1(LY) to the fourth measurement light L1(RX) so that each of the first measurement light L1(LY) to the fourth measurement light L1(RX) is converged to the optical axis AXe. As a result, each of the first measurement light L1(LY) to the fourth measurement light L1(RX) enters the substrate 41 in an oblique direction. The reflective surface 541*e* reflects the first measurement light L1(LY) to the fourth measurement light L1(RX) so that the first measurement light L1(LY) to the fourth measurement light L1(RX) enter (namely, are irradiated to) the same position on the substrate 41. Specifically, the reflective surface 541*e* reflects the first measurement light L1(LY) to the fourth measurement light L1(RX) so that the first measurement light L1(LY) to the fourth measurement light L1(RX) enter a center C of a below described reflective surface 532*e* set on the substrate 41. Thus, the light sources 51*a*-1 to 51*a*-4, the half mirror 52*a*, the reflective optical element 53*e* and the reflective optical element 54*e* are located at positions that allows the first measurement light L1(LY) to the fourth measurement light L1(RX) to enter the same position on the substrate 41. When the alignment mark M is located at a position to which the first measurement light L1(LY) to the fourth measurement light L1(RX) are irradiated, the first measurement light L1(LY) to the fourth measurement light L1(RX) are irradiated to the same alignment mark M. Note that a shape of the reflective surface 541*e* viewed from the Z axis direction may be an annular shape. Namely, the first part 541*e*-1 to the fourth part 541*e*-4 may be unified.

The zeroth-order reflected light L2(LY:0) to the zeroth-order reflected light L2(RX) and the −first-order diffracted light L2(LY:−1) to the −first-order diffracted light L2(RX:−1) are emitted from the alignment mark M to which the first measurement light L1(LY) to the fourth measurement light L1(RX) are irradiated. Each of the −first-order diffracted light L2(LY:−1) to the −first-order diffracted light L2(RX:−1) emitted from the alignment mark M enters the reflective surface 532*e* of the reflective optical element 53*e*. The reflective surface 532*e* has characteristics that is same as characteristics of the above described reflective surface 531*a* of the reflective optical element 53*a*. The reflective surface 532*e* is the concave spherical mirror. The center C of the spherical mirror that constitutes the reflective surface 532*e* is located at an intersection point of the surface of the substrate 41 and the optical axis AXe. Thus, the reflective surface 532*e* reflects, toward the center C, the emitted light L2 emitted from the center C (and is an example of a second optical system).

Moreover, the focus position (in other words, the irradiated position or the incident position) of each of the first measurement light L1(LY) to the fourth measurement light L1(RX) is set to the center C also in the fifth embodiment.

Here, the position at which the first measurement light L1(LY) to the fourth measurement light L1(RX) intersect with one another may be referred to as the focus position. And, a rear focal position of an optical system (an objective optical system) including the reflective surface 541e and the reflective surface 531e may be referred to as the focus position. Thus, the light sources 51a-1 to 51a-4, the half mirror 52a, the reflective optical element 53e and the reflective optical element 54e are arranged so that the focus position of each of the first measurement light L1(LY) to the fourth measurement light L1(RX) is coincident with the center C. As a result, when the alignment mark M is located at the center C, the emitted light L2 emitted from the alignment mark M (namely, the center C) returns to the center C again after being reflected by the reflective surface 532e. Namely, the –first-order diffracted light L2(LY:–1) is emitted from the alignment mark M so that the –first-order diffracted light L2(LY:–1) is diverged from the optical axis AXe. The –first-order diffracted light L2(LY:–1) emitted from the alignment mark M returns to the center C again after being reflected by the reflective surface 532e. In this case, the reflective surface 532e reflects the –first-order diffracted light L2(LY:–1) so that the –first-order diffracted light L2(LY:–1) diverged from the optical axis AXe is converged to the optical axis AXe. Same applies to the other diffracted lights L2.

The measurement light L1 includes a plurality of laser lights that have different wavelengths, respectively, also in the fifth embodiment as with the first embodiment. Thus, the –first-order diffracted lights L2(LY:–1) corresponding to the plurality of laser lights are emitted from the alignment mark M at the different diffraction angles, respectively. However, even when the diffraction angles of the plurality of –first-order diffracted lights L2(LY: –1) vary depending on the wavelength, all –first-order diffracted lights L2 (LY:–1) return to the same position, as long as the plurality of –first-order diffracted lights L2(LY:–1) are reflected by the reflective surface 532e, also in the fifth embodiment as with the first embodiment. Same applies to the other diffracted lights L2.

The interfering light L3(Ya) is emitted from the alignment mark M to which the –first-order diffracted lights L2(LY:–1) is irradiated after being reflected by the reflective surface 532e so that the interfering light L3(Ya) is diverged from the optical axis AXe. The interfering light L3(Ya) emitted from the alignment mark M travels to the half mirror 52a through an optical path that is parallel with (alternatively, is coincident with) an optical path through which the first measurement light L1(LY) travels from the half mirror 52a to the substrate 41. Namely, the interfering light L3(Ya) is reflected by the first part 541e-1 of the reflective surface 541e. As a result, the interfering light L3(Ya) diverged from the optical axis AXe is converged to the optical axis AXe and travels to the reflective surface 531e. Then, the interfering light L3(Ya) is reflected by the reflective surface 531e. The interfering light L3(Ya) passes through the half mirror 52a after being reflected by the reflective surface 531e. As a result, the interfering light L3(Ya) enters the light receiver 55c.

The interfering light L3(Yb) is emitted from the alignment mark M to which the –first-order diffracted lights L2(RY:–1) is irradiated after being reflected by the reflective surface 532e so that the interfering light L3(Yb) is diverged from the optical axis AXe. The interfering light L3(Yb) emitted from the alignment mark M travels to the half mirror 52a through an optical path that is parallel with (alternatively, is coincident with) an optical path through which the second measurement light L1(RY) travels from the half mirror 52a to the substrate 41. Namely, the interfering light L3(Yb) is reflected by the second part 541e-2 of the reflective surface 541e. As a result, the interfering light L3(Yb) diverged from the optical axis AXe is converged to the optical axis AXe and travels to the reflective surface 531e. Then, the interfering light L3(Yb) is reflected by the reflective surface 531e. The interfering light L3(Yb) passes through the half mirror 52a after being reflected by the reflective surface 531e. As a result, the interfering light L3(Yb) enters the light receiver 55c.

The interfering light L3(Xa) is emitted from the alignment mark M to which the –first-order diffracted lights L2 (LX:–1) is irradiated after being reflected by the reflective surface 532e so that the interfering light L3(Xa) is diverged from the optical axis AXe. The interfering light L3(Xa) emitted from the alignment mark M travels to the half mirror 52a through an optical path that is parallel with (alternatively, is coincident with) an optical path through which the third measurement light L1(LX) travels from the half mirror 52a to the substrate 41. Namely, the interfering light L3(Xa) is reflected by the third part 541e-3 of the reflective surface 541e. As a result, the interfering light L3(Xa) diverged from the optical axis AXe is converged to the optical axis AXe and travels to the reflective surface 531e. Then, the interfering light L3(Xa) is reflected by the reflective surface 531e. The interfering light L3(Xa) passes through the half mirror 52a after being reflected by the reflective surface 531e. As a result, the interfering light L3(Xa) enters the light receiver 55c.

The interfering light L3(Xb) is emitted from the alignment mark M to which the –first-order diffracted lights L2(RX:–1) is irradiated after being reflected by the reflective surface 532e so that the interfering light L3(Xb) is diverged from the optical axis AXe. The interfering light L3(Xb) emitted from the alignment mark M travels to the half mirror 52a through an optical path that is parallel with (alternatively, is coincident with) an optical path through which the fourth measurement light L1(RX) travels from the half mirror 52a to the substrate 41. Namely, the interfering light L3(Xb) is reflected by the fourth part 541e-4 of the reflective surface 541e. As a result, the interfering light L3(Xb) diverged from the optical axis AXe is converged to the optical axis AXe and travels to the reflective surface 531e. Then, the interfering light L3(Xb) is reflected by the reflective surface 531e. The interfering light L3(Xb) passes through the half mirror 52a after being reflected by the reflective surface 531e. As a result, the interfering light L3(Xb) enters the light receiver 55c.

The above described alignment system 5e in the fifth embodiment is appropriately capable of achieving an effect that is same as the effect achieved by the alignment system 5d in the fourth embodiment. Moreover, according to the alignment system 5e in the fifth embodiment, the incidence angle of each of the first measurement light L1(LY) to the fourth measurement light L1(RX) becomes larger, compared to the alignment system 5d in the fourth embodiment. Namely, it is possible to increase a numerical aperture of an optical system from which the first measurement light L1(LY) to the fourth measurement light L1(RX) are emitted to the substrate 41.

Figure 12:
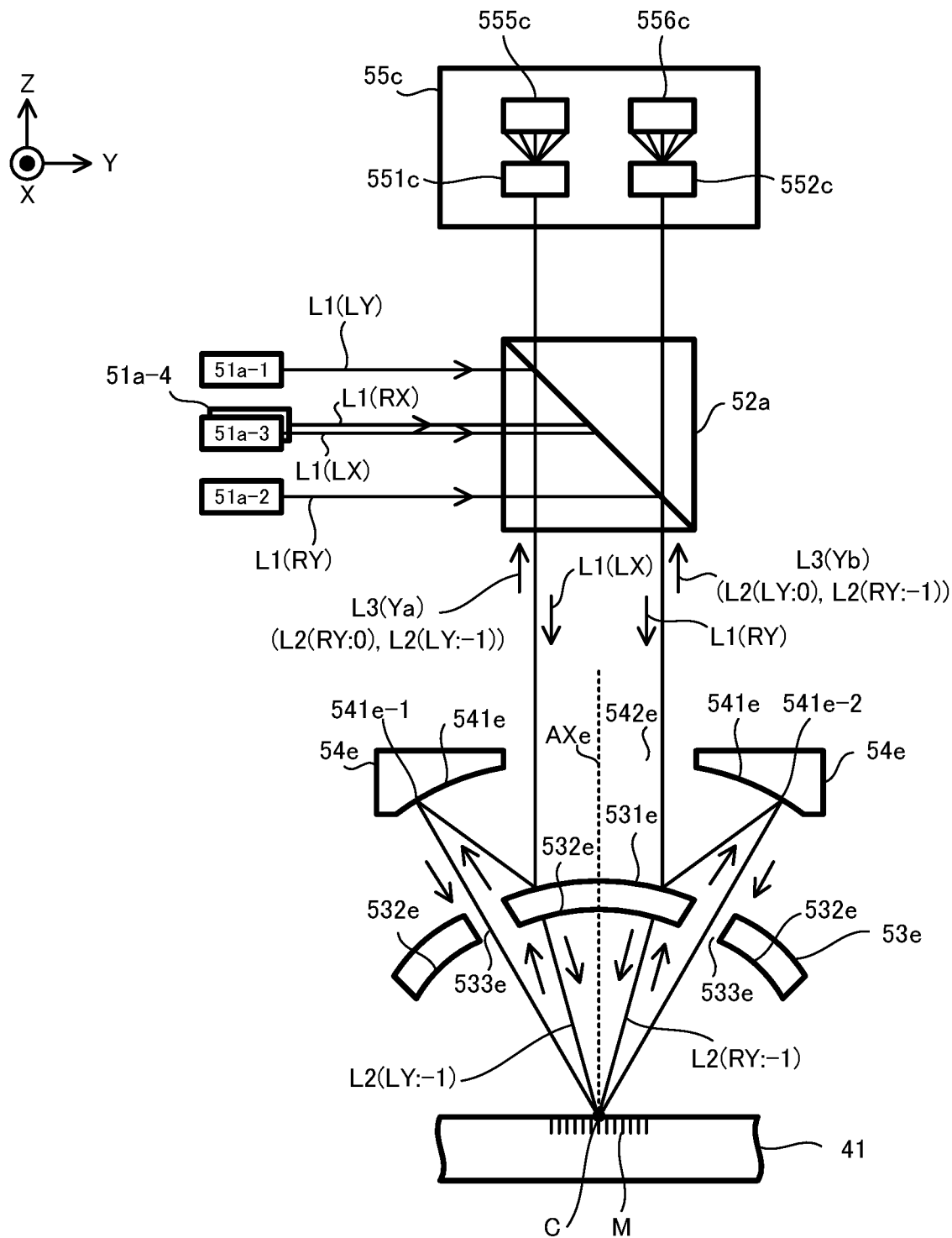
FIG. 12 is a structural view illustrating another one example of the structure of the alignment system in the fifth embodiment.
Figure 13:
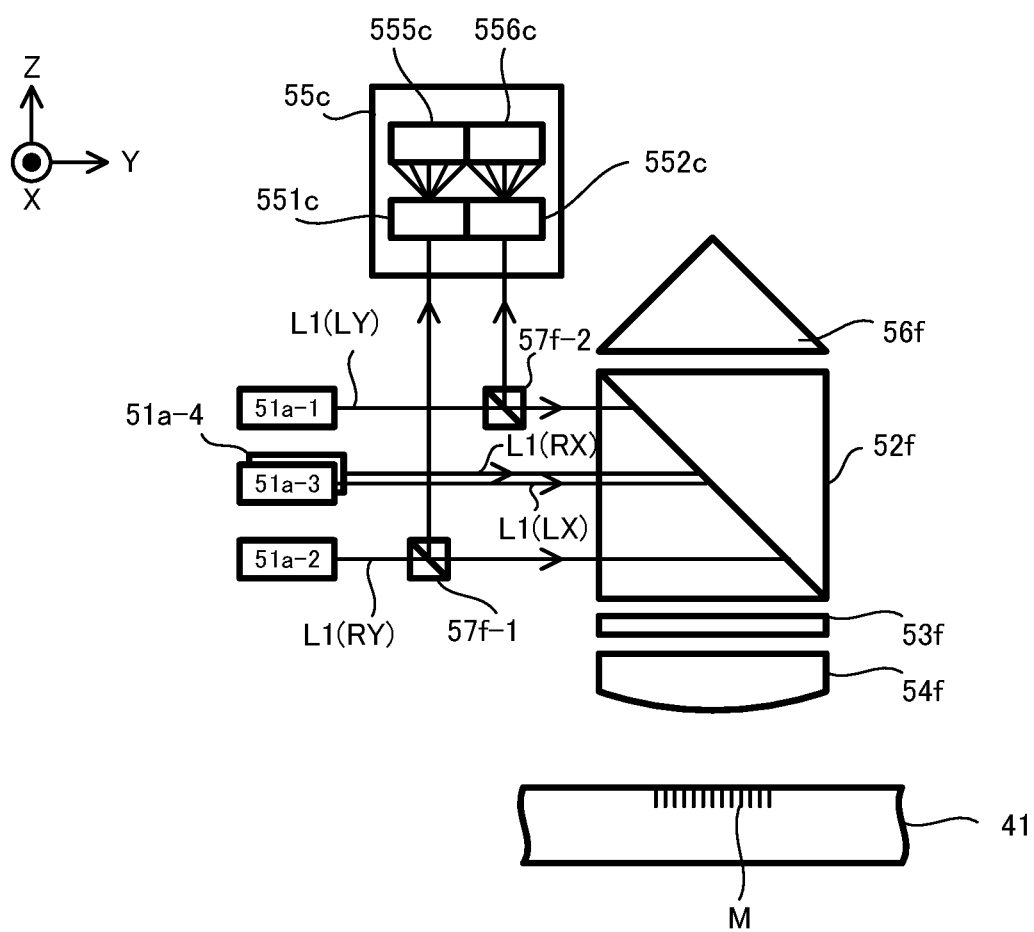
FIG. 13 is a structural view illustrating one example of a structure of an alignment system in a sixth embodiment.

Note that the reflective optical element 53e (the reflective surface 532e) may be provided with a plurality of apertures 533e in the fifth embodiment, as illustrated in FIG. 12. In this case, each of the first measurement light L1(LY) to the fourth measurement light L1(RX) is irradiated to the substrate 41 through at least one aperture 533e. Each of the interfering light L3(Ya) to the interfering light L3(Xb) enters the reflective optical element 54e through at least one aperture 533e.

Note that a reflective type of objective optical system or a reflective and refractive type of objective optical system may be used instead of the reflective optical element 54e and the reflective surface 531e in the fifth embodiment. This reflective type of objective optical system or the reflective and refractive type of objective optical system may be a center shield type of objective optical system. For example, the objective optical system disclosed in US2006/0158720A1, US2012/0140353A1 and U.S. Pat. No. 6,894,834B2 may be used as the objective optical system.

(2-6) Structure of Alignment System 5f in Sixth Embodiment

Next, with reference to FIG. 13 to FIG. 15B, the structure of an alignment system 5f in a sixth embodiment will be described. Note that the detailed description about a member that is same as the member that is already described in the first embodiment to the fifth embodiment will be omitted by assigning the same reference number to it.

As illustrated in FIG. 13 to FIG. 15B, the alignment system 5f is provided with the four light sources 51a (namely, the light source 51a-1, the light source 51a-2, the light source 51a-3 and the light source 51a-4), a polarization beam splitter 52f (an example of a first optical system), a quarter wave plate 53f, an objective lens 54f, a light receiver 55c, a corner cube 56f (an example of a second optical system) and four half mirrors 57f (namely, a half mirror 57f-1, a half mirror 57f-2, a half mirror 57f-3 and a half mirror 57f-4). Each of the light sources 51a-1 to 51a-4 may be same as the light source 51a in the first embodiment. Moreover, the measurement light L1 from the light source 51a in the first embodiment may be separated into four lights by an optical fiber and the four lights may be used instead of the measurement lights L1 from the light sources 51a-1 to 51a-4.

The first measurement light L1(LY) emitted by the light source 51a-1 enters the polarization beam splitter 52f after passing through the half mirror 57f-2. Thus, the half mirror 57f-2 is located on an optical path of the first measurement light L1(LY) between the light source 51a-1 and the polarization beam splitter 52f. The second measurement light L1(RY) emitted by the light source 51a-2 enters the polarization beam splitter 52f after passing through the half mirror 57f-1. Thus, the half mirror 57f-1 is located on an optical path of the second measurement light L1(RY) between the light source 51a-2 and the polarization beam splitter 52f. The third measurement light L1(LX) emitted by the light source 51a-2 enters the polarization beam splitter 52f after passing through the half mirror 57f-4. Thus, the half mirror 57f-4 is located on an optical path of the third measurement light L1(LX) between the light source 51a-3 and the polarization beam splitter 52f. The fourth measurement light L1(RX) emitted by the light source 51a-4 enters the polarization beam splitter 52f after passing through the half mirror 57f-3. Thus, the half mirror 57f-3 is located on an optical path of the fourth measurement light L1(RX) between the light source 51a-4 and the polarization beam splitter 52f.

The polarization beam splitter 52f reflects, toward the quarter wave plate 53f, A first polarized light (for example, s polarized light) of each of the first measurement light L1(LY) to the fourth measurement light L1(RX) emitted from the light sources 51a-1 to 51a-4, respectively. On the other hand, a second polarized light (for example, p polarized light) of each of the first measurement light L1(LY) to the fourth measurement light L1(RX) emitted from the light sources 51a-1 to 51a-4, respectively, passes through the polarization beam splitter 52f. Note that FIG. 13 omits detailed optical paths of the first measurement light L1(LY) to the fourth measurement light L1(RX), for the purpose of simple illustration. The detailed optical path of the first measurement light L1(LY) to the second measurement light L1(RY) are illustrated in FIG. 14. The detailed optical path of the third measurement light L1(LX) to the fourth measurement light L1(RX) are illustrated in FIG. 15. Note that the light sources 51a-1 to 51a-4 may emits the first measurement light L1(LY) to the fourth measurement light L1(RX) that are the s polarized lights to a polarization split surface of the polarization beam splitter 52f, respectively.

Each of the first measurement light L1(LY) to the fourth measurement light L1(RX) passes through the quarter wave plate 53f after being reflected by the polarization beam splitter 52f. The quarter wave plate 53f is located on optical paths of the first measurement light L1(LY) to the fourth measurement light L1(RX) from the polarization beam splitter 52f to the substrate 41 and between the polarization beam splitter 52f and the objective lens 54f. Each of the first measurement light L1(LY) to the fourth measurement light L1(RX) enters objective lens 54f after passing through the quarter wave plate 53f. The objective lens 54f is located on the optical paths of the first measurement light L1(LY) to the fourth measurement light L1(RX) from the polarization beam splitter 52f to the substrate 41 and between the quarter wave plate 53f and the substrate 41. The objective lens 54f refracts each of the first measurement light L1(LY) to the fourth measurement light L1(RX), as with the above described objective lens 53c. As a result, each of the first measurement light L1(LY) to the fourth measurement light L1(RX) enters the substrate 41 in an oblique direction. Here, angles between an optical axis of the objective lens 54f (eventually, an angle between an optical axis of the alignment system 5f) and the first measurement light L1(LY) to the fourth measurement light L1(RX) are different from one another. In this case, absolute values of the angles between the optical axis of the objective lens 54f and the first measurement light L1(LY) to the fourth measurement light L1(RX) may be same as one another or may be different from one another. Note that the objective lens 54f may be referred to as a deflecting optical system. Moreover, each of the first measurement light L1(LY) to the fourth measurement light L1(RX) enters the same position on the substrate 41. Thus, when the alignment mark M is located at a position to which the first measurement light L1(LY) to the fourth measurement light L1(RX) are irradiated, each of the first measurement light L1(LY) to the fourth measurement light L1(RX) is irradiated to the same alignment mark M.

Figure 14A:
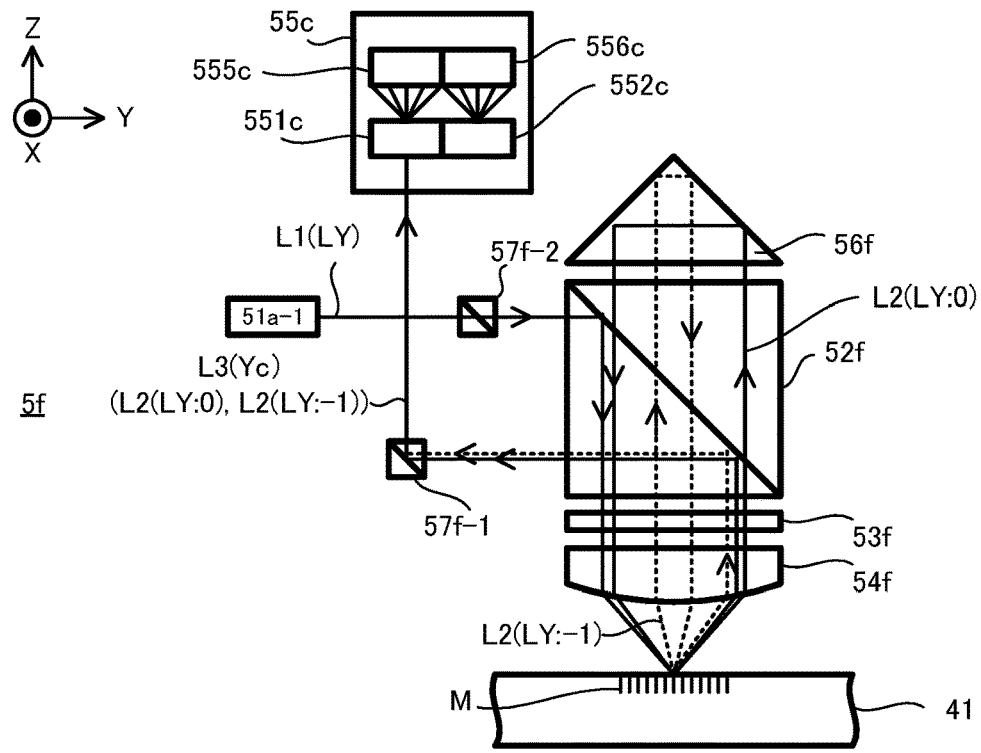
FIG. 14 Each of FIG. 14A
FIG. 14B is a structural view illustrating one example of the structure of the alignment system in the sixth embodiment.

As illustrated in FIG. 14A, the zeroth-order reflected light L2(LY:0) and the –first-order diffracted light L2(LY:−1) are emitted from the alignment mark M to which the first measurement light L1(LY) is irradiated.

The zeroth-order reflected light L2(LY:0) from the alignment mark M enters the polarization beam splitter 52f after passing through the objective lens 54f and the quarter wave plate 53f. The zeroth-order reflected light L2(LY:0) entering the polarization beam splitter 52f is the linear polarization light and the second polarization light due to the measurement light L1(LY) passing through the quarter wave plate 53f, the measurement light L1(LY) being reflected by the substrate 41 and the zeroth-order reflected light L2(LY:0) passing through the quarter wave plate 53f. Thus, the zeroth-order reflected light L2(LY:0) entering the polarization beam splitter 52f passes through the polarization beam splitter 52f.

The zeroth-order reflected light L2(LY:0) enters the corner cube 56f that is located at an opposite side of the polarization beam splitter 52f from the substrate 41 after passing through the polarization beam splitter 52f. The zeroth-order reflected light L2(LY:0) is retro-reflected by three reflective surfaces of the corner cube 56f after entering the corner cube 56f. The zeroth-order reflected light L2(LY:0) is irradiated to the substrate 41 through the polarization beam splitter 52f, the quarter wave plate 53f and the objective lens 54f after being retro-reflected by the corner cube 56f (an example of a second optical system). Here, a traveling direction of the zeroth-order reflected light L2(LY:0) retro-reflected by the corner cube 56f is opposite to a traveling direction of the zeroth-order reflected light L2(LY:0) entering the corner cube 56f. In other words, an optical path of the zeroth-order reflected light L2(LY:0) retro-reflected by the corner cube 56f is parallel with an optical path of the zeroth-order reflected light L2(LY:0) entering the corner cube 56f. This corner cube 56f may be referred to as a returning optical system. Note that a imperfection corner cube may be used instead of the corner cube 56f. In this case, the optical path of the zeroth-order reflected light L2(LY:0) reflected by the imperfection corner cube is not parallel with an optical path of the zeroth-order reflected light L2(LY:0) entering the imperfection corner cube. This imperfection corner cube may be generated by providing an optical wedge prism at least one of an incidence surface and an emitting surface of the corner cube 56f.

In the sixth embodiment, an optical path of the reflected light from the alignment mark M to which the first measurement light L1(LY) is irradiated (in an example illustrated in FIG. 14A, the optical path of the zeroth-order reflected light L2(LY:0) traveling from the substrate 41 to the corner cube 56f) and the optical path of this reflected light traveling to the alignment mark M again (in an example illustrated in FIG. 14A, the optical path of the zeroth-order reflected light L2(LY:0) traveling from the corner cube 56f to the substrate 41) are symmetric with respect to the optical axis of the objective lens 54f at an emitting side of the objective lens 54, in other words, at an alignment mark M side of the alignment system 5f. By this, the alignment operation is performable even when the pitch of the alignment mark M is varied from a predetermined pitch. Same applies to the reflected light of the below described second measurement light L1(RY), the third measurement light L1(LX) and the fourth measurement light L1(RX).

In the sixth embodiment, the zeroth-order reflected light L2(LY:0) from the corner cube 56f is irradiated to a position from which the zeroth-order reflected light L2(LY:0) is emitted to the corner cube 56f. In other words, the polarization beam splitter 52f, the quarter wave plate 53f, the objective lens 54f and the corner cube 56f are arranged so that the zeroth-order reflected light L2(LY:0) reflected by the corner cube 56f is irradiated to a position from which the zeroth-order reflected light L2(LY:0) is emitted. Note that the zeroth-order reflected light L2(LY:0) from the corner cube 56f may be irradiated to a position that is different from the position from which the zeroth-order reflected light L2(LY:0) is emitted to the corner cube 56f. For example, a region to which the zeroth-order reflected light L2(LY:0) from the corner cube 56f is irradiated may be partially overlapped with a region from which the zeroth-order reflected light L2(LY:0) is emitted to the corner cube 56f.

When the zeroth-order reflected light L2(LY:0) reflected by the corner cube 56f is irradiated to a position from which the zeroth-order reflected light L2(LY:0) is emitted, the plurality of light components are irradiated to the same position on the substrate 41 even when the zeroth-order reflected light L2(LY:0) includes the plurality of light components that have different wavelengths, respectively. Namely, even when the plurality of light components included in the zeroth-order reflected light L2(LY:0) emit from the substrate at different emitting angles, the plurality of light components are irradiated to the same position on the substrate 41 through the corner cube 56f.

When the zeroth-order reflected light L2(LY:0) is reflected by the substrate 41 again after being reflected by the corner cube 56f, the zeroth-order reflected light L2(LY:0) enters the polarization beam splitter 52f after passing through the objective lens and the quarter wave plate 53f. The zeroth-order reflected light L2(LY:0) entering the polarization beam splitter 52f is the linear polarization light and the first polarization light due to the zeroth-order reflected light L2(LY:0) passing through the quarter wave plate 53f twice and the zeroth-order reflected light L2(LY:0) being reflected by the substrate 41. Thus, the zeroth-order reflected light L2(LY:0) entering the polarization beam splitter 52f is reflected by the polarization beam splitter 52f. The zeroth-order reflected light L2(LY:0) is reflected by the half mirror 57f-1 after being reflected by the polarization beam splitter 52f. The zeroth-order reflected light L2(LY:0) enters the light receiver 55c (especially, the spectroscope 551c) after being reflected by the half mirror 57f-1.

On the other hand, −first-order diffracted light L2(LY:−1) also passes through the objective lens 54f, the quarter wave plate 53f and the polarization beam splitter 52f, then, is retro-reflected by the corner cube 56f, then, passes through the polarization beam splitter 52f, the quarter wave plate 53f and the objective lens 54f, then, is diffracted by the substrate 41, then, passes through the objective lens 54f and the quarter wave plate 53f, then, is reflected by the polarization beam splitter 52f, then, is reflected by the half mirror 57f-1, and then, enters the light receiver 55c (especially, the spectroscope 551c), as with the zeroth-order reflected light L2(LY:0). Regarding the −first-order diffracted light L2(LY:−1), an optical path of the diffracted light from the alignment mark M to which the first measurement light L1(LY) is irradiated (in an example illustrated in FIG. 14A, the optical path of the −first-order diffracted light L2(LY:−1) traveling from the substrate 41 to the corner cube 56f) and the optical path of this diffracted light traveling to the alignment mark M again (in an example illustrated in FIG. 14A, the optical path of the −first-order diffracted light L2(LY:−1) traveling from the corner cube 56f to the substrate 41) are symmetric with respect to the optical axis of the objective lens 54f at the emitting side of the objective lens 54, in other words, at the alignment mark M side of the alignment system 5f, as with the zeroth-order reflected light L2(LY:0). By this, the alignment operation is performable even when the pitch of the alignment mark M is varied from a predetermined pitch. Same applies to the reflected light of the below described second measurement light L1(RY), the third measurement light L1(LX) and the fourth measurement light L1(RX).

Here, when the first measurement light L1(LY) includes the plurality of light components that have different wavelengths, respectively, the diffraction angle of the −first-order diffracted light L2(LY:−1) varies depending on the wavelength of the light component. However, the −first-order diffracted light L2(LY:−1) enters the alignment mark M again at a different incident angle based on the wavelength through the objective lens 54f after being diffracted by the alignment mark M and then retro-reflected by the corner cube 56f. Then, the −first-order diffracted light L2(LY:−1) is diffracted by the alignment mark M again and then travel in the same traveling direction regardless of the wavelength after entering the alignment mark M again. Therefore, the corner cube 56f is allowed to serve as the above described reflective optical element 53a (alternatively, the reflective optical element 54c or 53e) with the objective lens 54f.

An interfering light L3(Yc) generated by the interference between the zeroth-order reflected light L2(LY:0) and the −first-order diffracted light L2(LY:−1) enters the light receiver 55c (especially, the spectroscope 551c). The spectroscope 551c disperses the interfering light L3(Yc). The interfering light L3(Yc) enters the light receiving surface of the light receiving element 555c after being dispersed by the spectroscope 551c. Thus, the plurality of light components included in the interfering light L3(Yc) are optically receivable by the light receiving element 555c simultaneously. The light receiving result of the light receiving element 555c is outputted to the control apparatus 6 as the mark detection information (hereinafter, it is referred to as a "mark detection information #Yc").

Figure 14B:
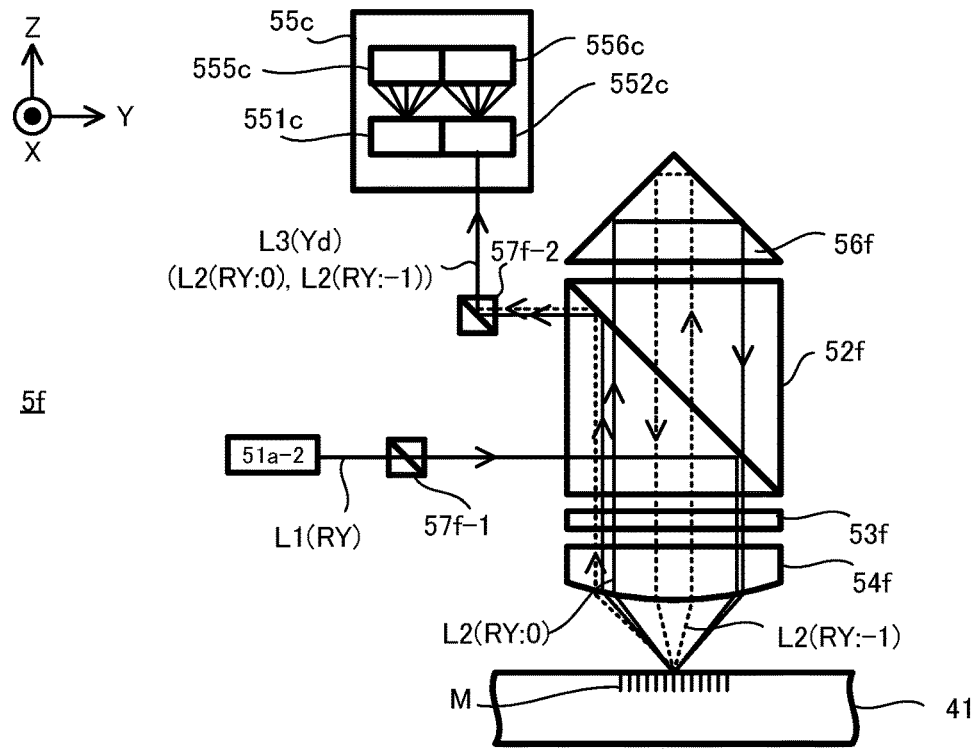

As illustrated in FIG. 14B, the zeroth-order reflected light L2(RY:0) and the −first-order diffracted light L2(RY:−1) are emitted from the alignment mark M to which the second measurement light L1(RY) is irradiated.

The zeroth-order reflected light L2(RY:0) passes through the objective lens 54f, the quarter wave plate 53f and the polarization beam splitter 52f, then, is retro-reflected by the corner cube 56f, then, passes through the polarization beam splitter 52f, the quarter wave plate 53f and the objective lens 54f, then, is reflected by the substrate 41, then, passes through the objective lens 54f and the quarter wave plate 53f, then, is reflected by the polarization beam splitter 52f, then, is reflected by the half mirror 57f-2, and then, enters the light receiver 55c (especially, the spectroscope 552c), as with the zeroth-order reflected light L2(LY:0).

The −first-order diffracted light L2(RY:−1) also passes through the objective lens 54f, the quarter wave plate 53f and the polarization beam splitter 52f, then, is retro-reflected by the corner cube 56f, then, passes through the polarization beam splitter 52f, the quarter wave plate 53f and the objective lens 54f, then, is diffracted by the substrate 41, then, passes through the objective lens 54f and the quarter wave plate 53f, then, is reflected by the polarization beam splitter 52f, then, is reflected by the half mirror 57f-2, and then, enters the light receiver 55c (especially, the spectroscope 552c), as with the zeroth-order reflected light L2(LY:0).

Thus, an interfering light L3(Yd) generated by the interference between the zeroth-order reflected light L2(RY:0) and the −first-order diffracted light L2(RY:−1) enters the light receiver 55c (especially, the spectroscope 552c). The spectroscope 552c disperses the interfering light L3(Yd). The interfering light L3(Yd) enters the light receiving surface of the light receiving element 556c after being dispersed by the spectroscope 552c. Thus, the plurality of light components included in the interfering light L3(Yd) are optically receivable by the light receiving element 556c simultaneously. The light receiving result of the light receiving element 556c is outputted to the control apparatus 6 as the mark detection information (hereinafter, it is referred to as a "mark detection information #Yd").

Figure 15A:
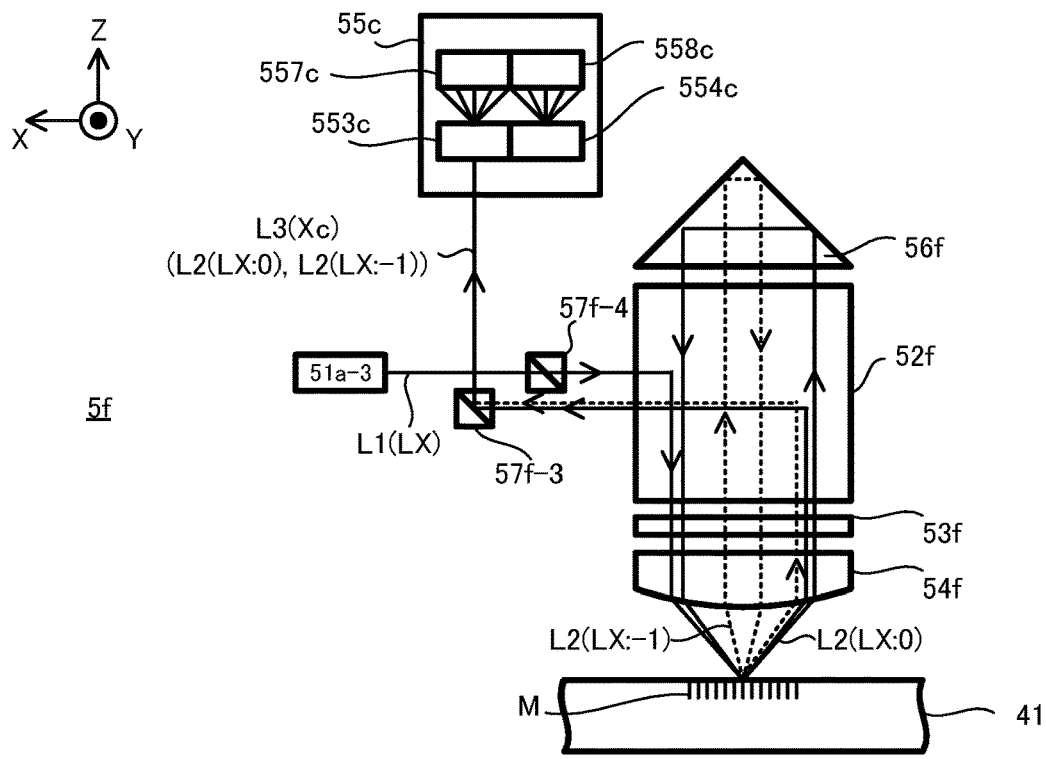
FIG. 15 Each of FIG. 15A
FIG. 15B is a structural view illustrating one example of the structure of the alignment system in the sixth embodiment.

As illustrated in FIG. 15A, the zeroth-order reflected light L2(LX:0) and the −first-order diffracted light L2(LX:−1) are emitted from the alignment mark M to which the third measurement light L1(LX) is irradiated.

The zeroth-order reflected light L2(LX:0) passes through the objective lens 54f, the quarter wave plate 53f and the polarization beam splitter 52f, then, is retro-reflected by the corner cube 56f, then, passes through the polarization beam splitter 52f, the quarter wave plate 53f and the objective lens 54f, then, is reflected by the substrate 41, then, passes through the objective lens 54f and the quarter wave plate 53f, then, is reflected by the polarization beam splitter 52f, then, is reflected by the half mirror 57f-3, and then, enters the light receiver 55c (especially, the spectroscope 553c), as with the zeroth-order reflected light L2(LY:0).

The −first-order diffracted light L2(LX:−1) also passes through the objective lens 54f, the quarter wave plate 53f and the polarization beam splitter 52f, then, is retro-reflected by the corner cube 56f, then, passes through the polarization beam splitter 52f, the quarter wave plate 53f and the objective lens 54f, then, is reflected or diffracted by the substrate 41, then, passes through the objective lens 54f and the quarter wave plate 53f, then, is reflected by the polarization beam splitter 52f, then, is reflected by the half mirror 57f-3, and then, enters the light receiver 55c (especially, the spectroscope 553c), as with the zeroth-order reflected light L2(LY:0).

Thus, an interfering light L3(Xc) generated by the interference between the zeroth-order reflected light L2(LX:0) and the −first-order diffracted light L2(LX:−1) enters the light receiver 55c (especially, the spectroscope 553c). The spectroscope 553c disperses the interfering light L3(Xc). The interfering light L3(Xc) enters the light receiving surface of the light receiving element 557c after being dispersed by the spectroscope 553c. Thus, the plurality of light components included in the interfering light L3(Xc) are optically receivable by the light receiving element 557c simultaneously. The light receiving result of the light receiving element 557c is outputted to the control apparatus 6 as the mark detection information (hereinafter, it is referred to as a "mark detection information #Xc").

Figure 15B:
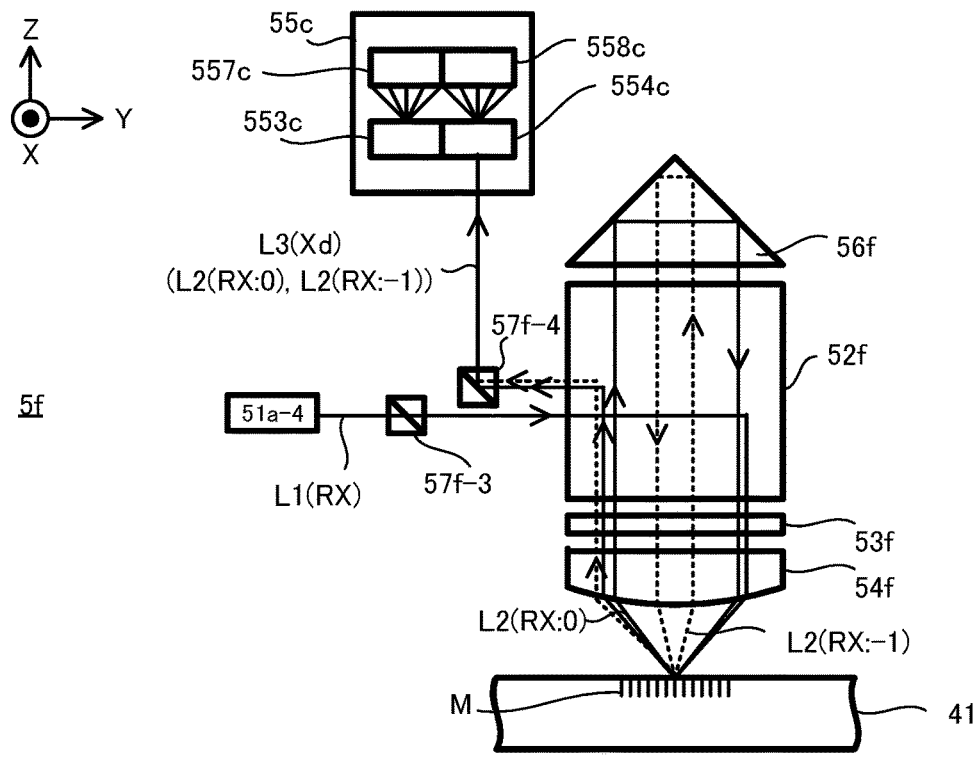

As illustrated in FIG. 15B, the zeroth-order reflected light L2(RX:0) and the −first-order diffracted light L2(RX:−1) are emitted from the alignment mark M to which the fourth measurement light L1(RX) is irradiated.

The zeroth-order reflected light L2(RX:0) passes through the objective lens 54f, the quarter wave plate 53f and the polarization beam splitter 52f, then, is retro-reflected by the corner cube 56f, then, passes through the polarization beam splitter 52f, the quarter wave plate 53f and the objective lens 54f, then, is reflected by the substrate 41, then, passes through the objective lens 54f and the quarter wave plate 53f, then, is reflected by the polarization beam splitter 52f, then, is reflected by the half mirror 57f-4, and then, enters the light receiver 55c (especially, the spectroscope 554c), as with the zeroth-order reflected light L2(LY:0).

The −first-order diffracted light L2(RX:−1) also passes through the objective lens 54f, the quarter wave plate 53f and the polarization beam splitter 52f, then, is retro-reflected by the corner cube 56f, then, passes through the polarization beam splitter 52f, the quarter wave plate 53f and the objective lens 54f, then, is reflected or diffracted by the substrate 41, then, passes through the objective lens 54f and the quarter wave plate 53f, then, is reflected by the polarization beam splitter 52f, then, is reflected by the half mirror 57f-4, and then, enters the light receiver 55c (especially, the spectroscope 554c), as with the zeroth-order reflected light L2(LY:0).

Thus, an interfering light L3(Xd) generated by the interference between the zeroth-order reflected light L2(RX:0) and the −first-order diffracted light L2(RX:−1) enters the light receiver 55c (especially, the spectroscope 554c). The spectroscope 554c disperses the interfering light L3(Xd). The interfering light L3(Xd) enters the light receiving surface of the light receiving element 558c after being dispersed by the spectroscope 554c. Thus, the plurality of light components included in the interfering light L3(Xd) are optically receivable by the light receiving element 558c simultaneously. The light receiving result of the light receiving element 558c is outputted to the control apparatus 6 as the mark detection information (hereinafter, it is referred to as a "mark detection information #Xd").

As a result, the control apparatus 6 is capable of performing the alignment operation by using the four mark detection information outputted from the alignment system 5f. Specifically, the control apparatus 6 is capable of obtaining the mark position information #Y that represents the position of the alignment mark M (the grid mark MY) along the Y axis direction by using the mark detection information #Yc and #Yd. Similarly, the control apparatus 6 is capable of obtaining the mark position information #X that represents the position of the alignment mark M (the grid mark MX) along the X axis direction by using the mark detection information #Xc and #Xd. Moreover, the control apparatus 6 is capable of changing at least one of the mark detection information #Yc and #Yd on the basis of the mark detection information #Yc and #Yd. Moreover, the control apparatus 6 is capable of changing at least one of the mark detection information #Xc and #Xd on the basis of the mark detection information #Xc and #Xd.

In the sixth embodiment, the control apparatus 6 may measure the asymmetricity of the shape of the mark by using the four mark detection information outputted from the alignment system 5f. Note that the angles between the optical axis and the first measurement light L1(LY) to the fourth measurement light L1(RX) may be different from one another when the asymmetricity of the shape of the mark is measured. It is possible to correct the mark position information which represents the position of the alignment mark M by using a measured result of the asymmetricity of the shape of the mark.

The above described alignment system 5f in the sixth embodiment is appropriately capable of achieving an effect that is same as the effect achieved by the alignment system 5c in the third embodiment. In addition, a difference in the optical path between the zeroth-order reflected light L2 and the −first-order diffracted light L2 is relatively small in the sixth embodiment, compared to the above described first embodiment to the fifth embodiment, because the zeroth-order reflected light L2 and the −first-order diffracted light L2 travel back and forth between the substrate 41 and the corner cube 56f. thus, the alignment system 5f in the sixth embodiment is capable of performing the alignment operation appropriately even when a coherent length of the measurement light L1 is relatively short.

(2-7) Structure of Alignment System 5g in Seventh Embodiment

Next, with reference to FIG. 16, the structure of an alignment system 5g in a seventh embodiment will be described. Note that the detailed description about a member that is same as the member that is already described in the first embodiment to the sixth embodiment will be omitted by assigning the same reference number to it.

The above described alignment system 5a in the first embodiment returns, to the same position (the same alignment mark M) on the substrate 41, the ±first-order diffracted lights L2(±1) from the alignment mark M Same applies to the second embodiment to the sixth embodiment. On the other hand, the alignment system 5g in the seventh embodiment does not return, to the substrate 41, the ±first-order diffracted lights L2(±1) from the alignment mark M.

Figure 16:
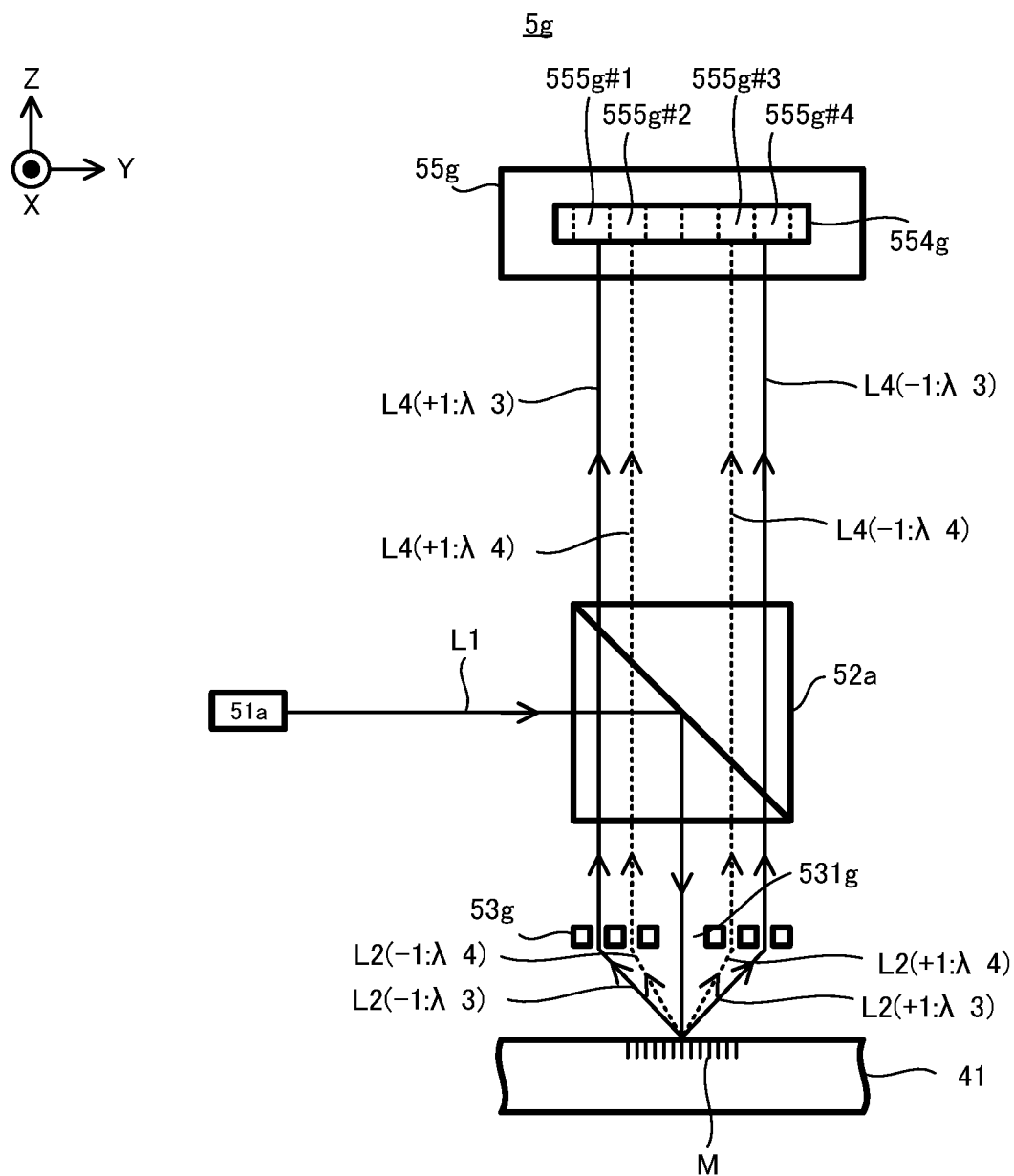
FIG. 16 is a structural view illustrating one example of a structure of an alignment system in a seventh embodiment.

As illustrated in FIG. 16, the alignment system 5g is provided with the light source 51a, the half mirror 52a, a diffracting grating 53g and a light receiver 55g. The measurement light L1 emitted by the light source 51a is reflected by the half mirror 52a. The measurement light L1 passes through an aperture 531g formed at the diffracting grating 53g after being reflected by the half mirror 52a. Thus, the diffracting grating 53g is located between the half mirror 52a and the substrate 41 so that the aperture 531g is located on an optical path of the measurement light L1 from the half mirror 52a to the substrate 41. The measurement light L1 vertically enters the surface of the substrate 41 after passing through the aperture 531g. Thus, when the alignment mark M is under the aperture 531g, the ±first-order diffracted lights L2(±1) of the measurement light L1 are emitted from the alignment mark M.

Here, as described above, the measurement light L1 includes the plurality of laser lights that have different wavelengths, respectively. Thus, the ±first-order diffracted lights L2(±1) of each of the plurality of laser lights are emitted from the alignment mark M. FIG. 16 illustrates an example in which the ±first-order diffracted lights L2(±1:λ3) corresponding to the laser light having a wavelength λ3 and the ±first-order diffracted lights L2(±1:λ4) corresponding to the laser light having a wavelength λ4 (λ4≠λ3). In the example illustrated in FIG. 16, a diffraction angle of ±first-order diffracted lights L2(±1:λ3) from the substrate 41 is larger than a diffraction angle of ±first-order diffracted lights L2(±1:λ4) from the substrate 41.

The plurality of ±first-order diffracted lights L2(±1) enters the diffracting grating 53g. The diffracting grating 53g includes a grid formed to align along a first direction (for example, the Y axis direction) at a desired pitch ΛY and a grid formed to align along a second direction (for example, the X axis direction) at a desired pitch ΛX. Namely, the diffracting grating 53g includes the grid whose pitch is same as the pitch ΛY of the grind mark MY and the grid whose pitch is same as the pitch ΛX of the grind mark MX.

A diffraction angle at the diffracting grating 53g of the ±first-order diffracted lights L2(±1: λ3) diffracted at the relatively large diffraction angle is larger than a diffraction angle at the diffracting grating 53g of the ±first-order diffracted lights L2(±1: λ4) diffracted at the relatively small diffraction angle. Thus, a −first-order diffracted light L4(−1: λ3) of the +first-order diffracted light L2(+1: λ3) and a +first-order diffracted light L4(+1: λ3) of the −first-order diffracted light L2(−1: λ3) are emitted from the diffracting grating 53g. Moreover, a −first-order diffracted light L4(−1: λ4) of the +first-order diffracted light L2(+1: λ4) and a +first-order diffracted light L4(+1: λ4) of the −first-order diffracted light L2(−1: λ4) are emitted from the diffracting grating 53g.

The ±first-order diffracted lights L4(±1: λ3) and the ±first-order diffracted lights L4(±1: λ4) are emitted from the diffracting grating 53g to travel a plurality of optical paths that are different from one another and that are parallel with one another, respectively. The ±first-order diffracted lights L4(±1: λ3) and the ±first-order diffracted lights L4(±1: λ4) pass through the half mirror 52a. As a result, The ±first-order diffracted lights L4(±1: λ3) and the ±first-order diffracted lights L4(±1: λ4) enter the light receiver 55g.

The light receiver 55g is provided with a light receiving element 554g. The structure of a light receiving surface of the light receiving element 554g is same as the structure of the above described first light receiving surface 555a. Namely, the light receiving surface of the light receiving element 554g is divided into a plurality of light receiving areas 555g for optically receiving the plurality of diffracted lights L4 traveling from the diffracting grating 53g to the light receiver 55g, respectively. For example, the light receiving surface of the light receiving element 554g is divided into the light receiving area 555g#1 for optically receiving the +first-order diffracted light L4(+1: λ3), the light receiving area 555g#2 for optically receiving the +first-order diffracted light L4(+1: λ4), the light receiving area 555g#3 for optically receiving the −first-order diffracted light L4(−1: λ3) and the light receiving area 555g#4 for optically receiving the −first-order diffracted light L4(−1: λ4). Thus, even when the measurement L1 includes the plurality of light components that have different wavelengths, respectively, the plurality of light components are optically receivable by the light receiving element 554g simultaneously. A light receiving result of the light receiving element 554g is outputted to the control apparatus 6 as the mark detection information.

The above described alignment system 5g in the seventh embodiment is appropriately capable of obtaining the mark detection information that is the detected result of the alignment mark M. As a result, the control apparatus 6 is capable of appropriately performing the alignment operation on the basis of the mark detection information.

Moreover, in the seventh embodiment, the diffracting grating 53g includes the grid whose pitch is same as the pitch ΛY of the grind mark MY and the grid whose pitch is same as the pitch ΛX of the grind mark MX. Thus, the ±first-order diffracted lights L4(±1: λ3) and the ±first-order diffracted lights L4(±1: λ4) are emitted from the diffracting grating 53g to travel the plurality of optical paths that are different from one another and that are parallel with one another, respectively. Thus, even when the measurement light L1 includes the plurality of laser lights that have different wavelengths, respectively, the plurality of ±first-order diffracted lights L4(±1) corresponding to the plurality of wavelengths, respectively, are optically receivable by the light receiver 55g. Thus, it is possible to obtain more accurate mark detection information, compared to the case where the mark detection information is obtained by using the measurement light L1 having single wavelength. Alternatively, a time required to obtain the mark detection information is reduced, compared to the case where the mark detection information is obtained by emitting the plurality of measurement lights L1 that have different wavelengths, respectively, in order.

Note that a quarter wave plate may be provided between the diffracting grating 53g and the substrate 41. In this case, the measurement light 11 and the ±first-order diffracted lights L2 pass through the quarter wave plate. In this case, the half mirror 52a may be replaced by the polarization beam splitter and the measurement light L1 reflected by a polarization split surface of the polarization beam splitter may be set to the s polarized light to the polarization split surface.

Figure 17:
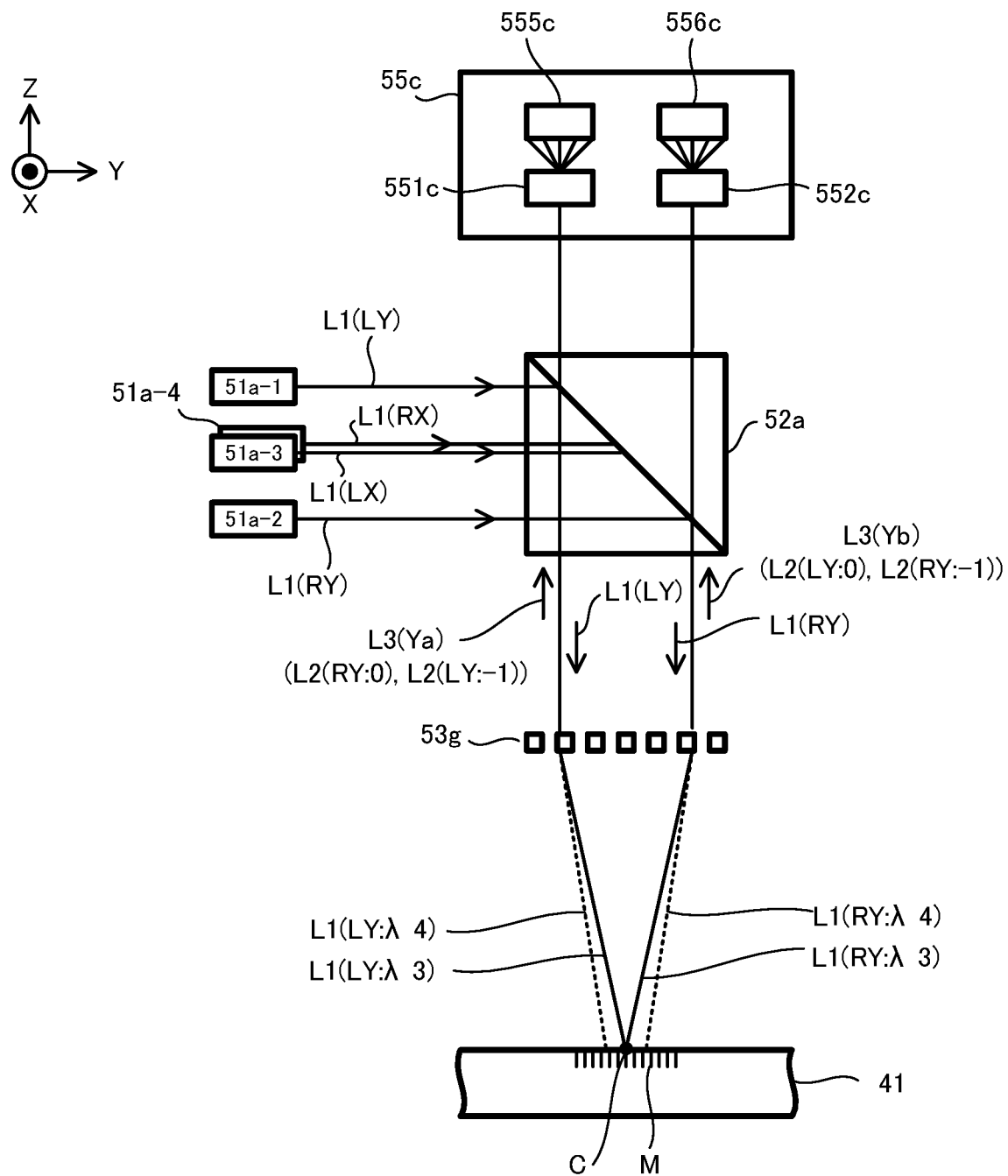
FIG. 17 is a structural view illustrating another one example of the structure of the alignment system in the seventh embodiment.

Moreover, in the seventh embodiment, as illustrated in FIG. 17, the measurement light may enter the substrate 41 in an oblique direction. Note that the detailed description about a member that is same as the member that is already described in the above described embodiments will be omitted by assigning the same reference number to it.

As illustrated in FIG. 17, the alignment system 5h is provided with the light sources 51a-1 to 51a-4 that are same as the third embodiment. The measurement light L1(LY) from the light source 51a-1 is reflected by the half mirror 52a, then is diffracted by the diffracting grating 53g, and then reaches the alignment mark M. And, the measurement light L1(RY) from the light source 51a-2 is reflected by the half mirror 52a, then is diffracted by the diffracting grating 53g, and then reaches the alignment mark M. The measurement light L1(LX) from the light source 51a-3 and the measurement light L1(RX) from the light source 51a-4 are diffracted by the diffracting grating 53g, and then reach the alignment mark M, although FIG. 17 does not illustrates it.

The measurement light reflected by the substrate 41 and the measurement light diffracted by the alignment mark on the substrate 41 are diffracted by the diffracting grating 53g and then enter the light receiver 55c through the half mirror 52a.

Here, since the pitch of the diffracting grating 53g is same as the pitch of the alignment mark M, even when the measurement L1 includes the plurality of laser lights that have different wavelengths, respectively, the plurality of ±first-order diffracted lights corresponding to the plurality of wavelengths, respectively, are optically receivable by the light receiver 55c. Thus, it is possible to obtain more accurate mark detection information, compared to the case where the mark detection information is obtained by using the measurement light L1 having single wavelength. Alternatively, a time required to obtain the mark detection information is reduced, compared to the case where the mark detection information is obtained by emitting the plurality of measurement lights L1 that have different wavelengths, respectively, in order.

Note that the structure of the above described exposure apparatus EX (for example, a shape, a located position, a size, a function and the like of each member (alternatively, each apparatus) that constitutes the exposure apparatus EX) is merely one example. Therefore, at least one part of the structure of the exposure apparatus EX may be modified as occasion may demand. One part of the modified example will be described below.

The measurement light L1 may not be the visible light. The measurement light L1 may not be the laser light. The measurement light L1 may be any light. The light emitting element 511a may not include the LD element. The light emitting element 511a may include a LED (Light Emitting Diode) element. The light emitting element 511a may be a white light source for generating a wideband light. The light emitting element 511a may be a combination of the white light source and a bandpass filter or a notch filter.

The difference in the wavelength between the plurality of laser lights emitted from the plurality of light emitting element 511a, respectively, may not be at least 100 nm. For example, the difference in the wavelength may be at least 50 nm.

The measurement light L1 may be a light having single wavelength. In this case, the light source 51a may not be provided with the multiplexer 512a. Moreover, the light source 51a may be provided with single light emitting element 511a. Alternatively, when the light source 51a is provided with the plurality of light emitting elements 511a, the plurality of light emitting elements 511a may emit the laser light in order so as not to emit the laser lights simultaneously.

The half mirror 52a may be an amplitude division type beam splitter for example, a polarized light independence beam splitter, a pellicle beam splitter and the like). A division ratio of the amplitude division type beam splitter may not be 1:1. A shape of the beam splitter may be cube-like shape or a plate-like shape.

The spectroscope 551a may be a dichroic mirror. For example, the optical path may be divided by the plurality of dichroic mirrors for each wavelength, and the light receiving element 554*a* may be provided to each divided optical path.

In the first and second embodiment, ±Kth-order diffracted lights L2(±K) (wherein, K is an integer equal to or larger than 2) may be emitted from the alignment mark M, in addition to or instead of the ±first-order diffracted lights L2(±1). When the ±Kth-order diffracted lights L2(±K) are emitted toward a direction along which the ±Kth-order diffracted lights L2(±K) are allowed to reach the reflective surface 531*a*, the reflective surface 531*a* may reflect the ±Kth-order diffracted lights L2(±K). As a result, the light receiver 55*a* may detect an interfering light L3 that is generated by an interference between the ±first-order diffracted lights L2(±1) and the ±Kth-order diffracted lights L2(±K). Alternatively, the ±Kth-order diffracted lights L2(±K) may be emitted toward the direction along which the ±Kth-order diffracted lights L2(±K) are allowed to reach the reflective surface 531*a*, and the ±first-order diffracted lights L2(±1) may not be emitted toward a direction along which the ±first-order diffracted lights L2(±1) are allowed to reach the reflective surface 531*a*. As a result, the light receiver 55*a* may detect an interfering light L3 that is generated by an interference between the ±Kth-order diffracted lights L2(±K). Same applies to the third embodiment to the sixth embodiment. Namely, in the third embodiment to the sixth embodiment, ±Kth-order diffracted lights L2(±K) of at least one of the first measurement light L1(LY) to the fourth measurement light L1(RX) may be emitted from the alignment mark M. Moreover, +first-order diffracted lights L2(+1) of at least one of the first measurement light L1(LY) to the fourth measurement light L1(RX) may be emitted from the alignment mark M.

In the seventh embodiment, the ±Kth-order diffracted lights L2(±K) may be emitted from the alignment mark M, in addition to or instead of the ±first-order diffracted lights L2(±1). Moreover, the −Kth-order diffracted lights L4(−K) of the +first-order diffracted light L2(+1) may be emitted from the diffracting grating 53*g*. The +Kth-order diffracted lights L4(+K) of the −first-order diffracted light L2(−1) may be emitted from the diffracting grating 53*g*. The −first-order diffracted lights L4(−1) of the +Kth-order diffracted lights L2(+K) may be emitted from the diffracting grating 53*g*. The −K'th-order diffracted lights L4(−K') (wherein, K' is an integer equal to or larger than 2) of the +Kth-order diffracted lights L2(+K) may be emitted from the diffracting grating 53*g*. The +first-order diffracted lights L4(+1) of the −Kth-order diffracted lights L2(−K) may be emitted from the diffracting grating 53*g*. The +K'th-order diffracted lights L4(+K') of the −Kth-order diffracted lights L2(−K) may be emitted from the diffracting grating 53*g*.

In the seventh embodiment, the diffracting grating 53*g* may include the grating whose pitch is different from the pitch ΛY of the grind mark MY. The diffracting grating 53*g* may include the grating whose pitch is different from the pitch ΛX of the grind mark MX. In this case, although the ±first-order diffracted lights L4(±1: λ3) and the ±first-order diffracted lights L4(±1: λ4) are emitted from the diffracting grating 53*g* to travel the plurality of optical paths that are different from one another and that are not parallel with one another, respectively, the fact remains that the alignment system 5*g* is capable of obtaining the mark detection information as long as the ±first-order diffracted lights L4(±1: λ3) and the ±first-order diffracted lights L4(±1: λ4) are optically receivable by the light receiver 55*g*.

In the first and second embodiments, the control apparatus 6 may not perform the scatterometry measurement. In this case, the control apparatus 6 may not obtain the second mark detection information. Namely, the control apparatus 6 may not control the stage driving system 41 so that the center C is not located at the intersection point of the surface of the substrate 41 and the optical axis AXa. Also in the third embodiment, the control apparatus 6 may not perform the scatterometry measurement. In this case, the alignment system 5*c* may not be provided with either one of the spectroscopes 551*c* and 552*c* and either one of the light receiving elements 555*c* and 556*c*. Moreover, the alignment system 5*c* may not be provided with either one of the spectroscopes 553*c* and 554*c* and either one of the light receiving elements 557*c* and 558*c*. Same applies to the forth embodiment to the sixth embodiment.

In the third and fourth embodiments, at least one of the aperture 524*c*-1 to 524*c*-4 may be unified. In the third embodiment, the objective lens 53*c* may be located between the substrate and the reflective optical element 54*c*. In the fourth embodiment, at least one of the reflective mirror 53*d*-1 to the reflective mirror 53*d*-4 may be located between the substrate 41 and the reflective optical element 54*c*.

In the fifth embodiment, the alignment system 5*e* a reflective optical element having the reflective surface 531*e* and a reflective optical element having the reflective surface 532*e* separately, in addition to or instead of the reflective optical element 53*e* having both of the reflective surface 531*e* and the reflective surface 532*e*.

In the sixth embodiment, the alignment system 5*f* may be provided with any retroreflector instead of the corner cube 56*f*. The alignment system 5*f* may be provided with an optical element having two reflective surfaces (for example, a right angle prism). In this case, the alignment system 5*f* may be provided with an optical element that reflects the zeroth-order reflected light L2 and −first-order reflected light L2 used for obtaining the mark detection information #Yc and #Yd and an optical element that reflects the zeroth-order reflected light L2 and −first-order reflected light L2 used for obtaining the mark detection information #Xc and #Xd.

The exposure apparatus EX may not be provided with the alignment system 5. In this case, a measurement apparatus having the alignment system 5 may be provided separately from the exposure apparatus EX. The substrate 41 on which the measurement apparatus has performed the alignment operation (namely, from which the mark detection information has been obtained) may be transported to the exposure apparatus EX by using a transporting apparatus. The exposure apparatus EX may calculate the correction amount of the positional coordinates of the plurality of shot areas by using the mark detection information obtained by the measurement apparatus, and then exposes the substrate 41. Alternatively, even when there is the measurement apparatus having the alignment system, the exposure apparatus EX may be provided with the alignment system 5. In this case, the exposure apparatus may perform the alignment operation additionally by using the result of the alignment operation performed by the measurement apparatus. Note that an exposure system having the exposure apparatus and the alignment system separately from the exposure apparatus is disclosed in U.S. Pat. No. 4,861,162A.

When the measurement apparatus having the alignment system 5 may be provided separately from the exposure apparatus EX, the measurement apparatus may not perform the above described scatterometry measurement. In this case, the exposure apparatus EX may perform the scatterometry measurement by using the mark detection information obtained by the measurement apparatus. Alternatively, the exposure apparatus EX may not perform the above described scatterometry measurement. In this case, the exposure apparatus EX may perform the alignment operation by using the mark detection information obtained by the measurement apparatus.

In the above description, the exposure apparatus EX exposes the substrate 41 such as the semiconductor substrate by using the light having the predetermined wavelength. However, the exposure apparatus EX may expose the substrate 41 by using an electron beam.

In the above description, the exposure apparatus EX exposes the substrate 41 such as the semiconductor substrate. However, the exposure apparatus EX may expose any object such as a glass plate, a ceramic substrate, a film member or a mask blank. The exposure apparatus EX may be an exposure apparatus for manufacturing a liquid crystal display element or a display. The exposure apparatus EX may be an exposure apparatus for manufacturing at least one of the thin film magnetic head, an imaging element (for example, a CCD), a micro machine, a MEMS, a DNA chip and the mask 11 (alternatively, the reticle). The exposure apparatus EX may be an optical tweezing apparatus that traps an object by using an optical trapping force that is generated on the object by an irradiation of the exposure light EL to the object.

Figure 18:
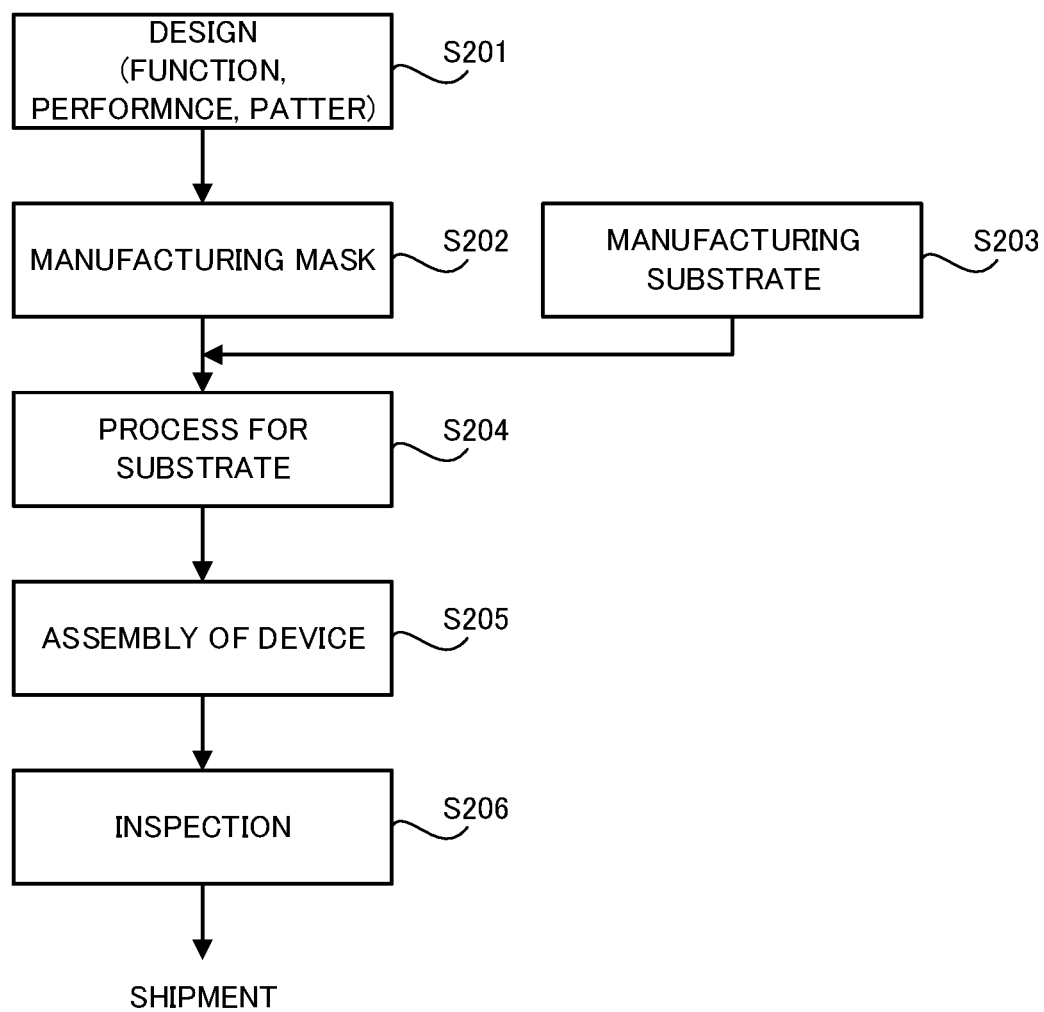
FIG. 18 is a flowchart for describing one example of a device manufacturing method.

A device such as the semiconductor device or the like may be manufactured through each step illustrated in FIG. 18. The steps for manufacturing the semiconductor device may include a step S201 at which a function and a performance of the semiconductor device is designed, a step S202 at which the mask 11 based on the designed function and performance is manufactured, a step S203 at which the substrate 41 that is the base member of the device is manufactured, a step S204 at which the substrate 41 is exposed by the exposure light EL from the device pattern of the mask 11 and the exposed substrate 41 is developed, a step S205 including a device assembling process (a manufacturing process including a dicing process, a bonding process, a packaging process and the like) and an inspection step S206.

The elements of the embodiments described above may be appropriately combined. One part of the element of each embodiment described above may not be used. The element of each embodiment may be replaced by the element of another embodiment. Moreover, as long as legally permitted, the disclosures of all publications and United States patents with respect to the exposure apparatuses and the like which are cited in each embodiment described above are incorporated by reference in the disclosures of the present application.

Moreover, the present invention can be appropriately changed, without departing from the essence or spirit of the invention which can be read from the claims and the entire specification. A mark detection method, a measurement apparatus, an exposure apparatus, an exposure method and a device manufacturing method, which involve such changes, are also included in the technical scope of the present invention.

DESCRIPTION OF REFERENCE CODES

EX exposure apparatus
1 mask stage
11 mask
3 projection optical system
4 substrate stage
41 substrate
5, 51, 5b, 5c, 5d, 5e, 5f, 5g, 5h alignment system
51a, 51a-1, 51a-2, 51a-3, 51a**-4 light source
52a half mirror
52b, 52f polarization beam splitter
53a, 53e, 54c, 54e reflective optical element
531a, 531e, 532e, 541c, 541e reflective surface
53c, 54f objective lens
53d-1, 53d-2, 53d-3, 53d**-4 reflective mirror
53g diffracting grating
55a light receiver
56b, 57b, 53f quarter wave plate
56f corner cube
M alignment mark

The invention claimed is:

1. A mark detection apparatus that is configured to detect a mark formed in a mark area of an object,
the mark detection apparatus comprising:
a first optical system that is configured to emit a first measurement light to the mark area;
a second optical system that is configured to deflect a second measurement light including at least one part of a zeroth-order light and a diffracted light generated by an irradiation of the first measurement light to the mark area from the first optical system and to irradiate the mark area with the deflected second measurement light as a third measurement light; and
a light receiver that is configured to optically receive a fourth measurement light including at least one part of a zeroth-order light and a diffracted light generated by an irradiation of the third measurement light to the mark area from the second optical system.

2. The mark detection apparatus according to claim 1, wherein
the second optical system is configured to parallelize the second measurement light from the mark area and the third measurement light with which the mark area is irradiated.

3. The mark detection apparatus according to claim 1, wherein
the second optical system is configured to deflect the second measurement light from at least one part of the mark area and to irradiate the at least one part of the mark area with the deflected second measurement light as the third measurement light.

4. The mark detection apparatus according to claim 1, wherein
the second optical system has a reflective surface that reflects the second measurement light from the mark area toward the mark area as the third measurement light.

5. The mark detection apparatus according to claim 4, wherein
a shape of a cross-sectional surface of the reflective surface of the second optical system including an optical axis is a shape corresponding to at least one part of an outer circumference of a circle, and
the mark area is located at a center of the circle.

6. The mark detection apparatus according to claim 4, wherein
the reflective surface of the second optical system includes at least two planar reflective surfaces that are perpendicular to each other.

7. The mark detection apparatus according to claim 4, wherein
the second optical system has an aperture through which the fourth measurement light from the mark area passes.

8. The mark detection apparatus according to claim 1, wherein
the first optical system includes a first optical member that is configured to guide the first measurement light to the mark area and to guide the fourth measurement light to the light receiver.

9. The mark detection apparatus according to claim 8, wherein
the first optical member is configured to guide the first measurement light to the mark area by reflecting or refracting the first measurement light and to guide the fourth measurement light to the light receiver by reflecting or refracting the fourth measurement light.

10. The mark detection apparatus according to claim 1, wherein
an optical path of the second measurement light and an optical path of the third measurement light are symmetric with respect to an optical axis of the second optical system.

11. The mark detection apparatus according to claim 10, wherein
the second optical system has a deflecting optical system that is configured to deflect the second measurement light and a returning optical system that is configured to return the second measurement light from the deflecting optical system.

12. The mark detection apparatus according to claim 11, wherein
an optical path of the second measurement light entering the returning optical system is parallel with an optical path of the second measurement light emitted from the returning optical system.

13. The mark detection apparatus according to claim 1, wherein
the first optical system has a second optical member that is configured to guide the first measurement light to the mark area so that the first measurement light enters the mark area from an oblique direction.

14. The mark detection apparatus according to claim 13, wherein
the second optical member includes a first optical element that is configured to guide the first measurement light to the mark area by refracting the first measurement light so that the first measurement light enters from the oblique direction.

15. The mark detection apparatus according to claim 13, wherein
the second optical member includes a second optical element that is configured to guide the first measurement light to the mark area by reflecting the first measurement light so that the first measurement light enters from the oblique direction.

16. The mark detection apparatus according to claim 13, wherein
the second optical member allows the first measurement light to enter the mark area from the oblique direction by diverging the first measurement light from an optical axis of the first optical system and then converging the diverged first measurement light to the optical axis of the first optical system.

17. The mark detection apparatus according to claim 16, wherein
the second optical member includes: a third optical element that is configured to reflect the first measurement light so that the first measurement light is diverged from the optical axis of the first optical system; and a fourth optical element that is configured to reflect the first measurement light reflected by the third optical element so that the first measurement light is converged to the optical axis of the first optical system and to allow the first measurement light to enter the mark area from the oblique direction.

18. The mark detection apparatus according to claim 17, wherein
the third optical element and at least one part of an optical element of the second optical system are unified.

19. The mark detection apparatus according to claim 13, wherein
the second optical member is further configured to converge, to an optical axis of the first optical system, the fourth measurement light from the mark area that is diverged from the optical axis.

20. The mark detection apparatus according to claim 19, wherein
the second optical member includes: a fifth optical element that is configured to reflect the fourth measurement light from the mark area that is diverged from the optical axis of the first optical system so that the fourth measurement light is converged to the optical axis; and a sixth optical element that is configured to reflect the fourth measurement light reflected by the third optical element.

21. The mark detection apparatus according to claim 20, wherein
the sixth optical element and at least one part of an optical element of the second optical system are unified.

22. The mark detection apparatus according to claim 1, wherein
the first measurement light includes a fifth measurement light and a sixth measurement light, and
an angle between the fifth measurement light traveling to the mark area and an optical axis of the first optical system is different from an angle between the sixth measurement light traveling to the mark area and the optical axis of the first optical system.

23. The mark detection apparatus according to claim 22, wherein
an absolute value of the angle between the fifth measurement light and the optical axis of the first optical system is same as an absolute value of the angle between the sixth measurement light and the optical axis of the first optical system.

24. The mark detection apparatus according to claim 22, wherein
an absolute value of the angle between the fifth measurement light and the optical axis of the first optical system is different from an absolute value of the angle between the sixth measurement light and the optical axis of the first optical system.

25. The mark detection apparatus according to claim 1, wherein
the fourth measurement light includes at least one of a reflected light and a diffracted light of the first measurement light emitted from the first optical system, and
the diffracted light of the first measurement light includes at least one part of a zeroth-order light and a diffracted light generated by an irradiation of the third measurement light.

26. The mark detection apparatus according to claim 1, wherein
the light receiver is configured to optically receive an interfering light of the fourth measurement light.

27. The mark detection apparatus according to claim 26, wherein
the interfering light includes an interfering light generated by an interference between a N1 (N1 is an integer other than zero) order diffracted light of the first measurement light and a −N1 order diffracted light of the first measurement light.

28. The mark detection apparatus according to claim 26, wherein
the interfering light includes an interfering light generated by an interference between a reflected light of the first measurement light and a N2 (N2 is an integer other than zero) order diffracted light of the first measurement light.

29. The mark detection apparatus according to claim 1, wherein
the light receiver is configured to optically receive an interfering light generated by an interference between a light diffracted at the mark area a plurality of times and a zeroth-order light at the mark area.

30. The mark detection apparatus according to claim 1, wherein
the light receiver is configured to optically receive a plurality of fourth measurement lights from the mark area.

31. The mark detection apparatus according to claim 30, wherein
the mark detection apparatus is configured to correct a light receiving result of the plurality of fourth measurement lights from the mark area on the basis of the light receiving result.

32. The mark detection apparatus according to claim 30, wherein
the first measurement light includes a fifth measurement light and a sixth measurement light, and
the light receiver is configured to optically receive an interfering light generated by an interference between a reflected light of the fifth measurement light and a diffracted light of the sixth measurement light and an interfering light generated by an interference between a reflected light of the sixth measurement light and a diffracted light of the fifth measurement light.

33. The mark detection apparatus according to claim 30, wherein
the first measurement light includes a fifth measurement light and a sixth measurement light, and
the light receiver is configured to optically receive an interfering light generated by an interference between a reflected light of the fifth measurement light and a diffracted light of the fifth measurement light and an interfering light generated by an interference between a reflected light of the sixth measurement light and a diffracted light of the sixth measurement light.

34. The mark detection apparatus according to claim 30, wherein
the light receiver has: a first light receiving surface that is configured to optically receive an interfering light generated by an interference between a plurality of diffracted lights that are generated by the irradiation of the third measurement light to the mark area; and a second and third light receiving surfaces that are configured to optically receive the plurality of diffracted lights that are generated by the irradiation of the third measurement light to the mark area, respectively.

35. The mark detection apparatus according to claim 34, further comprising
a stage that is configured to hold the object, wherein
the stage is movable along an optical axis of the second optical system so that a state of a focus of the measurement light emitted from the first optical system is changed between a state where the measurement light is focused on the mark area and a state where the measurement light is not focused on the mark area.

36. The mark detection apparatus according to claim 1, wherein
the first optical system is configured to emit the first measurement light including a plurality of light components that have different wavelengths, respectively.

37. The mark detection apparatus according to claim 36, wherein
the second optical system is configured to align a traveling direction of the light component having a first wavelength in the fourth measurement light and a traveling direction of the light component having a second wavelength different from the first wavelength in the fourth measurement light.

38. The mark detection apparatus according to claim 36, wherein
the second optical system is configured to irradiate a same position in the mark area with the light component having a first wavelength in the third measurement light and the light component having a second wavelength different from the first wavelength in the third measurement light.

39. The mark detection apparatus according to claim 36, wherein
the second optical system is configured to deflect the light component that has a first wavelength and that is emitted at a first angle from the mark area in the second measurement light and the light component that has a second wavelength different from the first wavelength and that is emitted at a second angle different from the first angle from the mark area in the second measurement light and to irradiate a same position in the mark area with the deflected light components as the third measurement light.

40. The mark detection apparatus according to claim 36, wherein
the second optical system is configured to deflect the light component that has a first wavelength and that is emitted at a first angle from the mark area in the second measurement light and the light component that has a second wavelength different from the first wavelength and that is emitted at a second angle different from the first angle from a position from which the light component having the first wavelength is emitted in the second measurement light and to irradiate a same position in the mark area with the deflected light components as the third measurement light.

41. The mark detection apparatus according to claim 36, wherein
the plurality of light components include a light component having a first wavelength and a light component having a second wavelength, and
a difference between the first wavelength and the second wavelength is at least 100 nm.

42. The mark detection apparatus according to claim 36, wherein
the light receiver has a plurality of light receiving surfaces for detecting the plurality of light components, respectively.

43. A mark detection apparatus that is configured to detect a mark formed in a mark area of an object,
the mark detection apparatus comprising:
a first optical system that is configured to emit a first measurement light to the mark area;
a second optical system that is configured to deflect a second measurement light including a diffracted light generated by an irradiation of the first measurement light to the mark area from the first optical system and to irradiate the mark area with the deflected second measurement light as a third measurement light; and
a light receiver that is configured to optically receive a fourth measurement light including a diffracted light generated by an irradiation of the third measurement light to the mark area from the second optical system.

44. The mark detection apparatus according to claim 43, wherein
an optical path of the second measurement light and an optical path of the third measurement light are symmetric with respect to an optical axis of the second optical system.

45. The mark detection apparatus according to claim 44, wherein
the second optical system has a deflecting optical system that is configured to deflect the second measurement light and a returning optical system that is configured to return the second measurement light from the deflecting optical system.

46. The mark detection apparatus according to claim 45, wherein
an optical path of the second measurement light entering the returning optical system is parallel with an optical path of the second measurement light emitted from the returning optical system.

47. The mark detection apparatus according to claim 43, wherein
the first measurement light includes a fifth measurement light and a sixth measurement light, and
an angle between the fifth measurement light traveling to the mark area and an optical axis of the first optical system is different from an angle between the sixth measurement light traveling to the mark area and the optical axis of the first optical system.

48. The mark detection apparatus according to claim 47, wherein
an absolute value of the angle between the fifth measurement light and the optical axis of the first optical system is same as an absolute value of the angle between the sixth measurement light and the optical axis of the first optical system.

49. The mark detection apparatus according to claim 47, wherein
an absolute value of the angle between the fifth measurement light and the optical axis of the first optical system is different from an absolute value of the angle between the sixth measurement light and the optical axis of the first optical system.

50. The mark detection apparatus according to claim 43, wherein
the light receiver is configured to optically receive an interfering light generated by an interference between a light diffracted at the mark area a plurality of times and a zeroth-order light at the mark area.

51. A mark detection apparatus that is configured to detect a mark formed in a mark area of an object,
the mark detection apparatus comprising:
a first optical system that is configured to emit a measurement light to the mark area, the measurement light including a plurality of light components having different wavelengths, respectively;
a second optical system that is configured to align a traveling direction of the light component having a first wavelength in the measurement light from the mark area and a traveling direction of the light component having a second wavelength different from the first wavelength in the measurement light from the mark area and to emit the light component having the first wavelength and the light component having the second wavelength; and
a light receiver that is configured to optically receive at least one part of the measurement light from the second optical system, wherein
the second optical system is configured to irradiate the mark area with at least one part of a zeroth-order light and a diffracted light generated by the irradiation to the mark area from the first optical system.

52. The mark detection apparatus according to claim 51, wherein
the second optical system is configured to guide, to the light receiver, at least one part of the zeroth-order light and the diffracted light generated by the irradiation to the mark area from the second optical system.

53. A measurement apparatus that is configured to measure a position of a mark formed in a mark area of an object,
the measurement apparatus comprising:
a stage that is configured to hold the object;
the mark detection apparatus according to claim 1,
a stage position measuring system that is configured to measure a position of the stage; and
a calculating apparatus that is configured to calculate the position of the mark by using a light receiving result of the light receiver and a measured result of the stage position measuring system.

54. A mark detection method of detecting a mark formed in a mark area of an object,
the mark detection method comprising:
emitting a first measurement light to the mark area;
deflecting a second measurement light including at least one part of a zeroth-order light and a diffracted light generated by an irradiation of the first measurement light to the mark area and irradiating the mark area with the deflected second measurement light as a third measurement light; and
optically receiving a fourth measurement light including at least one part of a zeroth-order light and a diffracted light generated by an irradiation of the third measurement light to the mark area.

55. A mark detection method of detecting a mark formed in a mark area of an object,
the mark detection method comprising:
emitting a measurement light to the mark area, the measurement light including a plurality of light components having different wavelengths, respectively;
aligning a traveling direction of the light component having a first wavelength in the measurement light from the mark area and a traveling direction of the light component having a second wavelength different from the first wavelength in the measurement light from the mark area and emitting the light component having the first wavelength and the light component having the second wavelength; and
optically receiving at least one part of the emitted measurement light, wherein the mark area is irradiated with at least one part of a zeroth-order light and a diffracted light generated by the irradiation of the measurement light to the mark area.

56. An exposure apparatus that exposes an object to an image of a pattern, the exposure apparatus comprising:
the measurement apparatus according to claim 53; and
a projection optical system that projects the image of the pattern onto the object held on the stage, wherein
projection of the pattern onto the object is controlled based on a measured result of the measurement apparatus.

57. An exposure method of exposing an object to an image of a pattern, the method comprising:
obtaining a measured result of the measurement apparatus according to claim 53; and
projecting, via a projection optical system, the image of the pattern onto the object held on the stage of the measurement apparatus, wherein
projection of the pattern onto the object is controlled based on the obtained measured result of the measurement apparatus.

58. A device manufacturing method comprising:
exposing a sensitive agent that is coated on an object, the exposing being conducted according to the method of claim 57;
developing the exposed sensitive agent to form an exposure pattern layer corresponding to the desired pattern; and
processing the object via the exposure pattern layer.

59. The mark detection apparatus according to claim 1, wherein the object is a wafer.

60. The mark detection apparatus according to claim 1, wherein the object is a wafer.

61. A mark detection apparatus that is configured to detect a mark formed in a mark area of a wafer, the mark detection apparatus comprising:
a first optical system that is configured to emit a first measurement light to the mark area;
a second optical system that is configured to deflect a second measurement light including at least one part of a zeroth-order light and a diffracted light generated by an irradiation of the first measurement light to the mark area from the first optical system and to irradiate the mark area with the deflected second measurement light as a third measurement light; and
a light receiver that is configured to optically receive a fourth measurement light including at least one part of a zeroth-order light and a diffracted light generated by an irradiation of the third measurement light to the mark area from the second optical system.

62. A mark detection apparatus that is configured to detect a mark formed in a mark area of an object, the mark detection apparatus comprising:
a first optical system that is configured to emit a first measurement light to an irradiation position in the mark area;
a second optical system that is configured to deflect a second measurement light including at least one part of a zeroth-order light and a diffracted light generated by an irradiation of the first measurement light to the mark area from the first optical system and to irradiate the irradiation position with the deflected second measurement light as a third measurement light; and
a light receiver that is configured to optically receive a fourth measurement light including at least one part of a zeroth-order light and a diffracted light generated by an irradiation of the third measurement light to the mark area from the second optical system, wherein
the first measurement light includes a fifth measurement light and a sixth measurement light, and
an angle between the fifth measurement light traveling to the mark area and an optical axis of the first optical system is different from an angle between the sixth measurement light traveling to the mark area and the optical axis of the first optical system.

63. The mark detection apparatus according to claim 62, wherein an absolute value of the angle between the fifth measurement light and the optical axis of the first optical system is same as an absolute value of the angle between the sixth measurement light and the optical axis of the first optical system.

64. The mark detection apparatus according to claim 62, wherein
an absolute value of the angle between the fifth measurement light and the optical axis of the first optical system is different from an absolute value of the angle between the sixth measurement light and the optical axis of the first optical system.

* * * * *